US012801020B2

(12) United States Patent
Shibayama et al.

(10) Patent No.: US 12,801,020 B2
(45) Date of Patent: Nov. 17, 2026

(54) SILICON-CONTAINING RESIST UNDERLAYER FILM FORMING COMPOSITION

(71) Applicant: NISSAN CHEMICAL CORPORATION, Tokyo (JP)

(72) Inventors: Wataru Shibayama, Toyama (JP); Satoshi Takeda, Toyama (JP); Shuhei Shigaki, Toyama (JP); Ken Ishibashi, Toyama (JP); Kodai Kato, Toyama (JP); Makoto Nakajima, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 660 days.

(21) Appl. No.: 18/254,744

(22) PCT Filed: Nov. 26, 2021

(86) PCT No.: PCT/JP2021/043405

§ 371 (c)(1),
(2) Date: May 26, 2023

(87) PCT Pub. No.: WO2022/114132

PCT Pub. Date: Jun. 2, 2022

(65) Prior Publication Data

US 2025/0044692 A1 Feb. 6, 2025

(30) Foreign Application Priority Data

Nov. 27, 2020 (JP) ................................ 2020-197645

(51) Int. Cl.

| | |
|---|---|
| ***G03F 7/075*** | (2006.01) |
| ***G03F 7/004*** | (2006.01) |
| ***G03F 7/11*** | (2006.01) |
| ***G03F 7/20*** | (2006.01) |
| ***G03F 7/40*** | (2006.01) |
| ***G03F 7/42*** | (2006.01) |

(52) U.S. Cl.
CPC .......... *G03F 7/0757* (2013.01); *G03F 7/0045* (2013.01); *G03F 7/0048* (2013.01); *G03F 7/11* (2013.01); *G03F 7/2004* (2013.01); *G03F 7/2043* (2013.01); *G03F 7/40* (2013.01); *G03F 7/42* (2013.01)

(58) Field of Classification Search
CPC .... G03F 7/0757; G03F 7/0045; G03F 7/0048; G03F 7/11; G03F 7/2004; G03F 7/2043; G03F 7/40; G03F 7/42; G03F 7/0752; G03F 7/091; G03F 7/094; H10P 76/00; H10P 76/2041; H10P 76/4085
See application file for complete search history.

(56) References Cited

U.S. PATENT DOCUMENTS

| | | | | |
|---|---|---|---|---|
| 2010/0330505 | A1 | 12/2010 | Nakajima et al. | |
| 2012/0315765 | A1 | 12/2012 | Nakajima et al. | |
| 2013/0137041 | A1* | 5/2013 | Ogihara | C08G 77/56 430/326 |
| 2013/0183830 | A1* | 7/2013 | Takeda | G03F 7/0752 438/703 |
| 2017/0371242 | A1 | 12/2017 | Wakayama et al. | |
| 2018/0239250 | A1* | 8/2018 | Shibayama | C08G 77/14 |
| 2019/0041751 | A1* | 2/2019 | Cui | G03F 7/094 |
| 2019/0198341 | A1* | 6/2019 | Ogihara | G03F 7/0752 |
| 2021/0018840 | A1 | 1/2021 | Shibayama et al. | |

FOREIGN PATENT DOCUMENTS

| | | | |
|---|---|---|---|
| CN | 107077072 | A | 8/2017 |
| JP | 2016-074774 | A | 5/2016 |
| WO | 2009/104552 | A1 | 8/2009 |
| WO | 2011/102470 | A1 | 8/2011 |
| WO | 2018/181989 | A1 | 10/2018 |
| WO | 2019/181873 | A1 | 9/2019 |
| WO | 2020/138092 | A1 | 7/2020 |

OTHER PUBLICATIONS

Feb. 15, 2022 International Search Report issued in International Patent Application No. PCT/JP2021/043405.
Feb. 15, 2022 Written Opinion issued in International Patent Application No. PCT/JP2021/043405.
Dec. 3, 2025 Office Action issued in Japanese Patent Application No. 2022-565451.
Jun. 17, 2025 Office Action issued in Korean Patent Application No. 10-2023-7020012.
Mar. 28, 2025 Office Action issued in Taiwanese Patent Application No. 110144258.
May 29, 2026 Office Action issued in Chinese Patent Application No. 202180079266.8.

* cited by examiner

*Primary Examiner* — Stewart A Fraser
(74) *Attorney, Agent, or Firm* — Oliff PLC

(57) ABSTRACT

A silicon-containing resist underlayer film forming composition for forming a resist underlayer film which is able to be removed not only by a conventional dry etching method but also by a wet etching method that uses a chemical agent, and which has excellent lithography characteristics, while enabling the achievement of a high etching rate during wet etching. A silicon-containing resist underlayer film forming composition which contains (A) a polysiloxane, (B) nitric acid, (C) a bisphenol compound and (D) a solvent.

15 Claims, No Drawings

SILICON-CONTAINING RESIST UNDERLAYER FILM FORMING COMPOSITION

TECHNICAL FIELD

The present invention relates to a resist underlayer film-forming composition. More particularly, the present invention provides a silicon-containing resist underlayer film-forming composition capable of forming a silicon-containing resist underlayer film that has favorable lithographic properties and can be readily removed with a chemical.

BACKGROUND ART

Fine processing by lithography using photoresists has been conventionally performed in the production of semiconductor devices. The fine processing is a processing method involving formation of a photoresist thin film on a semiconductor substrate (e.g., a silicon wafer); irradiation of the thin film with active rays (e.g., ultraviolet rays) through a mask pattern having a semiconductor device pattern drawn thereon; development of the irradiated thin film; and etching of the substrate with the resultant photoresist pattern serving as a protective film, to thereby form, on the surface of the substrate, fine irregularities corresponding to the pattern.

In recent years, active rays having a shorter wavelength have tended to be used (i.e., shifting from KrF excimer laser (248 nm) to ArF excimer laser (193 nm)) in association with an increase in the degree of integration of semiconductor devices. The use of such active rays having a shorter wavelength causes a serious problem in terms of reflection of active rays from a semiconductor substrate. In order to avoid such a problem, there has been widely used a method involving disposing a resist underlayer film called anti-reflective coating (Bottom Anti-Reflective Coating, BARC) between a photoresist and a to-be-processed substrate.

A film known as a hard mask containing a metal element (e.g., silicon or titanium) has been used as the aforementioned underlayer film between a semiconductor substrate and a photoresist. In this case, since the resist and the hard mask have a large difference in their constituent components, the rate of removal thereof by dry etching greatly depends on the type of gas used for dry etching. Appropriate selection of the gas species enables removal of the hard mask by dry etching without a significant reduction in the thickness of the photoresist. Thus, in the recent production of semiconductor devices, a resist underlayer film has been disposed between a semiconductor substrate and a photoresist in order to achieve various effects including an antireflection effect.

Compositions for resist underlayer films have been studied so far, but demand has arisen for the development of a new material for a resist underlayer film in consideration of, for example, various properties required for the film. For example, there have been disclosed a coating-type BPSG (boron phosphorus glass) film-forming composition containing a structure having a specific silicate skeleton, which is aimed at forming a wet-etchable film (Patent Document 1), as well as a silicon-containing resist underlayer film-forming composition containing a carbonyl structure, which is aimed at removing a mask residue after lithography with a chemical (Patent Document 2).

PRIOR ART DOCUMENTS

Patent Documents

Patent Document 1: JP 2016-74774 A
Patent Document 2: WO 2018/181989

SUMMARY OF THE INVENTION

Problems to be Solved by the Invention

In state-of-the-art semiconductor device processing, implant layers are miniaturized. Generally, in a multi-layer process, the aforementioned dry etching is used for transfer to a lower layer, and final processing of a substrate or removal of a mask residue (e.g., removal of underlayer films including a resist film and a resist underlayer film) after processing of the substrate may also be performed by a dry etching or ashing process. However, such a dry etching or ashing process often causes damage to the substrate, and thus demand has arisen for improvement of the process.

In view of the above-described circumstances, an object of the present invention is to provide a silicon-containing resist underlayer film-forming composition for forming a resist underlayer film that can be removed not only by a conventional dry etching process, but also by a wet etching process using a chemical such as dilute hydrofluoric acid, buffered hydrofluoric acid, or an alkaline chemical during processing of a semiconductor substrate, etc. In particular, an object of the present invention is to provide a silicon-containing resist underlayer film-forming composition for forming a resist underlayer film that exhibits excellent lithographic properties and achieves a high etching rate in a wet etching process.

Means for Solving the Problems

A first aspect of the present invention is a silicon-containing resist underlayer film-forming composition comprising:

[A] a polysiloxane;
[B] nitric acid;
[C] a bisphenol compound; and
[D] a solvent.

A second aspect of the present invention is the silicon-containing resist underlayer film-forming composition according to the first aspect, wherein the polysiloxane [A] contains a modified polysiloxane in which at least some of silanol groups are modified with an alcohol or protected with an acetal.

A third aspect of the present invention is the silicon-containing resist underlayer film-forming composition according to the first or second aspect, wherein the bisphenol compound [C] contains a bisphenol sulfone compound.

A fourth aspect of the present invention is the silicon-containing resist underlayer film-forming composition according to any one of the first to third aspects, wherein the polysiloxane [A] contains at least one selected from the silanol group consisting of a hydrolysis condensate of a hydrolyzable silane containing at least one hydrolyzable silane of the following Formula (1):

$$R^1{}_aSi(R^2)_{4-a} \tag{1}$$

(wherein $R^1$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, a sulfonyl group, or a cyano group, or any combination of these; $R^2$ is a group or atom bonded to the silicon atom, and is each independently an alkoxy group, an aralkyloxy group, an acyloxy group, or a halogen atom; and a is an integer of 0 to 3), a modified hydrolysis condensate prepared by modification of at least some of silanol groups of the condensate of the hydrolyzable silane with an alcohol, a modified hydrolysis condensate prepared by protection of at least some of silanol groups of the condensate of the hydrolyzable silane with an acetal, and a product prepared by dehydration reaction between the condensate of the hydrolyzable silane and an alcohol.

A fifth aspect of the present invention is the silicon-containing resist underlayer film-forming composition according to the fourth aspect, wherein the polysiloxane [A] contains a product prepared by dehydration reaction between the condensate of the hydrolyzable silane and an alcohol.

A sixth aspect of the present invention is the silicon-containing resist underlayer film-forming composition according to any one of the first to fifth aspects, wherein the composition comprises no curing catalyst.

A seventh aspect of the present invention is the silicon-containing resist underlayer film-forming composition according to any one of the first to sixth aspects, wherein the solvent [D] contains water.

An eighth aspect of the present invention is the silicon-containing resist underlayer film-forming composition according to any one of the first to seventh aspects, wherein the composition further comprises a pH adjuster.

A ninth aspect of the present invention is the silicon-containing resist underlayer film-forming composition according to any one of the first to eighth aspects, wherein the composition further comprises a surfactant.

A tenth aspect of the present invention is the silicon-containing resist underlayer film-forming composition according to any one of the first to ninth aspects, wherein the composition further comprises a metal oxide.

An eleventh aspect of the present invention is the silicon-containing resist underlayer film-forming composition according to any one of the first to tenth aspects, wherein the composition is used for formation of a resist underlayer film for EUV lithography.

A twelfth aspect of the present invention is a resist underlayer film, which is a cured product of the silicon-containing resist underlayer film-forming composition according to any one of the first to eleventh aspects.

A thirteenth aspect of the present invention is a semiconductor processing substrate comprising a semiconductor substrate and the resist underlayer film according to the twelfth aspect.

A fourteenth aspect of the present invention is a semiconductor device production method comprising:

- a step of forming an organic underlayer film on a substrate;
- a step of forming, on the organic underlayer film, a silicon-containing resist underlayer film from the silicon-containing resist underlayer film-forming composition according to any one of the first to eleventh aspects; and
- a step of forming a resist film on the silicon-containing resist underlayer film.

A fifteenth aspect of the present invention is the production method according to the fourteenth aspect, wherein the step of forming a silicon-containing resist underlayer film involves the use of the silicon-containing resist underlayer film-forming composition subjected to filtration with a nylon filter.

A sixteenth aspect of the present invention is a pattern formation method comprising:

- a step of forming an organic underlayer film on a semiconductor substrate;
- a step of applying, onto the organic underlayer film, the silicon-containing resist underlayer film-forming composition according to any one of the first to eleventh aspects, and baking the composition, to thereby form a silicon-containing resist underlayer film;
- a step of applying a resist film-forming composition onto the silicon-containing resist underlayer film, to thereby form a resist film;
- a step of exposing the resist film to light, and developing the resist film, to thereby form a resist pattern;
- a step of etching the silicon-containing resist underlayer film with the resist pattern as a mask; and
- a step of etching the organic underlayer film with the patterned silicon-containing resist underlayer film as a mask.

A seventeenth aspect of the present invention is the pattern formation method according to the sixteenth aspect, wherein the method further comprises a step of removing the silicon-containing resist underlayer film by a wet process using a chemical after the step of etching the organic underlayer film.

Effects of the Invention

According to the present invention, there can be provided a silicon-containing resist underlayer film-forming composition capable of forming an underlayer film that can be removed not only by a conventional dry etching process, but also by a wet etching process using a chemical, achieves a high wet etching rate, and exhibits excellent lithographic properties.

According to the present invention, there can be provided a silicon-containing resist underlayer film-forming composition that can be suitably used in a lithographic process requiring further miniaturization.

MODES FOR CARRYING OUT THE INVENTION

The present invention is directed to a composition for forming a silicon-containing resist underlayer film that can be removed by a wet process, and relates to a silicon-containing resist underlayer film-forming composition (hereinafter may be referred to simply as "resist underlayer film-forming composition") containing [A] a polysiloxane, [B] nitric acid, [C] a bisphenol compound, and [D] a solvent.

The present invention will next be described in detail.

[A] Polysiloxane

No particular limitation is imposed on the polysiloxane [A] used in the present invention, so long as it is a polymer having a siloxane bond.

The aforementioned polysiloxane may contain a modified polysiloxane wherein some of silanol groups are modified; for example, a modified polysiloxane wherein some of silanol groups are modified with an alcohol or protected with an acetal.

For example, the aforementioned polysiloxane may contain a hydrolysis condensate of a hydrolyzable silane, and may contain a modified polysiloxane wherein at least some of silanol groups of the hydrolysis condensate are modified with an alcohol or protected with an acetal. The aforementioned hydrolyzable silane corresponding to the hydrolysis condensate may contain one or more hydrolyzable silanes.

The aforementioned polysiloxane may have a structure having a cage-shaped, ladder-shaped, linear, or branched main chain. The aforementioned polysiloxane may be a commercially available polysiloxane.

In the present invention, the "hydrolysis condensate" (i.e., product of hydrolytic condensation) of the aforementioned hydrolyzable silane includes a polyorganosiloxane polymer which is a condensate prepared through complete condensation, and a polyorganosiloxane polymer which is a partial hydrolysis condensate prepared through incomplete condensation. Such a partial hydrolysis condensate is a polymer prepared through hydrolysis and condensation of a hydrolyzable silane compound, as in the case of a condensate prepared through complete condensation. However, the partial hydrolysis condensate contains remaining Si—OH groups, due to partial or incomplete hydrolysis and condensation of the silane compound. The silicon-containing resist underlayer film-forming composition of the present invention may contain, besides the hydrolysis condensate, an uncondensed hydrolysate (complete hydrolysate or partial hydrolysate) or a remaining monomer (hydrolyzable silane compound).

In the present specification, "hydrolyzable silane" may be referred to simply as "silane compound."

The polysiloxane [A] may be, for example, a hydrolysis condensate of a hydrolyzable silane containing at least one hydrolyzable silane of the following Formula (1).

$$R^1_aSi(R^2)_{4-a} \quad (1)$$

In Formula (1), $R^1$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, a sulfonyl group, or a cyano group, or any combination of these.

In Formula (1), $R^2$ is a group or atom bonded to the silicon atom, and is each independently an alkoxy group, an aralkyloxy group, an acyloxy group, or a halogen atom.

In Formula (1), a is an integer of 0 to 3.

In Formula (1), the alkyl group is, for example, a linear or branched alkyl group having a carbon atom number of 1 to 10. Examples of the alkyl group include methyl group, ethyl group, n-propyl group, i-propyl group, n-butyl group, i-butyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The alkyl group may be a cyclic alkyl group. Examples of the cyclic alkyl group having a carbon atom number of 3 to 10 include cycloalkyl groups, such as cyclopropyl group, cyclobutyl group, 1-methyl-cyclopropyl group, 2-methyl-cyclopropyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group; and cross-linked cycloalkyl groups, such as bicyclobutyl group, bicyclopentyl group, bicyclohexyl group, bicycloheptyl group, bicyclooctyl group, bicyclononyl group, and bicyclodecyl group.

The aryl group may be a phenyl group, a monovalent group derived from a condensed-ring aromatic hydrocarbon compound through removal of one hydrogen atom, or a monovalent group derived from a linked-ring aromatic hydrocarbon compound through removal of one hydrogen atom. No particular limitation is imposed on the carbon atom number of the aryl group, but the carbon atom number is preferably 40 or less, more preferably 30 or less, still more preferably 20 or less.

Examples of the aryl group include, but are not limited to, $C_{6-20}$ aryl groups, such as phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 5-naphthacenyl group, 2-chrysenyl group, 1-pyrenyl group, 2-pyrenyl group, pentacenyl group, benzopyrenyl group, triphenylenyl group, biphenyl-2-yl group (o-biphenylyl group), biphenyl-3-yl group (m-biphenylyl group), biphenyl-4-yl group (p-biphenylyl group), p-terphenyl-4-yl group, m-terphenyl-4-yl group, o-terphenyl-4-yl group, 1,1'-binaphthyl-2-yl group, and 2,2'-binaphthyl-1-yl group.

The aralkyl group is an alkyl group substituted with an aryl group, and specific examples of the aryl group and the alkyl group are the same as those described above. No particular limitation is imposed on the carbon atom number of the aralkyl group, but the carbon atom number is preferably 40 or less, more preferably 30 or less, still more preferably 20 or less.

Specific examples of the aralkyl group include, but are not limited to, phenylmethyl group (benzyl group), 2-phenyl-ethylene group, 3-phenyl-n-propyl group, 4-phenyl-n-butyl group, 5-phenyl-n-pentyl group, 6-phenyl-n-hexyl group, 7-phenyl-n-heptyl group, 8-phenyl-n-octyl group, 9-phenyl-n-nonyl group, and 10-phenyl-n-decyl group.

The aforementioned halogenated alkyl group, halogenated aryl group, or halogenated aralkyl group is an alkyl group, aryl group, or aralkyl group substituted with one or more halogen atoms, and specific examples of the alkyl group, the aryl group, and the aralkyl group are the same as those described above.

Examples of the halogen atom include a fluorine atom, a chlorine atom, a bromine atom, and an iodine atom.

No particular limitation is imposed on the carbon atom number of the halogenated alkyl group, but the carbon atom number is preferably 40 or less, more preferably 30 or less, still more preferably 20 or less, much more preferably 10 or less.

Specific examples of the halogenated alkyl group include, but are not limited to, monofluoromethyl group, difluoromethyl group, trifluoromethyl group, bromodifluoromethyl group, 2-chloroethyl group, 2-bromoethyl group, 1,1-difluoroethyl group, 2,2,2-trifluoroethyl group, 1,1,2,2-tetrafluoroethyl group, 2-chloro-1,1,2-trifluoroethyl group, pentafluoroethyl group, 3-bromopropyl group, 2,2,3,3-tetrafluoropropyl group, 1,1,2,3,3,3-hexafluoropropyl group, 1,1,1,3,3,3-hexafluoropropan-2-yl group, 3-bromo-2-methylpropyl group, 4-bromobutyl group, and perfluoropentyl group.

No particular limitation is imposed on the carbon atom number of the halogenated aryl group, but the carbon atom number is preferably 40 or less, more preferably 30 or less, still more preferably 20 or less.

Specific examples of the halogenated aryl group include, but are not limited to, 2-fluorophenyl group, 3-fluorophenyl group, 4-fluorophenyl group, 2,3-difluorophenyl group, 2,4-difluorophenyl group, 2,5-difluorophenyl group, 2,6-difluorophenyl group, 3,4-difluorophenyl group, 3,5-difluorophenyl group, 2,3,4-trifluorophenyl group, 2,3,5-trifluorophenyl group, 2,3,6-trifluorophenyl group, 2,4,5-trifluorophenyl group, 2,4,6-trifluorophenyl group, 3,4,5-trifluorophenyl group, 2,3,4,5-tetrafluorophenyl group, 2,3,4,6-tetrafluorophenyl group, 2,3,5,6-tetrafluorophenyl group, pentafluorophenyl group, 2-fluoro-1-naphthyl group, 3-fluoro-1-naphthyl group, 4-fluoro-1-naphthyl group, 6-fluoro-1-naphthyl group, 7-fluoro-1-naphthyl group, 8-fluoro-1-naphthyl group, 4,5-difluoro-1-naphthyl group, 5,7-difluoro-1-naphthyl group, 5,8-difluoro-1-naphthyl group, 5,6,7,8-tetrafluoro-1-naphthyl group, heptafluoro-1-naphthyl group, 1-fluoro-2-naphthyl group, 5-fluoro-2-naphthyl group, 6-fluoro-2-naphthyl group, 7-fluoro-2-naphthyl group, 5,7-difluoro-2-naphthyl group, heptafluoro-2-naphthyl group, and groups prepared by arbitrary substitution of a fluorine atom (fluoro group) of any of the aforementioned groups with a chlorine atom (chloro group), a bromine atom (bromo group), or an iodine atom (iodo group).

No particular limitation is imposed on the carbon atom number of the halogenated aralkyl group, but the carbon atom number is preferably 40 or less, more preferably 30 or less, still more preferably 20 or less.

Specific examples of the halogenated aralkyl group include, but are not limited to, 2-fluorobenzyl group, 3-fluorobenzyl group, 4-fluorobenzyl group, 2,3-difluorobenzyl group, 2,4-difluorobenzyl group, 2,5-difluorobenzyl group, 2,6-difluorobenzyl group, 3,4-difluorobenzyl group, 3,5-difluorobenzyl group, 2,3,4-trifluorobenzyl group, 2,3,5-trifluorobenzyl group, 2,3,6-trifluorobenzyl group, 2,4,5-trifluorobenzyl group, 2,4,6-trifluorobenzyl group, 2,3,4,5-tetrafluorobenzyl group, 2,3,4,6-tetrafluorobenzyl group, 2,3,5,6-tetrafluorobenzyl group, 2,3,4,5,6-pentafluorobenzyl group, and groups prepared by arbitrary substitution of a fluorine atom (fluoro group) of any of the aforementioned groups with a chlorine atom (chloro group), a bromine atom (bromo group), or an iodine atom (iodo group).

The aforementioned alkoxyalkyl group, alkoxyaryl group, or alkoxyaralkyl group is an alkyl group, aryl group, or aralkyl group substituted with one or more alkoxy groups, and specific examples of the alkyl group, the aryl group, and the aralkyl group are the same as those described above.

The alkoxy group may be, for example, an alkoxy group having a linear, branched, or cyclic alkyl moiety having a carbon atom number of 1 to 20. Examples of the linear or branched alkoxy group include methoxy group, ethoxy group, n-propoxy group, i-propoxy group, n-butoxy group, i-butoxy group, s-butoxy group, t-butoxy group, n-pentyloxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group. Examples of the cyclic alkoxy group include cyclopropoxy group, cyclobutoxy group, 1-methyl-cyclopropoxy group, 2-methyl-cyclopropoxy group, cyclopentyloxy group, 1-methyl-cyclobutoxy group, 2-methyl-cyclobutoxy group, 3-methyl-cyclobutoxy group, 1,2-dimethyl-cyclopropoxy group, 2,3-dimethyl-cyclopropoxy group, 1-ethyl-cyclopropoxy group, 2-ethyl-cyclopropoxy group, cyclohexyloxy group, 1-methyl-cyclopentyloxy group, 2-methyl-cyclopentyloxy group, 3-methyl-cyclopentyloxy group, 1-ethyl-cyclobutoxy group, 2-ethyl-cyclobutoxy group, 3-ethyl-cyclobutoxy group, 1,2-dimethyl-cyclobutoxy group, 1,3-dimethyl-cyclobutoxy group, 2,2-dimethyl-cyclobutoxy group, 2,3-dimethyl-cyclobutoxy group, 2,4-dimethyl-cyclobutoxy group, 3,3-dimethyl-cyclobutoxy group, 1-n-propyl-cyclopropoxy group, 2-n-propyl-cyclopropoxy group, 1-i-propyl-cyclopropoxy group, 2-i-propyl-cyclopropoxy group, 1,2,2-trimethyl-cyclopropoxy group, 1,2,3-trimethyl-cyclopropoxy group, 2,2,3-trimethyl-cyclopropoxy group, 1-ethyl-2-methyl-cyclopropoxy group, 2-ethyl-1-methyl-cyclopropoxy group, 2-ethyl-2-methyl-cyclopropoxy group, and 2-ethyl-3-methyl-cyclopropoxy group.

Specific examples of the aforementioned alkoxyalkyl group include, but are not limited to, lower (carbon atom number of about 5 or less) alkyloxy lower (carbon atom number of about 5 or less) alkyl groups, such as methoxymethyl group, ethoxymethyl group, 1-ethoxyethyl group, 2-ethoxyethyl group, and ethoxymethyl group.

Specific examples of the aforementioned alkoxyaryl group include, but are not limited to, 2-methoxyphenyl group, 3-methoxyphenyl group, 4-methoxyphenyl group, 2-(1-ethoxy)phenyl group, 3-(1-ethoxy)phenyl group, 4-(1-ethoxy)phenyl group, 2-(2-ethoxy)phenyl group, 3-(2-ethoxy)phenyl group, 4-(2-ethoxy)phenyl group, 2-methoxynaphthalen-1-yl group, 3-methoxynaphthalen-1-yl group, 4-methoxynaphthalen-1-yl group, 5-methoxynaphthalen-1-yl group, 6-methoxynaphthalen-1-yl group, and 7-methoxynaphthalen-1-yl group.

Specific examples of the aforementioned alkoxyaralkyl group include, but are not limited to, 3-(methoxyphenyl) benzyl group and 4-(methoxyphenyl)benzyl group.

The aforementioned alkenyl group may be, for example, a $C_{2-10}$ alkenyl group. Examples of the alkenyl group include ethenyl group (vinyl group), 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group. Other examples of the alkenyl group include cross-linked alkenyl groups such as bicycloheptenyl group (norbornyl group).

Examples of the substituent of the aforementioned alkyl group, aryl group, aralkyl group, halogenated alkyl group, halogenated aryl group, halogenated aralkyl group, alkoxyalkyl group, alkoxyaryl group, alkoxyaralkyl group, or alkenyl group include an alkyl group, an aryl group, an aralkyl group, a halogenated alkyl group, a halogenated aryl group, a halogenated aralkyl group, an alkoxyalkyl group, an aryloxy group, an alkoxyaryl group, an alkoxyaralkyl group, an alkenyl group, an alkoxy group, and an aralkyloxy group. Specific examples of these groups and preferred carbon atom numbers thereof are the same as those described above or below.

The aryloxy group described above as the substituent is a group wherein an aryl group is bonded to another group via an oxygen atom (—O—), and specific examples of the aryl group are the same as those described above. No particular limitation is imposed on the carbon atom number of the aryloxy group, but the carbon atom number is preferably 40 or less, more preferably 30 or less, still more preferably 20 or less. Specific examples of the aryloxy group include, but are not limited to, phenoxy group and naphthalen-2-yloxy group.

When two or more substituents are present, the substituents may be bonded together to form a ring.

Examples of the organic group containing an epoxy group include glycidoxymethyl group, glycidoxyethyl group, glycidoxypropyl group, glycidoxybutyl group, and epoxycyclohexyl group.

Examples of the organic group containing an acryloyl group include acryloylmethyl group, acryloylethyl group, and acryloylpropyl group.

Examples of the organic group containing a methacryloyl group include methacryloylmethyl group, methacryloylethyl group, and methacryloylpropyl group.

Examples of the organic group containing a mercapto group include ethylmercapto group, butylmercapto group, hexylmercapto group, octylmercapto group, and mercaptophenyl group.

Examples of the organic group containing an amino group include, but are not limited to, amino group, aminomethyl group, aminoethyl group, aminophenyl group, dimethylaminoethyl group, and dimethylaminopropyl group.

Examples of the organic group containing an alkoxy group include, but are not limited to, methoxymethyl group and methoxyethyl group. However, the organic group excludes a group wherein an alkoxy group is directly bonded to the silicon atom.

Examples of the organic group containing a sulfonyl group include, but are not limited to, sulfonylalkyl group and sulfonylaryl group.

Examples of the organic group containing a cyano group include cyanoethyl group, cyanopropyl group, cyanophenyl group, and thiocyanate group.

The aforementioned aralkyloxy group is a group derived from an aralkyl alcohol through removal of a hydrogen atom from the hydroxy group of the alcohol. Specific examples of the aralkyl group are the same as those described above.

No particular limitation is imposed on the carbon atom number of the aralkyloxy group, but the carbon atom number is, for example, 40 or less, preferably 30 or less, more preferably 20 or less.

Specific examples of the aralkyloxy group include, but are not limited to, phenylmethyloxy group (benzyloxy group), 2-phenylethyleneoxy group, 3-phenyl-n-propyloxy group, 4-phenyl-n-butyloxy group, 5-phenyl-n-pentyloxy group, 6-phenyl-n-hexyloxy group, 7-phenyl-n-heptyloxy group, 8-phenyl-n-octyloxy group, 9-phenyl-n-nonyloxy group, and 10-phenyl-n-decyloxy group.

The acyloxy group is a group derived from a carboxylic compound through removal of a hydrogen atom from the carboxyl group (—COOH) of the compound. Typical examples of the acyloxy group include, but are not limited to, an alkylcarbonyloxy group, an arylcarbonyloxy group, or an aralkylcarbonyloxy group, which is respectively derived from an alkylcarboxylic acid, an arylcarboxylic acid, or an aralkylcarboxylic acid through removal of a hydrogen atom from the carboxyl group of the acid. Specific examples of the alkyl group, the aryl group, and the aralkyl group of such alkylcarboxylic acid, arylcarboxylic acid, and aralkylcarboxylic acid are the same as those described above.

Specific examples of the acyloxy group include $C_{2-20}$ acyloxy groups, such as methylcarbonyloxy group, ethylcarbonyloxy group, n-propylcarbonyloxy group, i-propylcarbonyloxy group, n-butylcarbonyloxy group, i-butylcarbonyloxy group, s-butylcarbonyloxy group, t-butylcarbonyloxy group, n-pentylcarbonyloxy group, 1-methyl-n-butylcarbonyloxy group, 2-methyl-n-butylcarbonyloxy group, 3-methyl-n-butylcarbonyloxy group, 1,1-dimethyl-n-propylcarbonyloxy group, 1,2-dimethyl-n-propylcarbonyloxy group, 2,2-dimethyl-n-propylcarbonyloxy group, 1-ethyl-n-propylcarbonyloxy group, n-hexylcarbonyloxy group, 1-methyl-n-pentylcarbonyloxy group, 2-methyl-n-pentylcarbonyloxy group, 3-methyl-n-pentylcarbonyloxy group, 4-methyl-n-pentylcarbonyloxy group, 1,1-dimethyl-n-butylcarbonyloxy group, 1,2-dimethyl-n-butylcarbonyloxy group, 1,3-dimethyl-n-butylcarbonyloxy group, 2,2-dimethyl-n-butylcarbonyloxy group, 2,3-dimethyl-n-butylcarbonyloxy group, 3,3-dimethyl-n-butylcarbonyloxy group, 1-ethyl-n-butylcarbonyloxy group, 2-ethyl-n-butylcarbonyloxy group, 1,1,2-trimethyl-n-propylcarbonyloxy group, 1,2,2-trimethyl-n-propylcarbonyloxy group, 1-ethyl-1-methyl-n-propylcarbonyloxy group, 1-ethyl-2-methyl-n-propylcarbonyloxy group, phenylcarbonyloxy group, and tosylcarbonyloxy group.

Specific examples of the hydrolyzable silane of Formula (1) include, but are not limited to, tetramethoxysilane, tetrachlorosilane, tetraacetoxysilane, tetraethoxysilane, tetra-n-propoxysilane, tetra-i-propoxysilane, tetra-n-butoxysilane, methyltrimethoxysilane, methyltrichlorosilane, methyltriacetoxysilane, methyltriethoxysilane, methyltripropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltriethoxysilane, vinyltrichlorosilane, vinyltriacetoxysilane, methylvinyldimethoxysilane, methylvinyldiethoxysilane, methylvinyldichlorosilane, methylvinyldiacetoxysilane, dimethylvinylmethoxysilane, dimethylvinylethoxysilane, dimethylvinylchlorosilane, dimethylvinylacetoxysilane, divinyldimethoxysilane, divinyldiethoxysilane, divinyldichlorosilane, divinyldiacetoxysilane, γ-glycidoxypropylvinyldimethoxysilane, γ-glycidoxypropylvinyldiethoxysilane, allyltrimethoxysilane, allyltriethoxysilane, allyltrichlorosilane, allyltriacetoxysilane, allylmethyldimethoxysilane, allylmethyldiethoxysilane, allylmethyldichlorosilane, allylmethyldiacetoxysilane, allyldimethylmethoxysilane, allyldimethylethoxysilane, allyldimethylchlorosilane, allyldimethylacetoxysilane, diallyldimethoxysilane, diallyldiethoxysilane, diallyldichlorosilane, diallyldiacetoxysilane, 3-allylaminopropyltrimethoxysilane, 3-allylaminopropyltriethoxysilane, p-styryltrimethoxysilane, phenyltrimethoxysilane, phenyltriethoxysilane, phenyltrichlorosilane, phenyltriacetoxysilane, phenylmethyldimethoxysilane, phenylmethyldiethoxysilane, phenylmethyldichlorosilane, phenylmethyldiacetoxysilane, phenyldimethylmethoxysilane, phenyldimethylethoxysilane, phenyldimethylchlorosilane, phenyldimethylacetoxysilane, diphenylmethylmethoxysilane, diphenylmethylethoxysilane, diphenylmethylchlorosilane, diphenylmethylacetoxysilane, diphenyldimethoxysilane, diphenyldiethoxysilane, diphenyldichlorosilane, diphenyldiacetoxysilane, triphenylmethoxysilane, triphenylethoxysilane, triphenylacetoxysilane, triphenylchlorosilane, 3-phenylaminopropyltrimethoxysilane, 3-phenylaminopropyltriethoxysilane, dimethoxymethyl-3-(3-phenoxypropylthiopropyl)silane, triethoxy((2-methoxy-4-(methoxymethyl)phenoxy)methyl)silane, benzyltrimethoxysilane, benzyltriethoxysilane, benzylmethyldimethoxysilane, benzylmethyldiethoxysilane, benzyldimethylmethoxysilane, benzyldimethylethoxysilane, benzyldimethylchlorosilane, phenethyltrimethoxysilane, phenethyltriethoxysilane, phenethyltrichlorosilane, phenethyltriacetoxysilane, phenethylmethyldimethoxysilane, phenethylmethyldiethoxysilane, phenethylmethyldichlorosilane, phenethylmethyldiacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, i-propoxyphenyltrimethoxysilane, i-propoxyphenyltriethoxysilane, i-propoxyphenyltriacetoxysilane, i-propoxyphenyltrichlorosilane, i-propoxybenzyltrimethoxysilane, i-propoxybenzyltriethoxysilane, i-propoxybenzyltriacetoxysilane, i-propoxybenzyltrichlorosilane, t-butoxyphenyltrimethoxysilane, t-butoxyphenyltriethoxysilane, t-butoxyphenyltriacetoxysilane, t-butoxyphenyltrichlorosilane, t-butoxybenzyltrimethoxysilane, t-butoxybenzyltriethoxysilane, t-butoxybenzyltriacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, thiocyanatopropyltriethoxysilane, chloromethyltrimethoxysilane, chloromethyltriethoxysilane, triethoxysilylpropyldiallyl isocyanurate, bicyclo[2,2,1]heptenyltriethoxysilane, benzenesulfonylpropyltriethoxysilane, benzenesulfonamidepropyltriethoxysilane, dimethylaminopropyltrimethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptopropylmethyldiehoxysilane, methylvinyldimethoxysilane, methylvinyldiethoxysilane, and silanes of the following Formulae (A-1) to (A-41).

Formula (A-1)

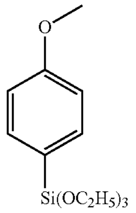

Formula (A-2)

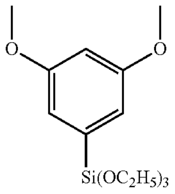

Formula (A-3)

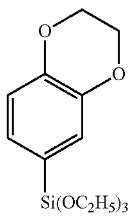

-continued

Formula (A-4)

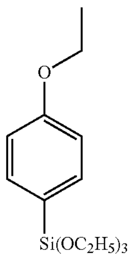

Formula (A-5)

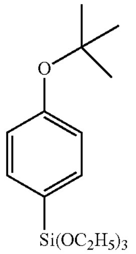

Formula (A-6)

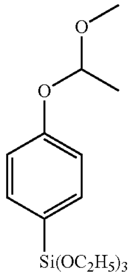

Formula (A-7)

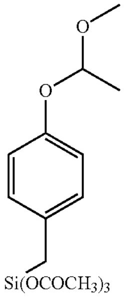

Formula (A-8)

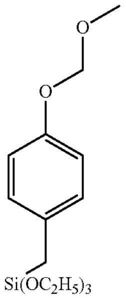

-continued
Formula (A-9)
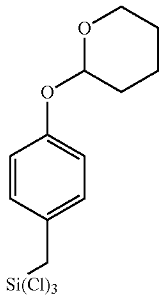
Formula (A-10)
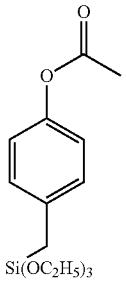
Formula (A-11)
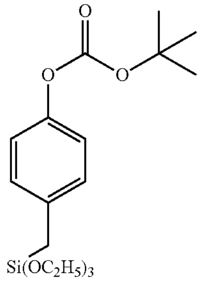
Formula (A-12)
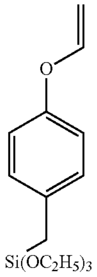
Formula (A-13)
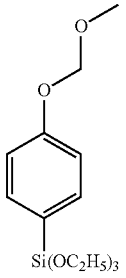
-continued
Formula (A-14)
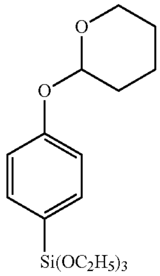
Formula (A-15)
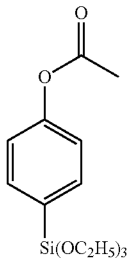
Formula (A-16)
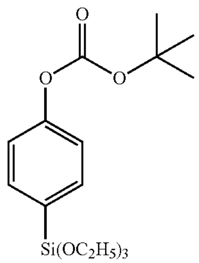
Formula (A-17)
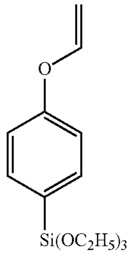
Formula (A-18)
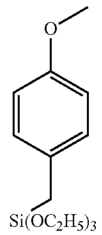
Formula (A-19)
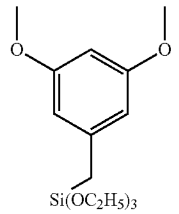

-continued
Formula (A-20)
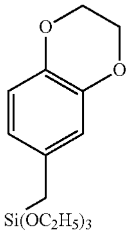
Formula (A-21)
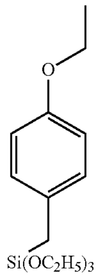
Formula (A-22)
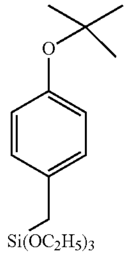
Formula (A-23)
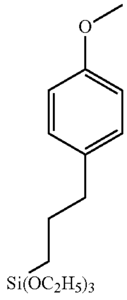
Formula (A-24)
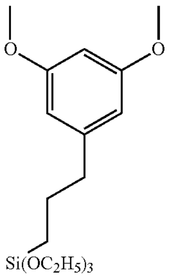
-continued
Formula (A-25)
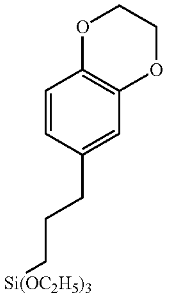
Formula (A-26)
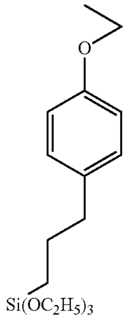
Formula (A-27)
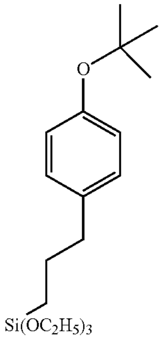
Formula (A-28)
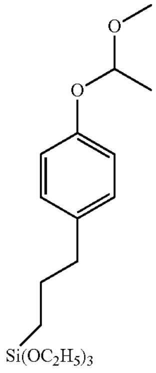

-continued
Formula (A-29)
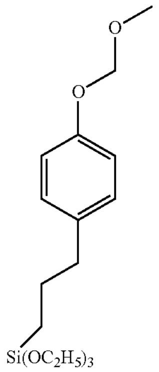
Formula (A-30)
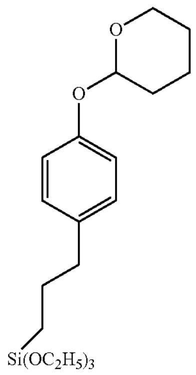
Formula (A-31)
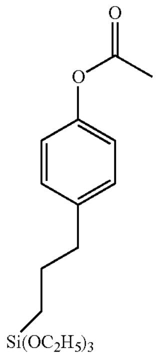
Formula (A-32)
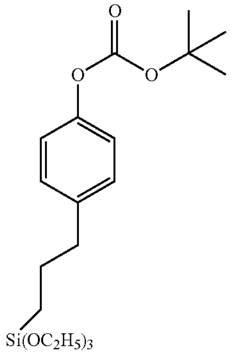
-continued
Formula (A-33)
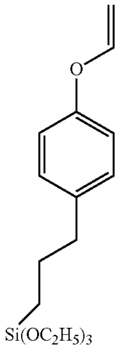
Formula (A-34)
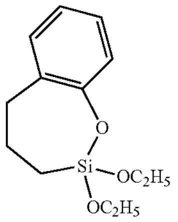
Formula (A-35)
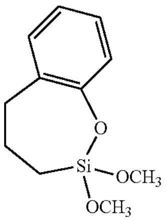
Formula (A-36)
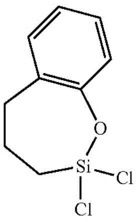
Formula (A-37)
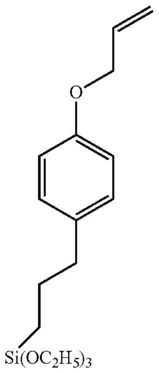

-continued

Formula (A-38)

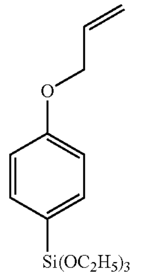

Formula (A-39)

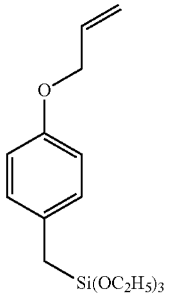

Formula (A-40)

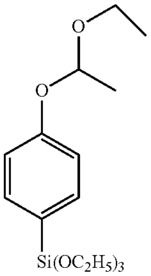

Formula (A-41)

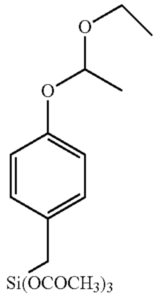

The polysiloxane [A] may be, for example, a hydrolysis condensate of a hydrolyzable silane containing a hydrolyzable silane of the following Formula (2) in addition to or in place of the hydrolyzable silane of Formula (1).

$$\left[R^3{}_bSi(R^4)_{3-b}\right]_2R^5{}_c \quad (2)$$

In Formula (2), $R^3$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, a sulfonyl group, or a cyano group, or any combination of these.

In Formula (2), $R^4$ is a group or atom bonded to the silicon atom, and is each independently an alkoxy group, an aralkyloxy group, an acyloxy group, or a halogen atom.

In Formula (2), $R^5$ is a group bonded to the silicon atom, and is each independently an alkylene group or an arylene group.

In Formula (2), b is an integer of 0 or 1, and c is an integer of 0 or 1.

Specific examples of the groups of $R^3$ and preferred carbon atom numbers thereof are the same as those described above regarding $R^1$.

Specific examples of the groups and the atoms of $R^4$ and preferred carbon atom numbers thereof are the same as those described above regarding $R^2$.

Specific examples of the alkylene group of $R^5$ include, but are not limited to, alkylene groups, for example, linear alkylene groups such as methylene group, ethylene group, trimethylene group, tetramethylene group, pentamethylene group, hexamethylene group, heptamethylene group, octamethylene group, nonamethylene group, and decamethylene group, and branched alkylene groups such as 1-methyltrimethylene group, 2-methyltrimethylene group, 1,1-dimethylethylene group, 1-methyltetramethylene group, 2-methyltetramethylene group, 1,1-dimethyltrimethylene group, 1,2-dimethyltrimethylene group, 2,2-dimethyltrimethylene group, and 1-ethyltrimethylene group; and alkanetriyl groups such as methanetriyl group, ethane-1,1,2-triyl group, ethane-1,2,2-triyl group, ethane-2,2,2-triyl group, propane-1,1,1-triyl group, propane-1,1,2-triyl group, propane-1,2,3-triyl group, propane-1,2,2-triyl group, propane-1,1,3-triyl group, butane-1,1,1-triyl group, butane-1,1,2-triyl group, butane-1,1,3-triyl group, butane-1,2,3-triyl group, butane-1,2,4-triyl group, butane-1,2,2-triyl group, butane-2,2,3-triyl group, 2-methylpropane-1,1,1-triyl group, 2-methylpropane-1,1,2-triyl group, and 2-methylpropane-1,1,3-triyl group.

Specific examples of the arylene group include, but are not limited to, 1,2-phenylene group, 1,3-phenylene group, 1,4-phenylene group; groups derived from a condensed-ring aromatic hydrocarbon compound through removal of two hydrogen atoms on the aromatic ring, such as 1,5-naphthalenediyl group, 1,8-naphthalenediyl group, 2,6-naphthalenediyl group, 2,7-naphthalenediyl group, 1,2-anthracenediyl group, 1,3-anthracenediyl group, 1,4-anthracenediyl group, 1,5-anthracenediyl group, 1,6-anthracenediyl group, 1,7-anthracenediyl group, 1,8-anthracenediyl group, 2,3-anthracenediyl group, 2,6-anthracenediyl group, 2,7-anthracenediyl group, 2,9-anthracenediyl group, 2,10-anthracenediyl group, and 9,10-anthracenediyl group; and groups derived from a linked-ring aromatic hydrocarbon compound through removal of two hydrogen atoms on the aromatic ring, such as 4,4'-biphenyldiyl group and 4,4"-p-terphenyldiyl group.

In Formula (2), b is preferably 0 or 1, more preferably 0, In Formula (2), c is preferably 1.

Specific examples of the hydrolyzable silane of Formula (2) include, but are not limited to, methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

The polysiloxane [A] may be, for example, a hydrolysis condensate of a hydrolyzable silane containing an additional hydrolyzable silane described below in addition to the hydrolyzable silane of Formula (1) and/or the hydrolyzable silane of Formula (2).

Examples of the additional hydrolyzable silane include, but are not limited to, a silane compound having an onium group in the molecule, a silane compound having a sulfone group, a silane compound having a sulfonamide group, and a silane compound having a cyclic urea structure in the molecule.

<Silane Compound Having Onium Group in Molecule (Hydrolyzable Organosilane)>

A silane compound having an onium group in the molecule is expected to promote the crosslinking reaction of a hydrolyzable silane in an effective and efficient manner.

One preferred example of the silane compound having an onium group in the molecule is shown in the following Formula (3).

$$R^{11}{}_f R^{12}{}_g Si(R^{13})_{4-(f+g)} \quad (3)$$

$R^{11}$ is a group bonded to the silicon atom, and is an onium group or an organic group containing the onium group.

$R^{12}$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, or a cyano group, or any combination of these.

$R^{13}$ is a group or atom bonded to the silicon atom, and is each independently an alkoxy group, an aralkyloxy group, an acyloxy group, or a halogen atom.

In Formula (3), f is 1 or 2; g is 0 or 1; and f and g satisfy a relation of $1 \le f+g \le 2$.

Specific examples of the aforementioned alkyl group, aryl group, aralkyl group, halogenated alkyl group, halogenated aryl group, halogenated aralkyl group, alkoxyalkyl group, alkoxyaryl group, alkoxyaralkyl group, alkenyl group, and organic group containing an epoxy group, an acryloyl group, a methacryloyl group, a mercapto group, an amino group, or a cyano group, an alkoxy group, an aralkyloxy group, acyloxy group, and a halogen atom, and specific examples of the substituent of the alkyl group, the aryl group, the aralkyl group, the halogenated alkyl group, the halogenated aryl group, the halogenated aralkyl group, the alkoxyalkyl group, the alkoxyaryl group, the alkoxyaralkyl group, and the alkenyl group, and preferred carbon atom numbers thereof are the same as those described above regarding $R^1$ (for $R^{12}$) and regarding $R^2$ (for $R^{13}$).

More specifically, the onium group is, for example, a cyclic ammonium group or a chain ammonium group, and is preferably a tertiary ammonium group or a quaternary ammonium group.

Preferred specific examples of the onium group or the organic group containing the onium group include a cyclic ammonium group or a chain ammonium group, or an organic group containing at least one of these ammonium groups. Preferred is a tertiary ammonium group or a quaternary ammonium group, or an organic group containing at least one of these ammonium groups.

When the onium group is a cyclic ammonium group, the nitrogen atom forming the ammonium group also serves as an atom forming the ring. In this case, the nitrogen atom forming the ring and the silicon atom are bonded directly or via a divalent linking group, or the carbon atom forming the ring and the silicon atom are bonded directly or via a divalent linking group.

In one preferred embodiment of the present invention, $R^{11}$ (i.e., the group bonded to the silicon atom) is a heteroaromatic cyclic ammonium group of the following Formula (S1).

(S1)

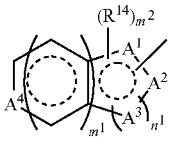

In Formula (Si), $A^1$, $A^2$, $A^3$, and $A^4$ are each independently a group of any of the following Formulae (J1) to (J3), and at least one of $A^1$ to $A^4$ is a group of the following Formula (J2). Depending on the bonding between the silicon atom in Formula (3) and any of $A^1$ to $A^4$, each of $A^1$ to $A^4$ and the ring-forming atom adjacent thereto forms a single bond or a double bond. This determines whether the thus-formed ring exhibits aromaticity.

(J1)

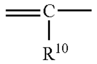

(J2)

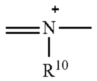

(J3)

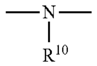

In Formulae (J1) to (J3), $R^{10}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

In Formula (S1), $R^{14}$ is each independently an alkyl group, an aryl group, an aralkyl group, a halogenated alkyl group, a halogenated aryl group, a halogenated aralkyl group, an alkenyl group, or a hydroxy group. When two or more $R^{14}$s are present, the two $R^{14}$s may be bonded together to form a ring, and the ring formed by the two $R^{14}$s may have a crosslinked ring structure. In such a case, the cyclic ammonium group has, for example, an adamantane ring, a norbornene ring, or a spiro ring.

Specific examples of these alkyl group, aryl group, aralkyl group, halogenated alkyl group, halogenated aryl group, halogenated aralkyl group, and alkenyl group, and preferred carbon atom numbers thereof are the same as those described above.

In Formula (S1), $n^1$ is an integer of 1 to 8; $m^1$ is 0 or 1; and $m^2$ is 0 or a positive integer raging from 1 to the possible maximum number of $R^{34}$s substituted on a monocyclic or polycyclic ring.

When $m^1$ is 0, a $(4+n^1)$-membered ring including $A^1$ to $A^4$ is formed. Specifically, when $n^1$ is 1, a 5-membered ring is formed; when $n^1$ is 2, a 6-membered ring is formed; when $n^1$ is 3, a 7-membered ring is formed; when $n^1$ is 4, a 8-membered ring is formed; when $n^1$ is 5, a 9-membered ring is formed; when $n^1$ is 6, a 10-membered ring is formed; when $n^1$ is 7, a 11-membered ring is formed; and when $n^1$ is 8, a 12-membered ring is formed.

When $m^1$ is 1, a condensed ring is formed by condensation between a $(4+n^1)$-membered ring including $A^1$ to $A^3$ and a 6-membered ring including $A^4$. Since each of $A^1$ to $A^4$ is any of the groups of Formulae (J1) to (J3), the ring-forming atom has or does not have a hydrogen atom. In each of $A^1$ to $A^4$, when the ring-forming atom has a hydrogen atom, the hydrogen atom may be substituted with $R^{14}$. Alternatively, a ring-forming atom other than the ring-forming atom in each of $A^1$ to $A^4$ may be substituted with $R^{14}$. Because of these circumstances, $m^2$ is 0 or an integer raging from 1 to the possible maximum number of $R^{14}$s substituted on a monocyclic or polycyclic ring.

The dangling bond of the heteroaromatic cyclic ammonium group of Formula (S1) is present on any carbon atom or nitrogen atom present in such a monocyclic or polycyclic ring, and is directly bonded to the silicon atom. Alternatively, the dangling bond is bonded to a linking group to form an organic group containing the cyclic ammonium group, and the organic group is bonded to the silicon atom.

Examples of the linking group include, but are not limited to, an alkylene group, an arylene group, and an alkenylene group.

Specific examples of the alkylene group and the arylene group, and preferred carbon atom numbers thereof are the same as those described above.

The alkenylene group is a divalent group derived from an alkenyl group through removal of one hydrogen atom. Specific examples of the alkenyl group are the same as those described above. No particular limitation is imposed on the carbon atom number of the alkenylene group, but the carbon atom number is preferably 40 or less, more preferably 30 or less, still more preferably 20 or less.

Specific examples of the alkenylene group include, but are not limited to, vinylene group, 1-methylvinylene group, propenylene group, 1-butenylene group, 2-butenylene group, 1-pentenylene group, and 2-pentenylene group.

Specific examples of the silane compound (hydrolyzable organosilane) of Formula (3) having the heteroaromatic cyclic ammonium group of Formula (S1) include, but are not limited to, silanes of the following Formulae (I-1) to (I-50).

Formula (I-1)

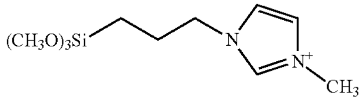

Formula (I-2)

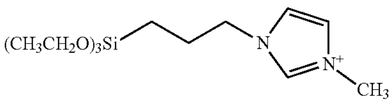

-continued

Formula (I-3)

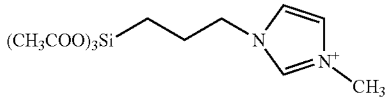

Formula (I-4)

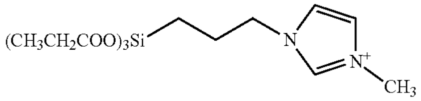

Formula (I-5)

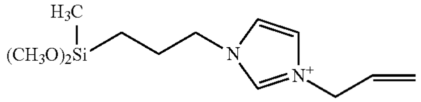

Formula (I-6)

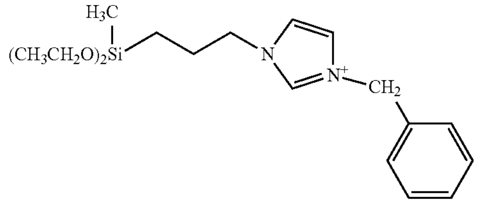

Formula (I-7)

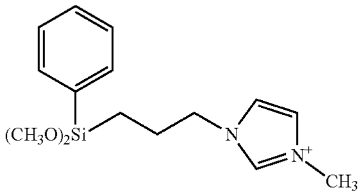

Formula (I-8)

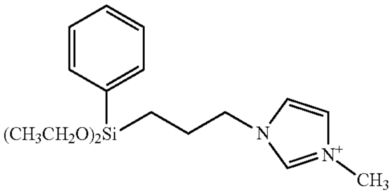

Formula (I-9)

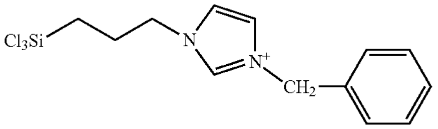

Formula (I-10)

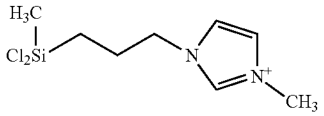

Formula (I-11)

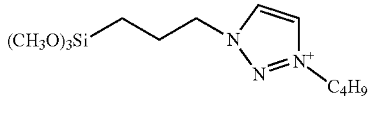

Formula (I-12)

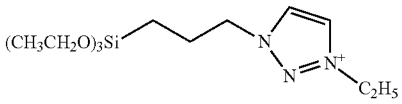

Formula (I-13)

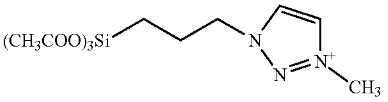

-continued
Formula (I-14)
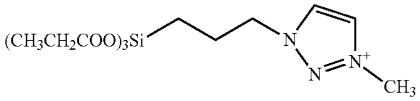
Formula (I-15)
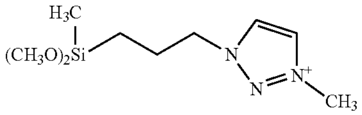
Formula (I-16)
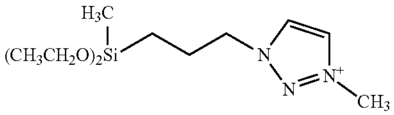
Formula (I-17)
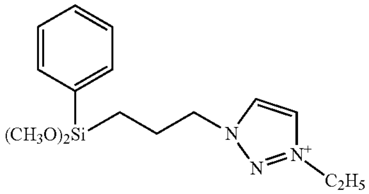
Formula (I-18)
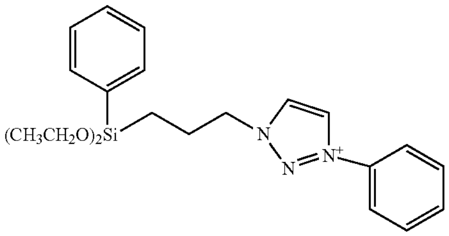
Formula (I-19)
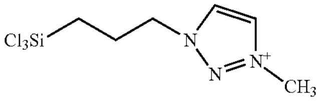
Formula (I-20)
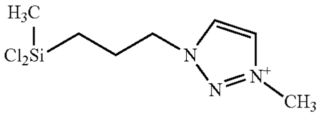
Formula (I-21)
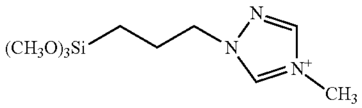
Formula (I-22)
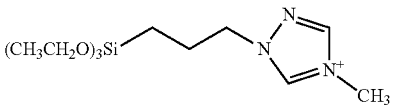
Formula (I-23)
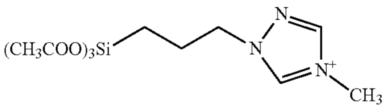
Formula (I-24)
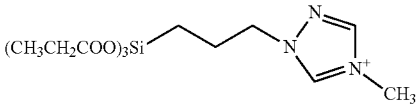
-continued
Formula (I-25)
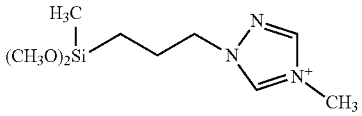
Formula (I-26)
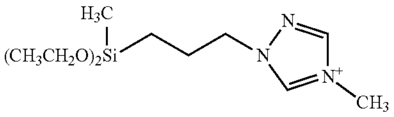
Formula (I-27)
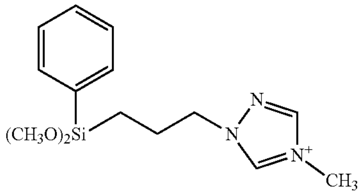
Formula (I-28)
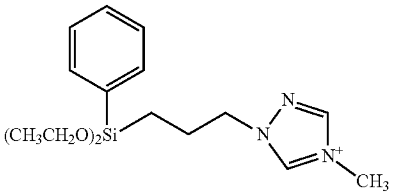
Formula (I-29)
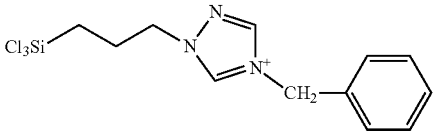
Formula (I-30)
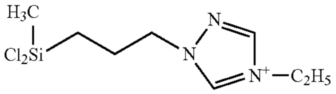
Formula (I-31)
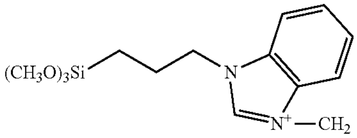
Formula (I-32)
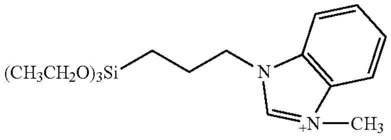
Formula (I-33)
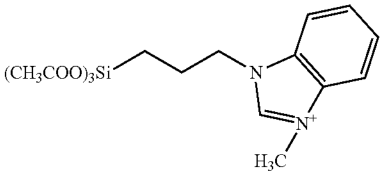
Formula (I-34)
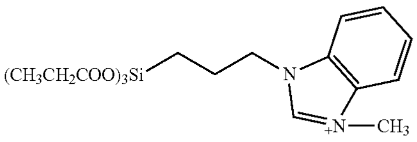

-continued

Formula (I-35)

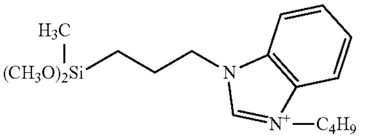

Formula (I-36)

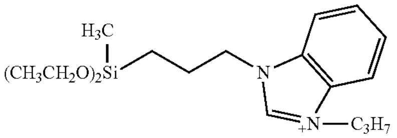

Formula (I-37)

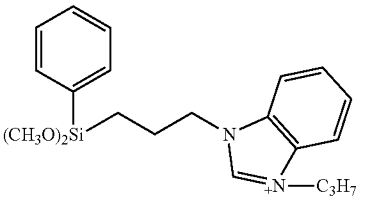

Formula (I-38)

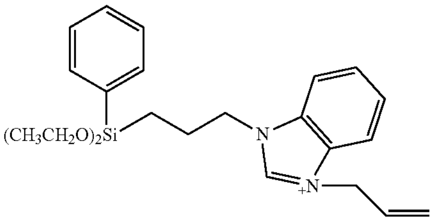

Formula (I-39)

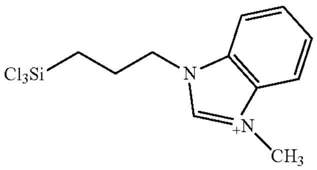

Formula (I-40)

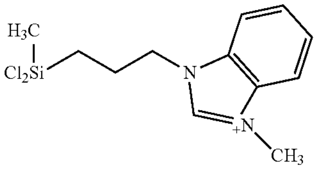

Formula (I-41)

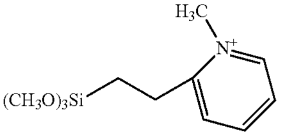

Formula (I-42)

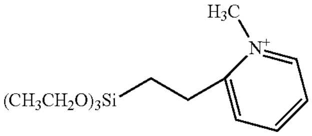

Formula (I-43)

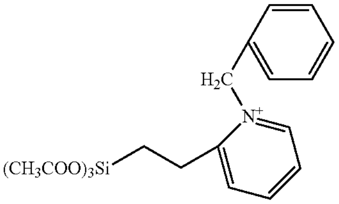

-continued

Formula (I-44)

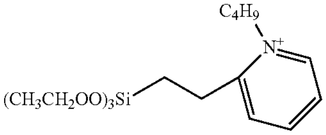

Formula (I-45(

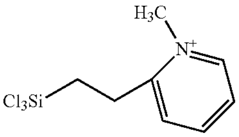

Formula (I-46)

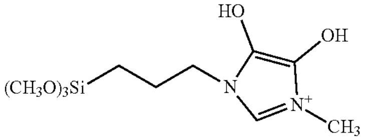

Formula (I-47)

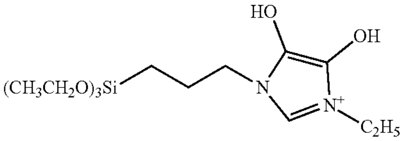

Formula (I-48)

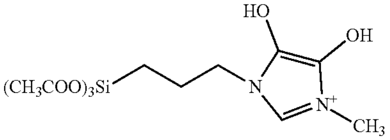

Formula (I-49)

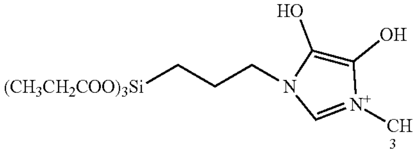

Formula (I-50)

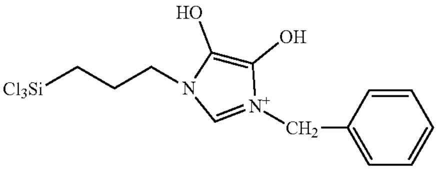

In another embodiment, $R^{11}$ (i.e., the group bonded to the silicon atom in Formula (3)) is a heteroaliphatic cyclic ammonium group of the following Formula (S2).

(S2)

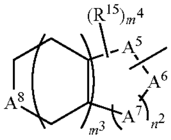

In Formula (S2), $A^5$, $A^6$, $A^7$, and $A^8$ are each independently a group of any of the following Formulae (J4) to (J6), and at least one of $A^5$ to $A^8$ is a group of the following Formula (J5). Depending on the bonding between the silicon atom in Formula (3) and any of $A^5$ to $A^8$, each of $A^5$ to $A^8$ and the ring-forming atom adjacent thereto forms a single bond or a double bond. This determines whether the thus-formed ring exhibits anti-aromaticity.

(J4)

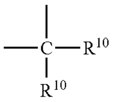

(J5)

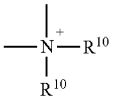

(J6)

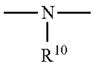

In Formulae (J4) to (J6), $R^{10}$ is each independently a single bond, a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

In Formula (S2), $R^{15}$ is each independently an alkyl group, an aryl group, an aralkyl group, a halogenated alkyl group, a halogenated aryl group, a halogenated aralkyl group, an alkenyl group, or a hydroxy group. When two or more $R^{15}$s are present, the two $R^{15}$s may be bonded together to form a ring, and the ring formed by the two $R^{15}$s may have a crosslinked ring structure. In such a case, the cyclic ammonium group has, for example, an adamantane ring, a norbornene ring, or a spiro ring.

Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

In Formula (S2), $n^2$ is an integer of 1 to 8; $m^3$ is 0 or 1; and $m^4$ is 0 or a positive integer raging from 1 to the possible maximum number of $R^{35}$s substituted on a monocyclic or polycyclic ring.

When $m^3$ is 0, a $(4+n^2)$-membered ring including $A^5$ to $A^8$ is formed. Specifically, when $n^2$ is 1, a 5-membered ring is formed; when $n^2$ is 2, a 6-membered ring is formed; when $n^2$ is 3, a 7-membered ring is formed; when $n^2$ is 4, a 8-membered ring is formed; when $n^2$ is 5, a 9-membered ring is formed; when $n^2$ is 6, a 10-membered ring is formed; when $n^2$ is 7, a 11-membered ring is formed; and when $n^2$ is 8, a 12-membered ring is formed.

When $m^3$ is 1, a condensed ring is formed by condensation between a $(4+n^2)$-membered ring including $A^5$ to $A^7$ and a 6-membered ring including $A^8$.

Since each of $A^5$ to $A^8$ is any of the groups of Formulae (J4) to (J6), the ring-forming atom has or does not have a hydrogen atom. In each of $A^5$ to $A^8$, when the ring-forming atom has a hydrogen atom, the hydrogen atom may be substituted with $R^{15}$. Alternatively, a ring-forming atom other than the ring-forming atom in each of $A^5$ to $A^8$ may be substituted with $R^{15}$.

Because of these circumstances, $m^4$ is 0 or an integer raging from 1 to the possible maximum number of $R^{15}$s substituted on a monocyclic or polycyclic ring.

The dangling bond of the heteroaliphatic cyclic ammonium group of Formula (S2) is present on any carbon atom or nitrogen atom present in such a monocyclic or polycyclic ring, and is directly bonded to the silicon atom. Alternatively, the dangling bond is bonded to a linking group to form an organic group containing the cyclic ammonium group, and the organic group is bonded to the silicon atom.

The linking group is, for example, an alkylene group, an arylene group, or an alkenylene group. Specific examples of the alkylene group, the arylene group, and the alkenylene group, and preferred carbon atom numbers thereof are the same as those described above.

Specific examples of the silane compound (hydrolyzable organosilane) of Formula (3) having the heteroaliphatic cyclic ammonium group of Formula (S2) include, but are not limited to, silanes of the following Formulae (II-1) to (II-30).

Formula (II-1)

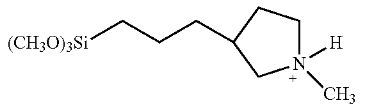

Formula (II-2)

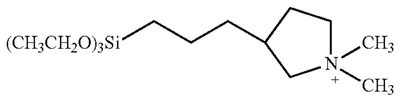

Formula (II-3)

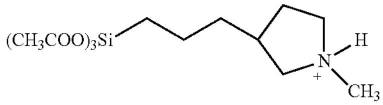

Formula (II-4)

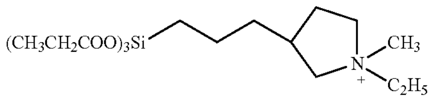

Formula (II-5)

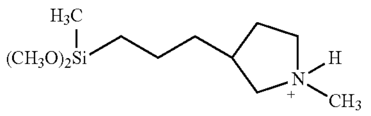

Formula (II-6)

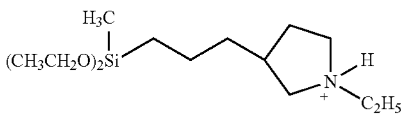

Formula (II-7)

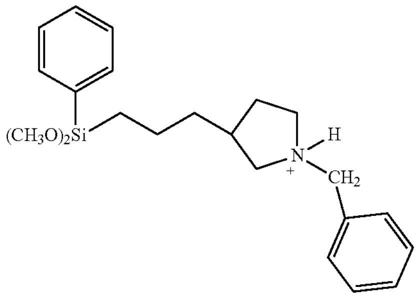

-continued
Formula (II-8)
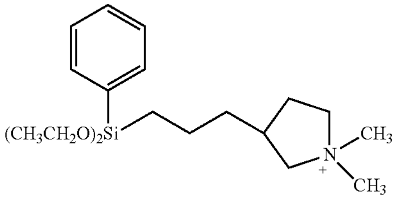
Formula (II-9)
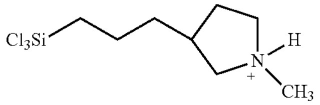
Formula (II-10)
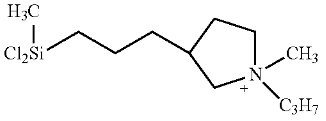
Formula (II-11)
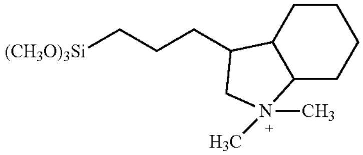
Formula (II-12)
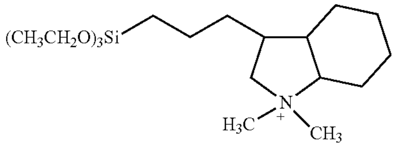
Formula (II-13)
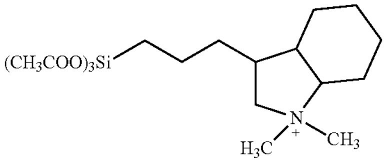
Formula (II-14)
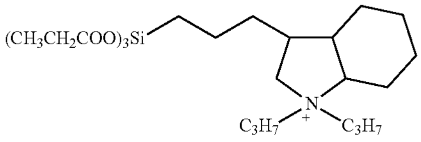
Formula (II-15)
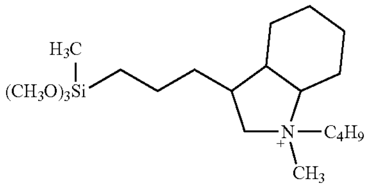
Formula (II-16)
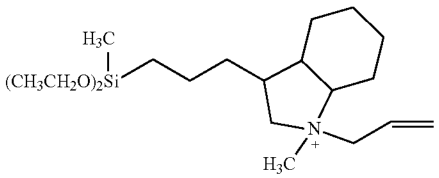
-continued
Formula (II-17)
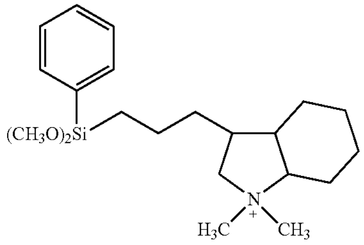
Formula (II-18)
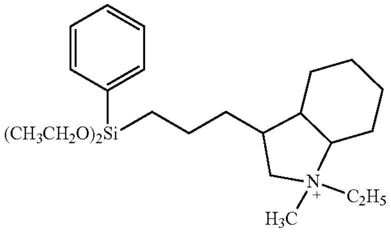
Formula (II-19)
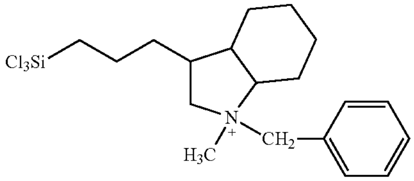
Formula (II-20)
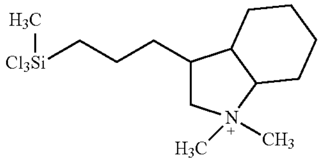
Formula (II-21)
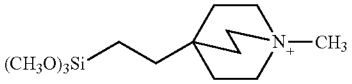
Formula (II-22)
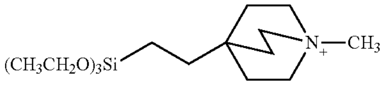
Formula (II-23)
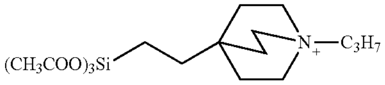
Formula (II-24)
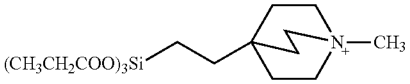
Formula (II-25)
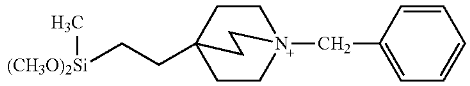
Formula (II-26)
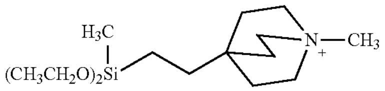

-continued

Formula (II-27)

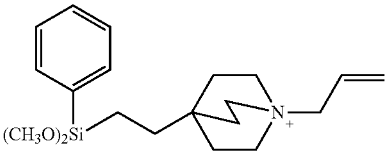

Formula (II-28)

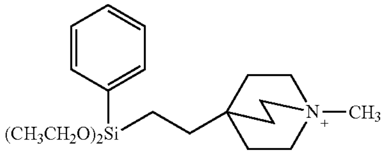

Formula (II-29)

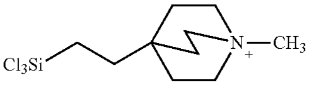

Formula (II-30)

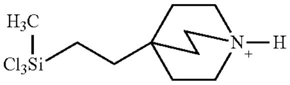

In yet another embodiment, $R^{11}$ (i.e., the group bonded to the silicon atom in Formula (3)) is a chain ammonium group of the following Formula (S3).

(S3)

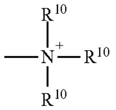

In Formula (S3), $R^{10}$ is each independently a hydrogen atom, an alkyl group, an aryl group, an aralkyl group, a halogenated alkyl group, a halogenated aryl group, a halogenated aralkyl group, or an alkenyl group. Specific examples of the alkyl group, the aryl group, the aralkyl group, the halogenated alkyl group, the halogenated aryl group, the halogenated aralkyl group, and the alkenyl group, and preferred carbon atom numbers thereof are the same as those described above.

The chain ammonium group of Formula (S3) is directly bonded to the silicon atom. Alternatively, the chain ammonium group is bonded to a linking group to form an organic group containing the chain ammonium group, and the organic group is bonded to the silicon atom.

The linking group is, for example, an alkylene group, an arylene group, or an alkenylene group. Specific examples of the alkylene group, the arylene group, and the alkenylene group are the same as those described above.

Specific examples of the silane compound (hydrolyzable organosilane) of Formula (3) having the chain ammonium group of Formula (S3) include, but are not limited to, silanes of the following Formulae (III-1) to (III-28).

Formula (III-1)

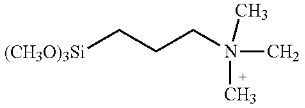

-continued

Formula (III-2)

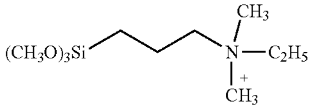

Formula (III-3)

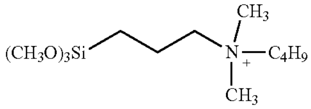

Formula (III-4)

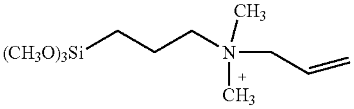

Formula (III-5)

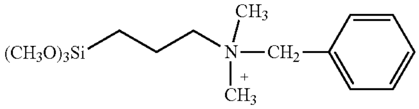

Formula (III-6)

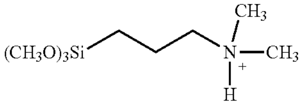

Formula (III-7)

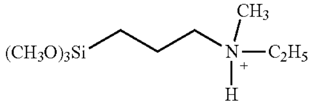

Formula (III-8)

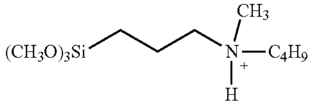

Formula (III-9)

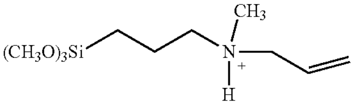

Formula (III-10)

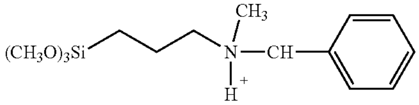

Formula (III-11)

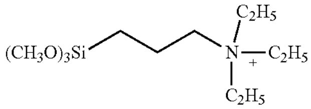

Formula (III-12)

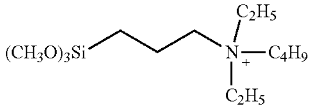

Formula (III-13)

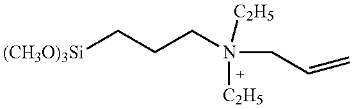

Formula (III-14)

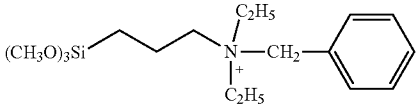

-continued

Formula (III-15)

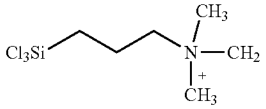

Formula (III-16)

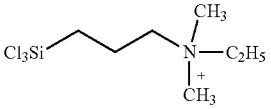

Formula (III-17)

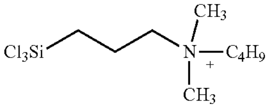

Formula (III-18)

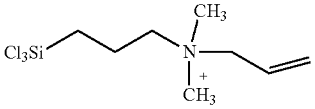

Formula (III-19)

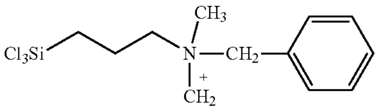

Formula (III-20)

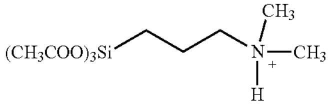

Formula (III-21)

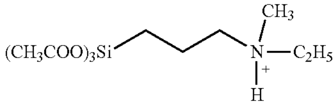

Formula (III-22)

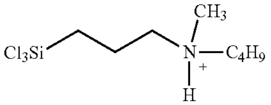

Formula (III-23)

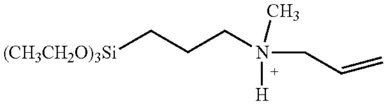

Formula (III-24)

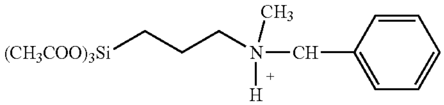

Formula (III-25)

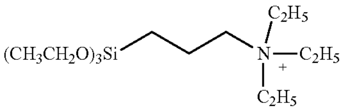

Formula (III-26)

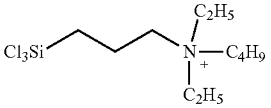

Formula (III-27)

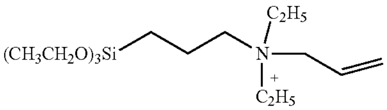

-continued

Formula (III-28)

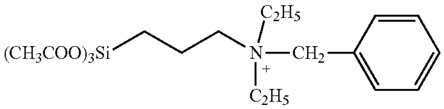

<Silane Compound Having Sulfone Group or Sulfonamide Group (Hydrolyzable Organosilane)>

Examples of the silane compound having a sulfone group and the silane compound having a sulfonamide group include, but are not limited to, compounds of the following Formulae (B-1) to (B-36).

In the following Formulae, Me denotes a methyl group, and Et denotes an ethyl group.

Formula (B-1)

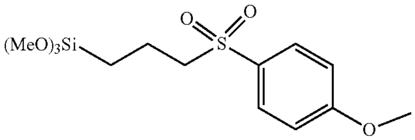

Formula (B-2)

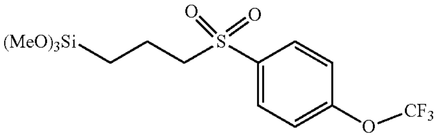

Formula (B-3)

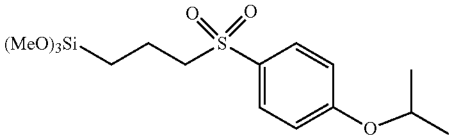

Formula (B-4)

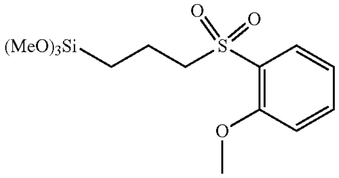

Formula (B-5)

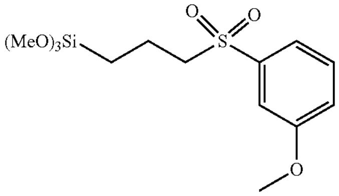

Formula (B-6)

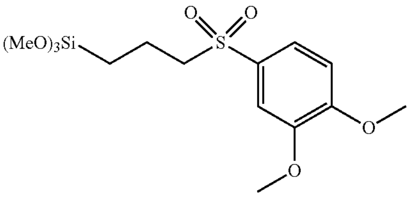

-continued
Formula (B-7)
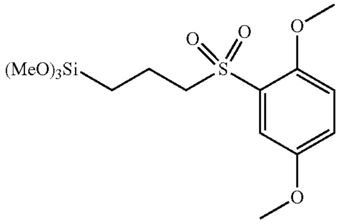
Formula (B-8)
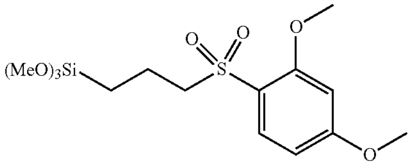
Formula (B-9)
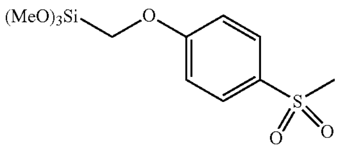
Formula (B-10)
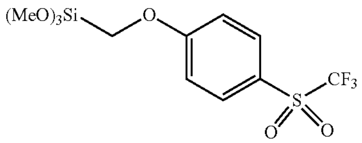
Formula (B-11)
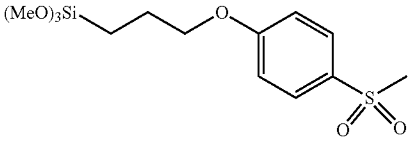
Formula (B-12)
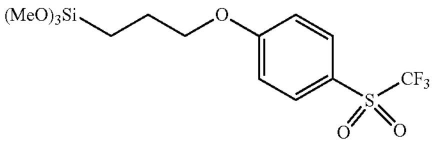
Formula (B-13)
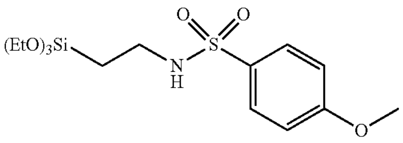
Formula (B-14)
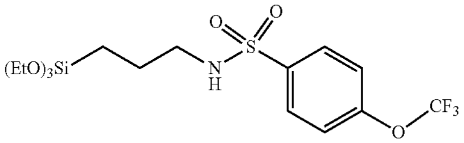
Formula (B-15)
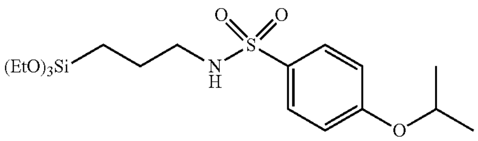
-continued
Formula (B-16)
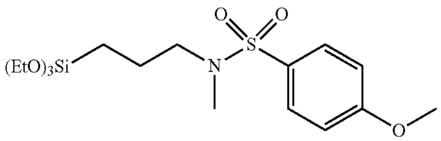
Formula (B-17)
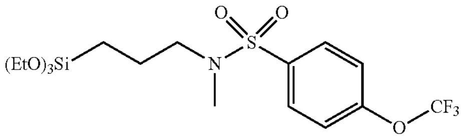
Formula (B-18)
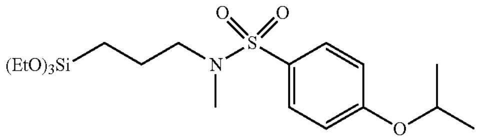
Formula (B-19)
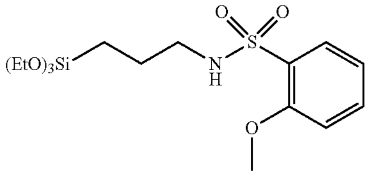
Formula (B-20)
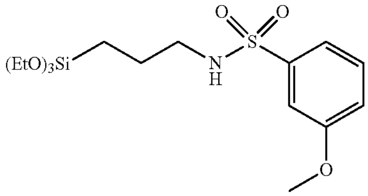
Formula (B-21)
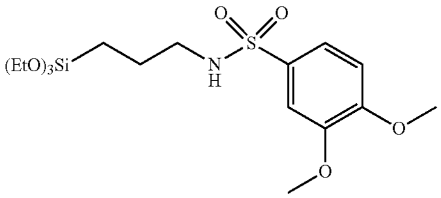
Formula (B-22)
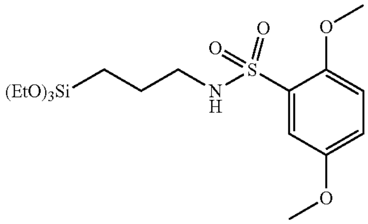
Formula (B-23)
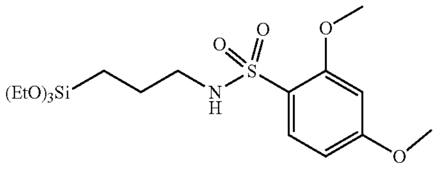

-continued

Formula (B-24)

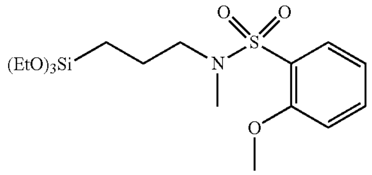

Formula (B-25)

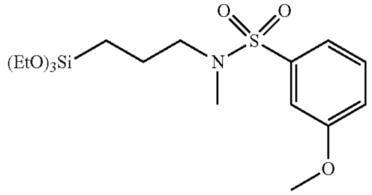

Formula (B-26)

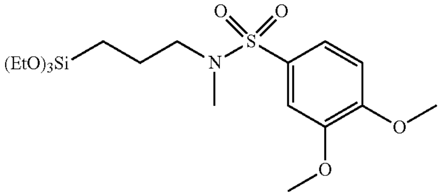

Formula (B-27)

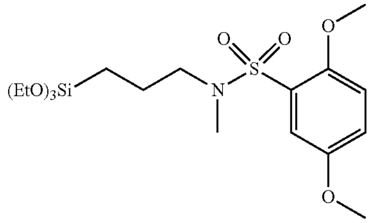

Formula (B-28)

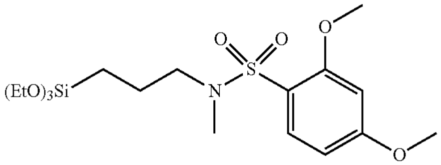

Formula (B-29)

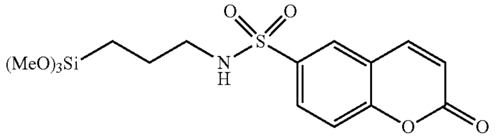

Formula (B-30)

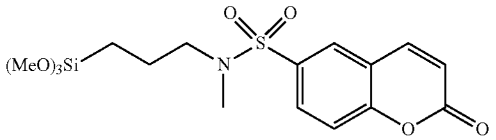

Formula (B-31)

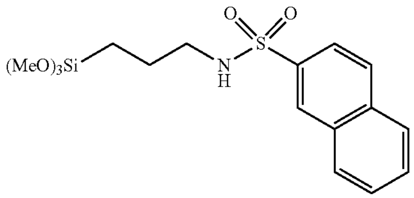

-continued

Formula (B-32)

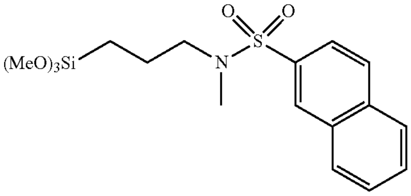

Formula (B-33)

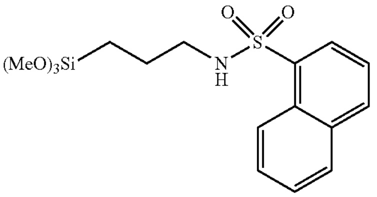

Formula (B-34)

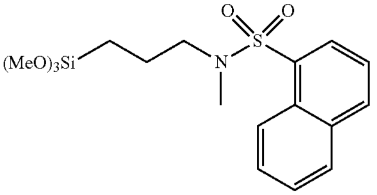

Formula (B-35)

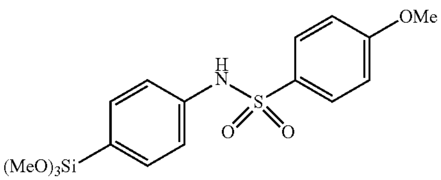

Formula (B-36)

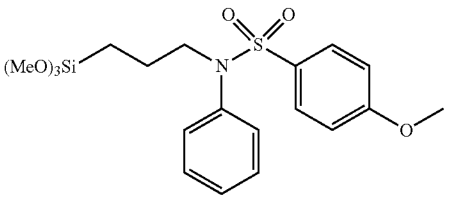

<Silane Compound Having Cyclic Urea Structure in Molecule (Hydrolyzable Organosilane)>

The hydrolyzable organosilane having a cyclic urea structure in the molecule is, for example, a hydrolyzable organosilane of the following Formula (4-1).

$$R^{401}{}_{x}R^{402}{}_{y}Si(R^{403})_{4-(x+y)} \tag{4-1}$$

In Formula (4-1), $R^{401}$ is a group bonded to the silicon atom, and is each independently a group of the following Formula (4-2).

$R^{402}$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, or a cyano group.

$R^{403}$ is a group or atom bonded to the silicon atom, and is each independently an alkoxy group, an aralkyloxy group, an acyloxy group, or a halogen atom.

In Formula (4-1), x is 1 or 2; y is 0 or 1; and x and y satisfy a relation of $x+y \leq 2$.

Specific examples of the alkyl group, aryl group, aralkyl group, halogenated alkyl group, halogenated aryl group, halogenated aralkyl group, alkoxyalkyl group, alkoxyaryl group, alkoxyaralkyl group, alkenyl group, and organic group containing an epoxy group, an acryloyl group, a methacryloyl group, a mercapto group, or a cyano group of $R^{402}$, the alkoxy group, aralkyloxy group, acyloxy group, and halogen atom of $R^{403}$, and the substituent of each of these groups, and preferred carbon atom numbers thereof are the same as those described above regarding $R^1$ and $R^2$.

(4-2)

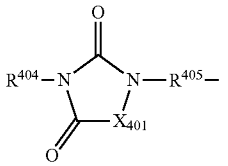

In Formula (4-2), $R^{404}$ is each independently a hydrogen atom, a substitutable alkyl group, a substitutable alkenyl group, or an organic group containing an epoxy group or a sulfonyl group; and $R^{405}$ is each independently an alkylene group, a hydroxyalkylene, a sulfide bond (—S—), an ether bond (—O—), or an ester bond (—CO—O— or —O—CO—).

Specific examples of the substitutable alkyl group, substitutable alkenyl group, and organic group containing an epoxy group of $R^{404}$, and preferred carbon atom numbers thereof are the same as those described above regarding $R^1$. Other preferred examples of the substitutable alkyl group of $R^{404}$ include an alkyl group wherein the terminal hydrogen atom is substituted with a vinyl group. Specific examples of the alkyl group include allyl group, 2-vinylethyl group, 3-vinylpropyl group, and 4-vinylbutyl group.

No particular limitation is imposed on the organic group containing a sulfonyl group, so long as it contains a sulfonyl group. Examples of the organic group containing a sulfonyl group include substitutable alkylsulfonyl group, substitutable arylsulfonyl group, substitutable aralkylsulfonyl group, substitutable halogenated alkylsulfonyl group, substitutable halogenated arylsulfonyl group, substitutable halogenated aralkylsulfonyl group, substitutable alkoxyalkylsulfonyl group, substitutable alkoxyarylsulfonyl group, substitutable alkoxyaralkylsulfonyl group, and substitutable alkenylsulfonyl group.

Specific examples of the alkyl group, aryl group, aralkyl group, halogenated alkyl group, halogenated aryl group, halogenated aralkyl group, alkoxyalkyl group, alkoxyaryl group, alkoxyaralkyl group, and alkenyl group of the aforementioned groups, the substituent of these groups, and preferred carbon atom numbers thereof are the same as those described above regarding $R^1$.

The alkylene group of $R^{405}$ is a divalent group derived from the aforementioned alkyl group through removal of one hydrogen atom, and may have a linear, branched, or cyclic structure. Specific examples of the alkylene group are the same as those described above. No particular limitation is imposed on the carbon atom number of the alkylene group, but the carbon atom number is preferably 40 or less, more preferably 30 or less, still more preferably 20 or less, much more preferably 10 or less.

The alkylene group may have one or more selected from among a sulfide bond, an ether bond, and an ester bond at an end or middle portion (preferably at a middle portion) of the alkylene group.

Specific examples of the alkylene group include, but are not limited to, linear alkylene groups, such as methylene group, ethylene group, trimethylene group, methylethylene group, tetramethylene group, pentamethylene group, hexamethylene group, heptamethylene group, octamethylene group, nonamethylene group, and decamethylene group; branched alkylene groups, such as 1-methyltrimethylene group, 2-methyltrimethylene group, 1,1-dimethylethylene group, 1-methyltetramethylene group, 2-methyltetramethylene group, 1,1-dimethyltrimethylene group, 1,2-dimethyltrimethylene group, 2,2-dimethyltrimethylene group, and 1-ethyltrimethylene group; cyclic alkylene groups, such as 1,2-cyclopropanediyl group, 1,2-cyclobutanediyl group, 1,3-cyclobutanediyl group, 1,2-cyclohexanediyl group, and 1,3-cyclohexanediyl group; and alkylene groups containing an ether group, etc. such as $—CH_2OCH_2—$, $—CH_2CH_2OCH_2—$, $—CH_2CH_2OCH_2CH_2—$, $—CH_2CH_2CH_2OCH_2CH_2—$, $—CH_2CH_2OCH_2CH_2CH_2—$, $—CH_2CH_2CH_2OCH_2CH_2CH_2—$, $—CH_2SCH_2—$, $—CH_2CH_2SCH_2—$, $—CH_2CH_2SCH_2CH_2—$, $—CH_2CH_2CH_2SCH_2CH_2—$, $—CH_2CH_2SCH_2CH_2CH_2—$, $—CH_2CH_2CH_2SCH_2CH_2CH_2—$, and $—CH_2OCH_2CH_2SCH_2—$.

The hydroxyalkylene group is prepared by substitution of at least one hydrogen atom of the aforementioned alkylene group with a hydroxy group. Specific examples of the hydroxyalkylene group include, but are not limited to, hydroxymethylene group, 1-hydroxyethylene group, 2-hydroxyethylene group, 1,2-dihydroxyethylene group, 1-hydroxytrimethylene group, 2-hydroxytrimethylene group, 3-hydroxytrimethylene group, 1-hydroxytetramethylene group, 2-hydroxytetramethylene group, 3-hydroxytetramethylene group, 4-hydroxytetramethylene group, 1,2-dihydroxytetramethylene group, 1,3-dihydroxytetramethylene group, 1,4-dihydroxytetramethylene group, 2,3-dihydroxytetramethylene group, 2,4-dihydroxytetramethylene group, and 4,4-dihydroxytetramethylene group.

In Formula (4-2), $X_{401}$ is each independently a group of any of the following Formulae (4-3) to (4-5), and the carbon atom of the ketone group in each of the following Formulae (4-4) and (4-5) is bonded to the nitrogen atom bonded to $R^{405}$ in Formula (4-2).

(4-3)

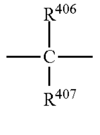

(4-4)

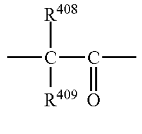

(4-5)

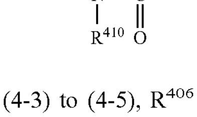

In Formulae (4-3) to (4-5), $R^{406}$ to $R^{410}$ are each independently a hydrogen atom, a substitutable alkyl group, a substitutable alkenyl group, or an organic group containing an epoxy group or a sulfonyl group. Specific examples of the substitutable alkyl group, substitutable alkenyl group, and organic group containing an epoxy group or a sulfonyl group, and preferred carbon atom numbers thereof are the same as those described above regarding $R^{404}$.

In particular, $X_{401}$ is preferably a group of Formula (4-5), from the viewpoint of achieving excellent lithographic property at high reproducibility.

At least one of $R^{404}$ and $R^{406}$ to $R^{410}$ is preferably an alkyl group wherein the terminal hydrogen atom is substituted with a vinyl group, from the viewpoint of achieving excellent lithographic property at high reproducibility.

The hydrolyzable organosilane of Formula (4-1) may be a commercially available product, or may be synthesized by a known method described in, for example, WO 2011/102470.

Specific examples of the hydrolyzable organosilane of Formula (4-1) include, but are not limited to, silanes of the following Formulae (4-1-1) to (4-1-29).

Formula (4-1-1)

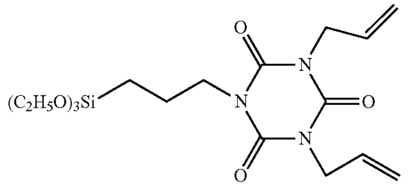

Formula (4-1-2)

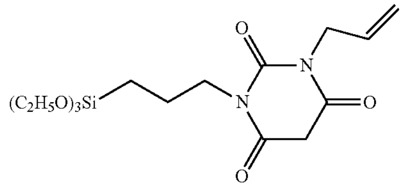

Formula (4-1-3)

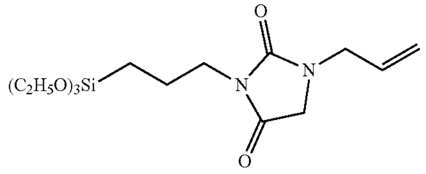

Formula (4-1-4)

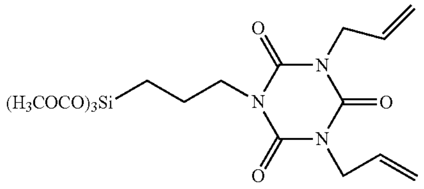

Formula (4-1-5)

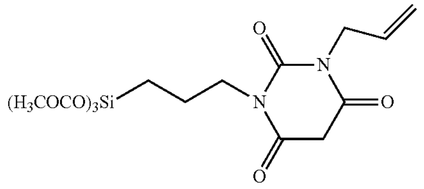

-continued

Formula (4-1-6)

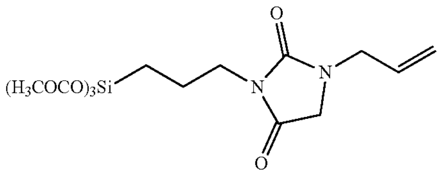

Formula (4-1-7)

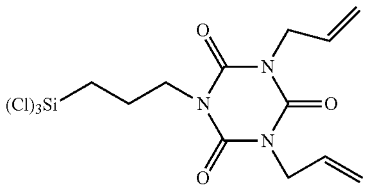

Formula (4-1-8)

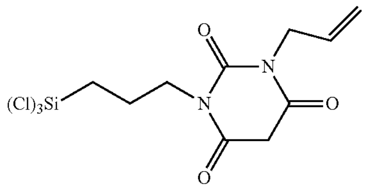

Formula (4-1-9)

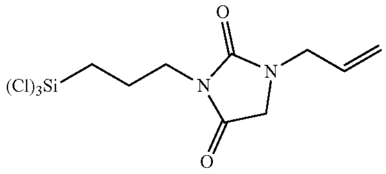

Formula (4-1-10)

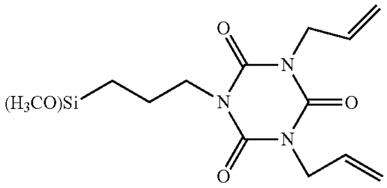

Formula (4-1-11)

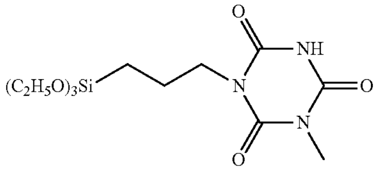

Formula (4-1-12)

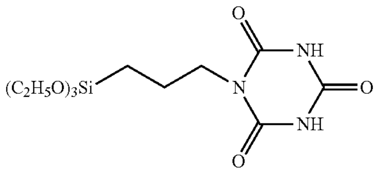

Formula (4-1-13)

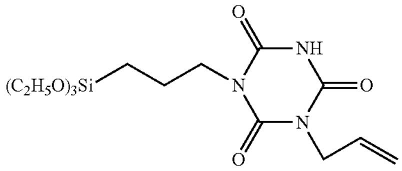

-continued
Formula (4-1-14)
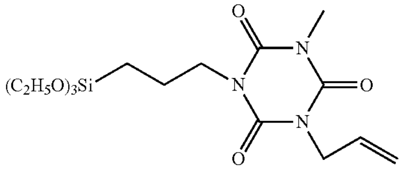
Formuula (4-1-15)
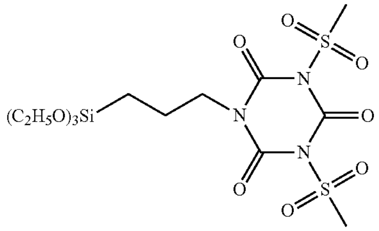
Formula (4-1-16)
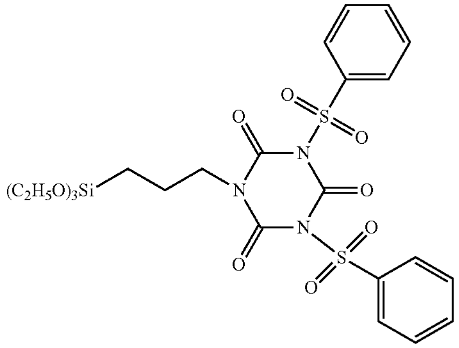
Formula (4-1-17)
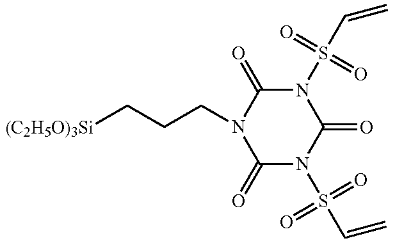
Formula (4-1-18)
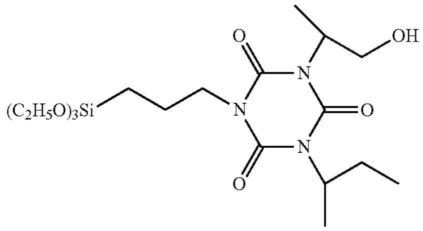
Formula (4-1-19)
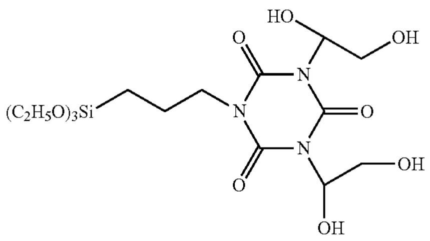
-continued
Formula (4-1-20)
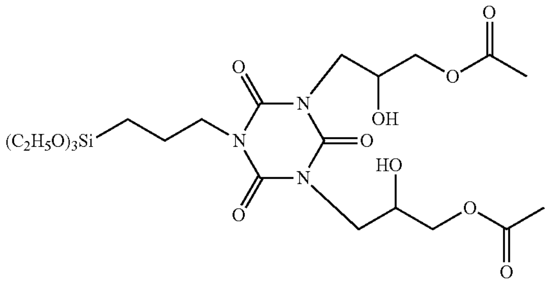
Formula (4-1-21)
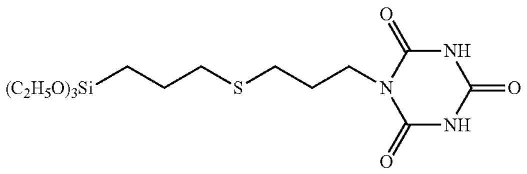
Formula (4-1-22)
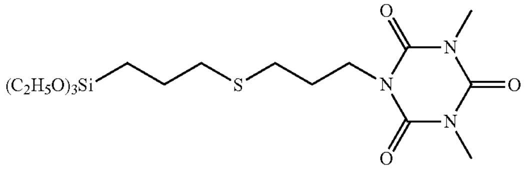
Formula (4-1-23)
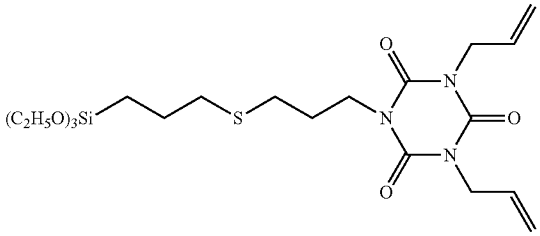
Formula (4-1-24)
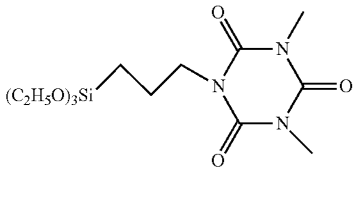
Formula (4-1-25)
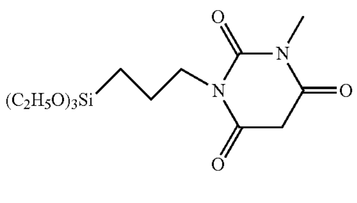

-continued

Formula (4-1-26)

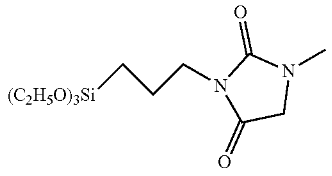

Formula (4-1-27)

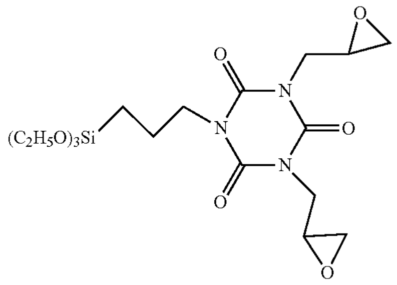

Formula (4-1-28)

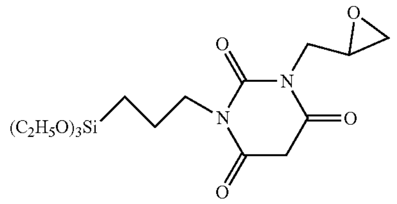

Formula (4-1-29)

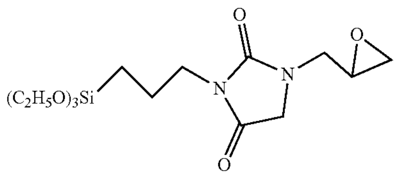

The polysiloxane [A] may be a hydrolysis condensate of a hydrolyzable silane containing a silane compound other than those exemplified above, so long as the effects of the present invention are not impaired.

As described above, the polysiloxane [A] may be a modified polysiloxane wherein at least some of silanol groups are modified. For example, the polysiloxane [A] may be a modified polysiloxane wherein some of silanol groups are modified with an alcohol, or a modified polysiloxane wherein some of silanol groups are protected with an acetal.

The modified polysiloxane may be, for example, a product prepared by reaction between a hydroxy group of an alcohol and at least some of silanol groups of the aforementioned hydrolysis condensate of hydrolyzable silane, a product prepared by dehydration reaction between the condensate and an alcohol, or a modified product prepared by protection of at least some of silanol groups of the condensate with an acetal group.

The aforementioned alcohol may be a monohydric alcohol. Examples of the monohydric alcohol include methanol, ethanol, 2-propanol, 1-butanol, 2-butanol, isobutyl alcohol, tert-butyl alcohol, 1-pentanol, 2-pentanol, 3-pentanol, 1-heptanol, 2-heptanol, tert-amyl alcohol, neopentyl alcohol, 2-methyl-1-propanol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

The aforementioned alcohol may be, for example, an alkoxy group-containing alcohol, such as 3-methoxybutanol, ethylene glycol monomethyl ether, ethylene glycol monoethyl ether, diethylene glycol monomethyl ether, diethylene glycol monoethyl ether, propylene glycol monomethyl ether (1-methoxy-2-propanol), propylene glycol monoethyl ether (1-ethoxy-2-propanol), or propylene glycol monobutyl ether (1-butoxy-2-propanol).

The reaction between silanol groups of the aforementioned condensate and hydroxy groups of the alcohol is performed by bringing the polysiloxane into contact with the alcohol. A modified polysiloxane containing capped silanol groups is prepared by performing the reaction at a temperature of 40 to 160° C. (e.g., 60° C.) for 0.1 to 48 hours (e.g., 24 hours). In this case, the alcohol serving as a capping agent may be used as a solvent in the composition containing the polysiloxane.

The product by dehydration reaction between the polysiloxane (containing the hydrolysis condensate of hydrolyzable silane) and the alcohol can be produced by reacting the polysiloxane with the alcohol in the presence of an acid serving as a catalyst to thereby cap silanol groups with the alcohol, and then removing water generated through the dehydration to the outside of the reaction system.

The aforementioned acid may be an organic acid having an acid dissociation constant (pka) of −1 to 5, preferably 4 to 5. Examples of the acid include trifluoroacetic acid, maleic acid, benzoic acid, isobutyric acid, and acetic acid. In particular, benzoic acid, isobutyric acid, or acetic acid may be used.

The aforementioned acid may be an acid having a boiling point of 70 to 160° C. Examples of the acid include trifluoroacetic acid, isobutyric acid, acetic acid, and nitric acid.

Preferably, the aforementioned acid has either an acid dissociation constant (pka) of 4 to 5 or a boiling point of 70 to 160° C. Thus, the acid to be used may be an acid having a weak acidity or having a strong acidity and a low boiling point.

Either of these properties (acid dissociation constant and boiling point) of the acid may be utilized.

The acetal protection of silanol groups of the aforementioned condensate can be performed with a vinyl ether; for example, a vinyl ether of the following Formula (5). Such a reaction can be performed to introduce a partial structure of the following Formula (6) into the polysiloxane.

Formula (5)

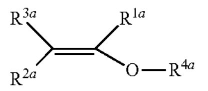

In Formula (5), $R^{1a}$, $R^{2a}$, and $R^{3a}$ are each a hydrogen atom or a $C_{1-10}$ alkyl group; $R^{4a}$ is a $C_{1-10}$ alkyl group; and Ra and $R^{4a}$ may be bonded together to form a ring. Examples of the alkyl group are the same as those described above.

Formula (6)

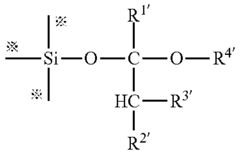

In Formula (6), $R^{1'}$, $R^{2'}$, and $R^{3'}$ are each a hydrogen atom or a $C_{1-10}$ alkyl group; $R^{4'}$ is a $C_{1-10}$ alkyl group; and $R^{2'}$ and $R^{4'}$ may be bonded together to form a ring. In Formula (6), * is a bond to the adjacent atom. The adjacent atom is, for example, an oxygen atom of a siloxane bond, an oxygen atom of a silanol group, or a carbon atom derived from $R^1$ of Formula (1). Examples of the alkyl group are the same as those described above.

Examples of the vinyl ether of Formula (5) include aliphatic vinyl ether compounds, such as methyl vinyl ether, ethyl vinyl ether, isopropyl vinyl ether, normal butyl vinyl ether, 2-ethylhexyl vinyl ether, tert-butyl vinyl ether, and cyclohexyl vinyl ether; and cyclic vinyl ether compounds, such as 2,3-dihydrofuran, 4-methyl-2,3-dihydrofuran, and 3,4-dihydro-2H-pyran. In particular, ethyl vinyl ether, propyl vinyl ether, butyl vinyl ether, ethylhexyl vinyl ether, cyclohexyl vinyl ether, 3,4-dihydro-2H-pyran, or 2,3-dihydrofuran is preferably used.

The aforementioned acetal protection of silanol groups can be performed by using the polysiloxane, the aforementioned vinyl ether, an aprotic solvent such as propylene glycol monomethyl ether acetate, ethyl acetate, dimethylformamide, tetrahydrofuran, or 1,4-dioxane, and a catalyst such as pyridium p-toluenesulfonate, trifluoromethanesulfonic acid, p-toluenesulfonic acid, methanesulfonic acid, hydrochloric acid, or sulfuric acid.

The capping of silanol groups with an alcohol or the acetal protection of silanol groups may be performed simultaneously with the hydrolysis and condensation of the hydrolyzable silane described below.

In one preferred embodiment of the present invention, the polysiloxane [A] contains at least one of a hydrolysis condensate of a hydrolyzable silane containing a hydrolyzable silane of Formula (1) and, if desired, a hydrolyzable silane of Formula (2) and an additional hydrolyzable silane, and a modified product of the hydrolysis condensate.

In one preferred embodiment, the polysiloxane [A] contains a product prepared by dehydration reaction between the aforementioned hydrolysis condensate and an alcohol.

The aforementioned hydrolysis condensate of hydrolyzable silane (which may contain a modified product) may have a weight average molecular weight of, for example, 500 to 1,000,000. From the viewpoint of, for example, preventing the precipitation of the hydrolysis condensate in the composition, the weight average molecular weight is preferably 500,000 or less, more preferably 250,000 or less, still more preferably 100,000 or less. From the viewpoint of, for example, the compatibility between storage stability and applicability, the weight average molecular weight is preferably 700 or more, more preferably 1,000 or more.

The weight average molecular weight is determined by GPC analysis in terms of polystyrene. The GPC analysis can be performed under, for example, the following conditions: GPC apparatus (trade name: HLC-8220GPC, available from Tosoh Corporation), GPC columns (trade name: Shodex (registered trademark) KF803L, KF802, and KF801, available from Showa Denko K.K.), a column temperature of 40° C., tetrahydrofuran serving as an eluent (elution solvent), a flow amount (flow rate) of 1.0 m/min, and polystyrene (available from Showa Denko K.K.) as a standard sample.

The aforementioned hydrolysis condensate of hydrolyzable silane is prepared by hydrolysis and condensation of the aforementioned silane compound (hydrolyzable silane).

The aforementioned silane compound (hydrolyzable silane) contains an alkoxy group, aralkyloxy group, acyloxy group, or halogen atom directly bonded to the silicon atom; i.e., an alkoxysilyl group, an aralkyloxysilyl group, an acyloxysilyl group, or a halogenated silyl group (hereinafter such a group may be referred to as "hydrolyzable group").

For the hydrolysis of the hydrolyzable group, generally 0.1 to 100 mol, for example, 0.5 to 100 mol (preferably 1 to 10 mol) of water is used per mol of the hydrolyzable group.

A hydrolysis catalyst may be used during the hydrolysis and condensation for the purpose of, for example, promoting the reaction. Alternatively, the hydrolysis and condensation may be performed without use of a hydrolysis catalyst. When a hydrolysis catalyst is used, the amount of the hydrolysis catalyst is generally 0.0001 to 10 mol, preferably 0.001 to 1 mol per mol of the hydrolyzable group.

The reaction temperature for the hydrolysis and condensation is generally equal to or higher than room temperature and equal to or lower than the reflux temperature (at ambient pressure) of an organic solvent usable for the hydrolysis. The reaction temperature may be, for example, 20 to 110° C., or, for example, 20 to 80° C.

The hydrolysis may be performed completely; i.e., all hydrolyzable groups may be converted into silanol groups, or may be performed partially; i.e., unreacted hydrolyzable groups may remain.

Examples of the hydrolysis catalyst usable for the hydrolysis and condensation include a metal chelate compound, an organic acid, an inorganic acid, an organic base, and an inorganic base.

Examples of the metal chelate compound serving as a hydrolysis catalyst include, but are not limited to, titanium chelate compounds, such as triethoxy-mono(acetylacetonato)titanium, tri-n-propoxy-mono(acetylacetonato)titanium, tri-i-propoxy-mono(acetylacetonato)titanium, tri-n-butoxy-mono(acetylacetonato)titanium, tri-sec-butoxy-mono(acetylacetonato)titanium, tri-t-butoxy-mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy-bis(acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy-tris(acetylacetonato)titanium, mono-i-propoxy-tris(acetylacetonato)titanium, mono-n-butoxy-tris(acetylacetonato)titanium, mono-sec-butoxy-tris(acetylacetonato)titanium, mono-t-butoxy-tris(acetylacetonato)titanium, tetrakis(acetylacetonato)titanium, triethoxy-mono(ethylacetoacetato)titanium, tri-n-propoxy-mono(ethylacetoacetato)titanium, tri-i-propoxy-mono(ethylacetoacetato)titanium, tri-n-butoxy-mono(ethylacetoacetato)titanium, tri-sec-butoxy-mono(ethylacetoacetato)titanium, tri-t-butoxy-mono(ethylacetoacetato)titanium, diethoxy-bis(ethylacetoacetato)titanium, di-n-propoxy-bis(ethylacetoacetato)titanium, di-i-propoxy-bis(ethylacetoacetato)titanium, di-n-butoxy-bis(ethylacetoacetato)titanium, di-sec-butoxy-bis(ethylacetoacetato)titanium, di-t-butoxy-bis(ethylacetoacetato)titanium, monoethoxy-tris(ethylacetoacetato)titanium, mono-n-propoxy-tris(ethylacetoacetato)titanium, mono-i-propoxy-tris (ethylacetoacetato)titanium, mono-n-butoxy-tris(ethylacetoacetato)titanium, mono-sec-butoxy-tris(ethylacetoacetato)titanium, mono-t-butoxy-tris(ethylacetoacetato)titanium, tetrakis(ethylacetoacetato)titanium, mono(acetylacetonato)tris(ethylacetoacetato)titanium, bis(acetylacetonato)bis(ethylacetoacetato)titanium, and tris(acetylacetonato)mono(ethylacetoacetato)titanium; zirconium chelate compounds, such as triethoxy-mono(acetylacetonato)zirconium, tri-n-propoxy-mono(acetylacetonato)zirconium, tri-i-propoxy-mono(acetylacetonato)zirconium, tri-n-butoxy-mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetato)zirconium, tri-n-propoxy-mono(ethylacetoacetato)zirconium, tri-i-propoxy-mono(ethylacetoacetato)zirconium, tri-n-butoxy-mono(ethylacetoacetato)zirconium, tri-sec-butoxy-mono(ethylacetoacetato)zirconium, tri-t-butoxy-mono(ethylacetoacetato)zirconium, diethoxy-bis(ethylacetoacetato)zirconium, di-n-propoxy-bis(ethylacetoacetato)zirconium, di-i-propoxy-bis(ethylacetoacetato)zirconium, di-n-butoxy-bis(ethylacetoacetato)zirconium, di-sec-butoxy-bis(ethylacetoacetato)zirconium, di-t-butoxy-bis(ethylacetoacetato)zirconium, monoethoxy-tris(ethylacetoacetato)zirconium, mono-n-propoxy-tris(ethylacetoacetato)zirconium, mono-i-propoxy-tris(ethylacetoacetato)zirconium, mono-n-butoxy-tris(ethylacetoacetato)zirconium, mono-sec-butoxy-tris(ethylacetoacetato)zirconium, mono-t-butoxy-tris(ethylacetoacetato)zirconium, tetrakis(ethylacetoacetato)zirconium, mono(acetylacetonato)tris(ethylacetoacetato)zirconium, bis(acetylacetonato)bis(ethylacetoacetato)zirconium, and tris(acetylacetonato)mono(ethylacetoacetato)zirconium; and aluminum chelate compounds, such as tris(acetylacetonato)aluminum and tris(ethylacetoacetato)aluminum.

Examples of the organic acid serving as a hydrolysis catalyst include, but are not limited to, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid serving as a hydrolysis catalyst include, but are not limited to, hydrochloric acid, nitric acid, sulfuric acid, hydrofluoric acid, and phosphoric acid.

Examples of the organic base serving as a hydrolysis catalyst include, but are not limited to, pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, trimethylphenylammonium hydroxide, benzyltrimethylammonium hydroxide, and benzyltriethylammonium hydroxide.

Examples of the inorganic base serving as a hydrolysis catalyst include, but are not limited to, ammonia, sodium hydroxide, potassium hydroxide, barium hydroxide, and calcium hydroxide.

Among these catalysts, a metal chelate compound, an organic acid, or an inorganic acid is preferred. These catalysts may be used alone or in combination of two or more species.

In particular, nitric acid can be suitably used as a hydrolysis catalyst in the present invention. The use of nitric acid enables an improvement in the storage stability of a reaction mixture after the hydrolysis and condensation, and particularly enables suppression of a change in the molecular weight of a hydrolysis condensate. It is known that the stability of the hydrolysis condensate contained in the reaction mixture depends on the pH of the mixture. The present inventors have conducted extensive studies, and as a result have found that the pH of the reaction mixture falls in a stable range by use of an appropriate amount of nitric acid.

As described above, nitric acid can also be used for preparation of a modified product of the hydrolysis condensate; for example, for capping of silanol groups with an alcohol. Thus, nitric acid is preferred from the viewpoint that it can contribute to the hydrolysis and condensation of the hydrolyzable silane, as well as the capping reaction of the hydrolysis condensate with an alcohol.

An organic solvent may be used for the hydrolysis and condensation. Specific examples of the organic solvent include, but are not limited to, aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, and n-amylnaphthalene; monohydric alcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, n-heptanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, and glycerin; ketone solvents, such as acetone, methyl ethyl ketone, methyl-n-propyl ketone, methyl-n-butyl ketone, diethyl ketone, methyl-1-butyl ketone, methyl-n-pentyl ketone, ethyl-n-butyl ketone, methyl-n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether (1-methoxy-2-propanol), propylene glycol monoethyl ether (1-ethoxy-2-propanol), propylene glycol monopropyl ether, propylene glycol monobutyl ether, propylene glycol monomethyl ether acetate (1-methoxy-2-propanol monoacetate), dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethylene glycol diacetate, triethylene glycol methyl ether acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methyl-2-pyrrolidone; and sulfur-containing solvents, such as dimethyl sulfide, diethyl sulfide, thiophene, tetrahydrothiophene, dimethyl sulfoxide, sulfolane, and 1,3-propanesultone. These solvents may be used alone or in combination of two or more species.

After completion of the hydrolysis and condensation reactions, the reaction mixture is used as is, or diluted or concentrated. The resultant reaction mixture can be neutralized or treated with an ion-exchange resin, to thereby remove the hydrolysis catalyst (e.g., an acid or a base) used for the hydrolysis and condensation. Before or after such a treatment, alcohols (i.e., by-products), water, the used hydrolysis catalyst, etc. can be removed from the reaction mixture through, for example, distillation under reduced pressure.

The thus-prepared hydrolysis condensate (hereinafter may be referred to as "polysiloxane") is in the form of a polysiloxane varnish dissolved in an organic solvent. The polysiloxane varnish may be used as is for preparation of the resist underlayer film-forming composition described below. Thus, the aforementioned reaction mixture may be used as is (or may be diluted) for preparation of the resist underlayer film-forming composition. In this case, the hydrolysis catalyst used for the hydrolysis and condensation, by-products, etc. may remain in the reaction mixture, so long as the effects of the present invention are not impaired. For example, nitric acid used as a hydrolysis catalyst or used for capping of silanol groups with an alcohol may remain in the polymer varnish in an amount of about 100 ppm to 5,000 ppm.

The resultant polysiloxane varnish may be subjected to solvent replacement, or may be appropriately diluted with a solvent. If the resultant polysiloxane varnish does not exhibit poor storage stability, the organic solvent may be distilled off to thereby achieve a solid content concentration of 100%.

The organic solvent used for the solvent replacement or dilution of the polysiloxane varnish may be identical to or different from the organic solvent used for the hydrolysis and condensation reactions of the hydrolyzable silane. No particular limitation is imposed on the type of the solvent for dilution, and one solvent or two or more solvents may be arbitrarily selected and used.

[B] Nitric Acid

The silicon-containing resist underlayer film-forming composition of the present invention contains nitric acid [B].

Nitric acid [B] may be added during preparation of the silicon-containing resist underlayer film-forming composition, or may be used as a hydrolysis catalyst or used for capping of silanol groups with an alcohol in the production of the aforementioned polysiloxane, and may remain in the resultant polysiloxane varnish. The nitric acid remaining in the polysiloxane varnish may be regarded as nitric acid [B].

The amount of the aforementioned nitric acid [B] (amount of residual nitric acid) may be, for example, 0.0001% by mass to 1% by mass, or 0.001% by mass to 0.1% by mass, or 0.005% by mass to 0.05% by mass relative to the total mass of the silicon-containing resist underlayer film-forming composition.

[C] Bisphenol Compound

No particular limitation is imposed on the bisphenol compound [C] used in the present invention, and one example of the compound is a bisphenol sulfone compound.

Examples of the bisphenol sulfone compound include, but are not limited to, bisphenol sulfones (may be referred to as "bisphenol S") or bisphenol S derivatives of the following Formulae (C-1) to (C-23).

Formula (C-1)

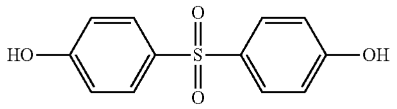

Formula (C-2)

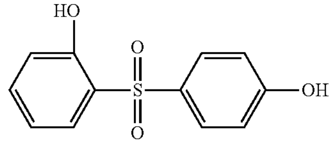

Formula (C-3)

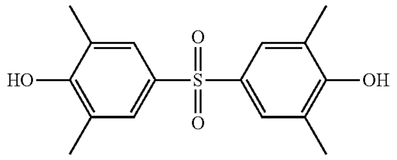

-continued
Formula (C-4)
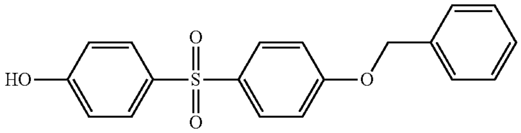
Formula (C-5)
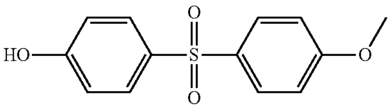
Formula (C-6)
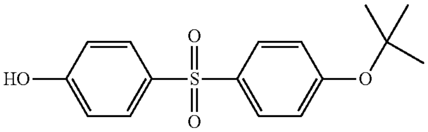
Formula (C-7)
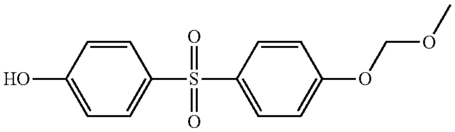
Formula (C-8)
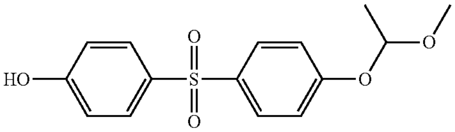
Formula (C-9)
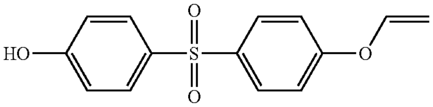
Formula (C-10)
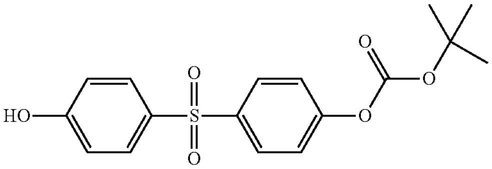
Formula (C-11)
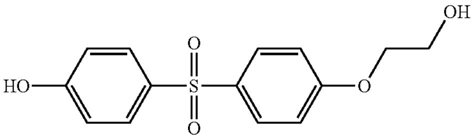
Formula (C-12)
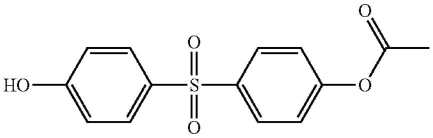
Formula (C-13)
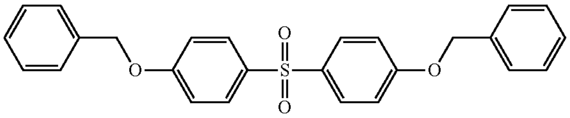
-continued
Formula (C-14)
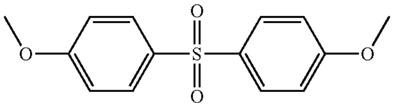
Formula (C-15)
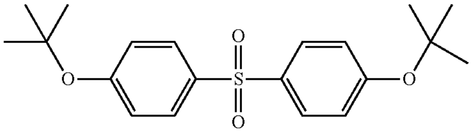
Formula (C-16)
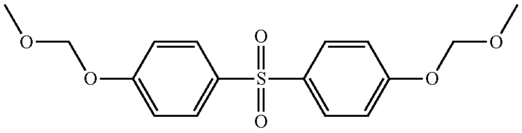
Formula (C-17)
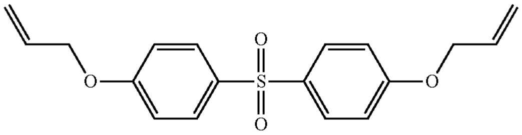
Formula (C-18)
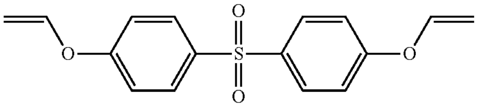
Formula (C-19)
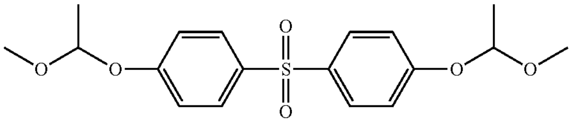
Formula (C-20)
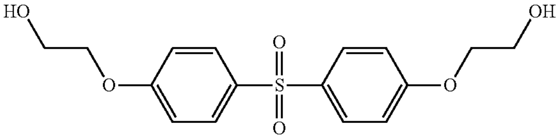
Formula (C-21)
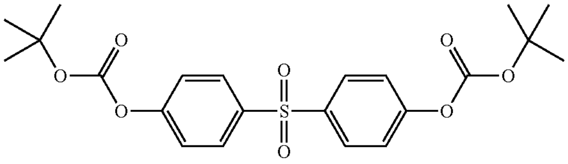
Formula (C-22)
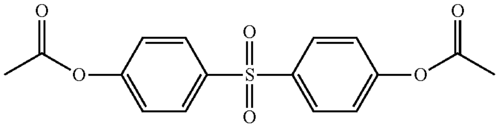
Formula (C-23)
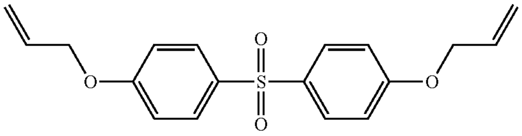

The amount of the aforementioned bisphenol compound [C] may be, for example, 0.01% by mass to 30% by mass, or 0.01% by mass to 20% by mass, or 0.01% by mass to 10% by mass relative to the total mass of the silicon-containing resist underlayer film-forming composition.

[D] Solvent

No particular limitation is imposed on the solvent [D] used in the silicon-containing resist underlayer film-forming composition of the present invention, so long as the solvent can dissolve and mix the aforementioned polysiloxane [A], nitric acid [B], bisphenol compound [C] and additional components described below.

Specific examples of the solvent [D] include methylcellosolve acetate, ethylcellosolve acetate, propylene glycol, propylene glycol monomethyl ether (1-methoxy-2-propanol), propylene glycol monoethyl ether (1-ethoxy-2-propanol), methyl isobutyl carbinol, propylene glycol monobutyl ether, propylene glycol monomethyl ether acetate (1-methoxy-2-propanol monoacetate), propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol mooethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methybutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methyl-2-pyrrolidone, 4-methyl-2-pentanol, and γ-butyrolactone. These solvents may be used alone or in combination of two or more species.

The silicon-containing resist underlayer film-forming composition of the present invention may contain water as a solvent. When the composition contains water as a solvent, the amount of water is, for example, 30% by mass or less, preferably 20% by mass or less, more preferably 15% by mass or less, relative to the total mass of the solvents contained in the composition.

[Silicon-Containing Resist Underlayer Film-Forming Composition]

The silicon-containing resist underlayer film-forming composition of the present invention contains the aforementioned polysiloxane [A], nitric acid [B], bisphenol compound [C], and solvent [D], and may further contain an additional component described below.

The concentration of the solid content in the resist underlayer film-forming composition may be, for example, 0.1 to 50% by mass, 0.1 to 30% by mass, 0.1 to 25% by mass, or 0.5 to 20.0% by mass, relative to the total mass of the composition. The "solid content" as described above refers to all components (except for the solvent [D] component) contained in the composition.

The amount of the polysiloxane [A] in the solid content is generally 20% by mass or more and less than 100% by mass. From the viewpoint of, for example, achieving the aforementioned effects of the present invention at high reproducibility, the lower limit of the amount of the polysiloxane [A] is preferably 50% by mass, more preferably 60% by mass, still more preferably 70% by mass, much more preferably 80% by mass, and the upper limit of the amount is preferably 99% by mass. The balance may be an additive described below.

The resist underlayer film-forming composition preferably has a pH of 2 to 5, more preferably a pH of 3 to 4.

The resist underlayer film-forming composition can be produced by mixing of the aforementioned polysiloxane [A], nitric acid [B], bisphenol compound [C], and solvent [D] and, as appropriate, an additional component (if incorporated). In this case, a solution containing the polysiloxane [A] may be previously prepared, and the solution may be mixed with nitric acid [B], the bisphenol compound [C], the solvent [D], and an additional component. The reaction mixture produced during preparation of the polysiloxane [A] may be used as is for preparation of the resist underlayer film-forming composition. In this case, nitric acid [B] or the bisphenol compound [C] may be added during production of the polysiloxane.

No particular limitation is imposed on the order of mixing of these components. For example, nitric acid [B], the bisphenol compound [C], and the solvent [D] may be added to and mixed with a solution containing the polysiloxane [A], and an additional component may be added to the resultant mixture. Alternatively, a solution containing the polysiloxane [A], nitric acid [B], the bisphenol compound [C], the solvent [D], and an additional component may be mixed simultaneously.

If necessary, the solvent [D] may be finally added, or some components that can be relatively easily dissolved in the solvent [D] may be finally added without being incorporated into the mixture. However, from the viewpoint of preventing aggregation or separation of components to prepare a highly homogeneous composition with high reproducibility, the composition is preferably produced from a previously prepared solution containing the well-dissolved polysiloxane [A]. It should be noted that the polysiloxane [A] may be aggregated or precipitated when mixed with nitric acid [B], the bisphenol compound [C], the solvent [D], or an additional component, depending on, for example, the type or amount of nitric acid [B], the bisphenol compound [C], or the solvent [D], or the amount or nature of the component. It should also be noted that when a composition is prepared from a solution containing the polysiloxane [A], the concentration of the solution of the polysiloxane [A] or the amount of the solution used must be determined so as to achieve a desired amount of the polysiloxane [A] contained in the finally produced composition.

During preparation of the composition, the composition may be appropriately heated so long as the components are not decomposed or denatured.

In the present invention, the resist underlayer film-forming composition may be filtered with, for example, a submicrometer-order filter during production of the composition or after mixing of all the components. No limitation is imposed on the type of the material of the filter used. For example, a nylon-made filter or a fluororesin-made filter may be used.

The silicon-containing resist underlayer film-forming composition of the present invention can be suitably used as a composition for forming a resist underlayer film used for a lithographic process.

[Additional Additive]

The silicon-containing resist underlayer film-forming composition of the present invention may contain various additives depending on the intended use of the composition.

Examples of the additives include known additives incorporated in materials (compositions) for forming various films (e.g., resist underlayer film, anti-reflective coating, and pattern reversing film) that can be used in the production of a semiconductor device, such as a curing catalyst (e.g., an ammonium salt, a phosphine compound, a phosphonium salt, a sulfonium salt, or a nitrogen-containing silane compound), a crosslinking agent, a crosslinking catalyst, a stabilizer (e.g., an organic acid, water, or an alcohol), an organic polymer compound, an acid generator, a surfactant (e.g., a nonionic surfactant, an anionic surfactant, a cationic surfactant, a silicon-containing surfactant, a fluorine-containing surfactant, or a UV-curable surfactant), a pH adjuster, a metal oxide, a rheology controlling agent, and an adhesion aid.

Examples of various additives include, but are not limited to, those described below.

<Curing Catalyst>

The silicon-containing resist underlayer film-forming composition of the present invention may contain no curing catalyst. Alternatively, the composition may contain a curing catalyst.

The aforementioned curing catalyst may be, for example, an ammonium salt, a phosphine compound, a phosphonium salt, or a sulfonium salt. The salt described below as an example of a curing catalyst may be added in the form of a salt, or may be a compound that forms a salt in the aforementioned composition (i.e., a compound that forms a salt in the reaction system, but is in a form different from the salt during addition).

Examples of the ammonium salt include:

a quaternary ammonium salt having a structure of the following Formula (D-1):

Formula (D-1)

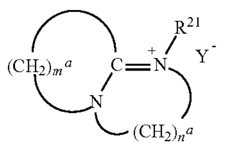

(wherein $m^a$ is an integer of 2 to 11; $n^a$ is an integer of 2 or 3; $R^{21}$ is an alkyl group or an aryl group; and $Y^-$ is an anion);

a quaternary ammonium salt having a structure of the following Formula (D-2):

Formula (D-2)

$$R^{22}R^{23}R^{24}R^{25}N^+ \ Y^-$$

(wherein $R^{22}$, $R^{23}$, $R^{24}$, and $R^{25}$ are each an alkyl group or an aryl group; N is a nitrogen atom; $Y^-$ is an anion; and each of $R^{22}$, $R^{23}$, $R^{24}$, and $R^{25}$ is bonded to the nitrogen atom);

a quaternary ammonium salt having a structure of the following Formula (D-3):

Formula (D-3)

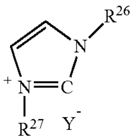

(wherein $R^{26}$ and $R^{27}$ are each an alkyl group or an aryl group; N is a nitrogen atom; and $Y^-$ is an anion);

a quaternary ammonium salt having a structure of the following Formula (D-4):

Formula (D-4)

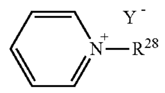

(wherein $R^{28}$ is an alkyl group or an aryl group; N is a nitrogen atom; and $Y^-$ is an anion);

a quaternary ammonium salt having a structure of the following Formula (D-5):

Formula (D-5)

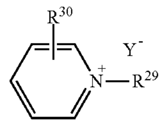

(wherein $R^{29}$ and $R^{30}$ are each an alkyl group or an aryl group; N is a nitrogen atom; and $Y^-$ is an anion); and a tertiary ammonium salt having a structure of the following Formula (D-6):

Formula (D-6)

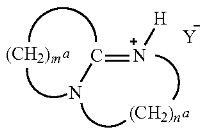

(wherein $m^a$ is an integer of 2 to 11; $n^a$ is an integer of 2 or 3; H is a hydrogen atom; N is a nitrogen atom; and $Y^-$ is an anion).

Examples of the phosphonium salt include a quaternary phosphonium salt of the following Formula (D-7):

Formula (D-7)

$$R^{31}R^{32}R^{33}R^{34}P^{+}\ Y^{-}$$

(wherein $R^{31}$, $R^{32}$, $R^{33}$, and $R^{34}$ are each an alkyl group or an aryl group; P is a phosphorus atom; $Y^-$ is an anion; and each of $R^{31}$, $R^{32}$, $R^{33}$, and $R^{34}$ is bonded to the phosphorus atom).

Examples of the sulfonium salt include a tertiary sulfonium salt of the following Formula (D-8):

Formula (D-8)

$$R^{35}R^{36}R^{33}R^{37}S^{+}\ Y^{-}$$

(wherein $R^{35}$, $R^{36}$, and $R^{37}$ are each an alkyl group or an aryl group; S is a sulfur atom; $Y^-$ is an anion; and each of $R^{35}$, $R^{36}$, and $R^{37}$ is bonded to the sulfur atom).

The compound of Formula (D-1) is a quaternary ammonium salt derived from an amine. In Formula (D-1), $m^a$ is an integer of 2 to 11, and $n^a$ is an integer of 2 or 3. $R^2$ of the quaternary ammonium salt is a $C_{1-18}$ (preferably $C_{2-10}$) alkyl group, or a $C_{6-18}$ aryl group. Examples thereof include linear alkyl groups, such as ethyl group, propyl group, and butyl group, benzyl group, cyclohexyl group, cyclohexylmethyl group, and dicyclopentadienyl group. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$).

The compound of Formula (D-2) is a quaternary ammonium salt having a structure of $R^{22}R^{23}R^{24}R^{25}N^+Y^-$. $R^{22}$, $R^{23}$, $R^{24}$, and $R^{25}$ of the quaternary ammonium salt are each a $C_{1-18}$ alkyl group or a $C_{6-18}$ aryl group. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). The quaternary ammonium salt is commercially available, and examples of the quaternary ammonium salt include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from 1-substituted imidazole. The carbon atom number of each of $R^{26}$ and $R^{27}$ is 1 to 18, and the total number of carbon atoms of $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound may be produced through, for example, reaction between an imidazole compound (e.g., 1-methylimidazole or 1-benzylimidazole) and an alkyl halide or an aryl halide (e.g., benzyl bromide or methyl bromide).

The compound of Formula (D-4) is a quaternary ammonium salt derived from pyridine. In Formula (D-4), $R^{28}$ is a $C_{1-18}$ (preferably $C_{4-18}$) alkyl group, or a $C_{6-18}$ aryl group. Examples thereof include butyl group, octyl group, benzyl group, and lauryl group. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound may be produced through, for example, reaction between pyridine and an alkyl halide or an aryl halide, such as lauryl chloride, benzyl chloride, benzyl bromide, methyl bromide, or octyl bromide. Examples of this compound include N-laurylpyridinium chloride and N-benzylpyridinium bromide.

The compound of Formula (D-5) is a quaternary ammonium salt derived from a substituted pyridine, such as picoline. In Formula (D-5), $R^{29}$ is a $C_{1-18}$ (preferably $C_{4-18}$) alkyl group, or a $C_{6-18}$ aryl group. Examples thereof include methyl group, octyl group, lauryl group, and benzyl group. $R^{30}$ is a $C_{1-18}$ alkyl group or a $C_{6-18}$ aryl group, and, for example, $R^{30}$ is a methyl group when the compound is a quaternary ammonium salt derived from picoline. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). Although this compound is commercially available, the compound may be produced through, for example, reaction between a substituted pyridine (e.g., picoline) and an alkyl halide or an aryl halide, such as methyl bromide, octyl bromide, lauryl chloride, benzyl chloride, or benzyl bromide. Examples of this compound include N-benzylpicolinium chloride, N-benzylpicolinium bromide, and N-laurylpicolinium chloride.

The compound of Formula (D-6) is a tertiary ammonium salt derived from an amine. In Formula (D-6), $m^a$ is an integer of 2 to 11, and $n^a$ is an integer of 2 or 3. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). The compound may be produced through, for example, reaction between an amine and a weak acid, such as a carboxylic acid or phenol. Examples of the carboxylic acid include formic acid and acetic acid. When formic acid is used, the anion ($Y^-$) is ($HCOO^-$). When acetic acid is used, the anion ($Y^-$) is ($CH_3COO^-$). When phenol is used, the anion ($Y^-$) is ($C_6H_5O^-$).

The compound of Formula (D-7) is a quaternary phosphonium salt having a structure of $R^{31}R^{32}R^{33}R^{34}P^+Y^-$. $R^{31}$, $R^{32}$, $R^{33}$, and $R^{34}$ are each a $C_{1-18}$ alkyl group or a $C_{6-18}$ aryl group. Three of the four substituents $R^{31}$ to $R^{34}$ are preferably a phenyl group or a substituted phenyl group, such as a phenyl group or a tolyl group. The remaining one substituent is a $C_{1-18}$ alkyl group or a $C_{6-18}$ aryl group. Examples of the anion ($Y^-$) include halide ions, such as chlorine ion ($Cl^-$), bromine ion ($Br^-$), and iodine ion ($I^-$); and acid groups, such as carboxylate (—$COO^-$), sulfonate (—$SO_3^-$), and alcoholate (—$O^-$). This compound is commercially available, and examples of the compound include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; triphenylbenzylphosphonium halides; tetraphenylphosphonium halides; tritolylmonoarylphosphonium halides; or tritolylmonoalkylphosphonium halides (wherein the halogen atom is a chlorine atom or a bromine atom). Particularly preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of the phosphine compound include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of Formula (D-8) is a tertiary sulfonium salt having a structure of $R^{35}R^{36}R^{37}S^{+}Y^{-}$. $R^{35}$, $R^{36}$, and $R^{37}$ are each a $C_{1-18}$ alkyl group or a $C_{6-18}$ aryl group. Two of the three substituents $R^{35}$ to $R^{37}$ are preferably a phenyl group or a substituted phenyl group, such as a phenyl group or a tolyl group. The remaining one substituent is a $C_{1-18}$ alkyl group or a $C_{6-18}$ aryl group. Examples of the anion ($Y^{-}$) include halide ions, such as chlorine ion ($Cl^{-}$), bromine ion ($Br^{-}$), and iodine ion ($I^{-}$); and acid groups, such as carboxylate ($—COO^{-}$), sulfonate ($—SO_3^{-}$), alcoholate ($—O^{-}$), maleate anion, and nitrate anion. This compound is commercially available, and examples of the compound include trialkylsulfonium halides, such as tri-n-butylsulfonium halides and tri-n-propylsulfonium halides; dialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); trialkylsulfonium carboxylates, such as tri-n-butylsulfonium carboxylate and tri-n-propylsulfonium carboxylate; dialkylbenzylsulfonium carboxylates, such as diethylbenzylsulfonium carboxylate; diphenylmonoalkylsulfonium carboxylates, such as diphenylmethylsulfonium carboxylate and diphenylethylsulfonium carboxylate; and triphenylsulfonium carboxylate. Triphenylsulfonium halides and triphenylsulfonium carboxylate are preferably used.

In the present invention, a nitrogen-containing silane compound may be added as a curing catalyst. Examples of the nitrogen-containing silane compound include silane compounds containing an imidazole ring, such as N-(3-triethoxysilylpropyl)-4,5-dihydroimidazole.

When a curing catalyst is used, the amount of the curing catalyst is 0.01 parts by mass to 10 parts by mass, or 0.01 parts by mass to 5 parts by mass, or 0.01 parts by mass to 3 parts by mass relative to 100 parts by mass of the polysiloxane [A].

<Stabilizer>

The stabilizer may be incorporated for the purpose of, for example, stabilization of the aforementioned hydrolysis condensate of the hydrolyzable silane mixture. Specific examples of the stabilizer that may be incorporated include an organic acid, water, an alcohol, or any combination of these.

Examples of the organic acid include oxalic acid, malonic acid, methylmalonic acid, succinic acid, maleic acid, malic acid, tartaric acid, phthalic acid, citric acid, glutaric acid, lactic acid, and salicylic acid. Of these, oxalic acid or maleic acid is preferred. When an organic acid is incorporated, the amount thereof is 0.1 to 5.0% by mass relative to the mass of the aforementioned hydrolysis condensate of the hydrolyzable silane mixture. Such an organic acid may also serve as a pH adjuster.

The water may be, for example, pure water, ultrapure water, or ion-exchange water. When water is used, the amount thereof may be 1 part by mass to 20 parts by mass relative to 100 parts by mass of the resist underlayer film-forming composition.

The alcohol is preferably an alcohol that easily evaporates (volatilizes) by heating after application of the composition. Examples of the alcohol include methanol, ethanol, propanol, i-propanol, and butanol. When an alcohol is incorporated, the amount thereof may be 1 part by mass to 20 parts by mass relative to 100 parts by mass of the resist underlayer film-forming composition.

<Organic Polymer>

Incorporation of the aforementioned organic polymer compound into the resist underlayer film-forming composition enables adjustment of, for example, the dry etching rate (the amount of reduction in film thickness per unit time), attenuation coefficient, or refractive index of a film (resist underlayer film) formed from the composition. No particular limitation is imposed on the organic polymer compound, and it is appropriately selected from among various organic polymers (polycondensation polymer and addition polymerization polymer) depending on the purpose of addition thereof.

Specific examples of the organic polymer compound include addition polymerization polymers and polycondensation polymers, such as polyester, polystyrene, polyimide, acrylic polymer, methacrylic polymer, polyvinyl ether, phenol novolac, naphthol novolac, polyether, polyamide, and polycarbonate.

In the present invention, an organic polymer having an aromatic or heteroaromatic ring that functions as a light-absorbing moiety (e.g., a benzene ring, a naphthalene ring, an anthracene ring, a triazine ring, a quinoline ring, or a quinoxaline ring) can also be suitably used in the case where such a function is required. Specific examples of such an organic polymer compound include, but are not limited to, addition polymerization polymers containing, as structural units, addition polymerizable monomers (e.g., benzyl acrylate, benzyl methacrylate, phenyl acrylate, naphthyl acrylate, anthryl methacrylate, anthrylmethyl methacrylate, styrene, hydroxystyrene, benzyl vinyl ether, and N-phenylmaleimide); and polycondensation polymers such as phenol novolac and naphthol novolac.

When an addition polymerization polymer is used as an organic polymer compound, the polymer compound may be a homopolymer or a copolymer.

An addition polymerizable monomer is used for the production of the addition polymerization polymer. Specific examples of the addition polymerizable monomer include, but are not limited to, acrylic acid, methacrylic acid, an acrylate ester compound, a methacrylate ester compound, an acrylamide compound, a methacrylamide compound, a vinyl compound, a styrene compound, a maleimide compound, maleic anhydride, and acrylonitrile.

Specific examples of the acrylate ester compound include, but are not limited to, methyl acrylate, ethyl acrylate, normal hexyl acrylate, i-propyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Specific examples of the methacrylate ester compound include, but are not limited to, methyl methacrylate, ethyl methacrylate, normal hexyl methacrylate, i-propyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Specific examples of the acrylamide compound include, but are not limited to, acrylamide, N-methylacrylamide, N-ethylacrylamide, N-benzylacrylamide, N-phenylacrylamide, N,N-dimethylacrylamide, and N-anthrylacrylamide.

Specific examples of the methacrylamide compound include, but are not limited to, methacrylamide, N-methylmethacrylamide, N-ethylmethacrylamide, N-benzylmethacrylamide, N-phenylmethacrylamide, N,N-dimethylmethacrylamide, and N-anthrylmethacrylamide.

Specific examples of the vinyl compound include, but are not limited to, vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Specific examples of the styrene compound include, but are not limited to, styrene, hydroxystyrene, chlorostyrene, bromostyrene, methoxystyrene, cyanostyrene, and acetylstyrene.

Examples of the maleimide compound include, but are not limited to, maleimide, N-methylmaleimide, N-phenylmaleimide, N-cyclohexylmaleimide, N-benzylmaleimide, and N-hydroxyethylmaleimide.

When a polycondensation polymer is used as the polymer, the polymer is, for example, a polycondensation polymer composed of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer include, but are not limited to, polyesters, polyamides, and polyimides, such as polypyromellitimide, poly(p-phenyleneterephthalamide), polybutylene terephthalate, and polyethylene terephthalate.

When the organic polymer compound contains a hydroxy group, the hydroxy group may be crosslinked with, for example, a hydrolysis condensate.

The organic polymer compound generally has a weight average molecular weight of 1,000 to 1,000,000. In the case of incorporation of the organic polymer compound, from the viewpoints of sufficiently achieving the functional effect of the polymer and preventing the precipitation of the polymer in the composition, the weight average molecular weight may be, for example, 3,000 to 300,000, or 5,000 to 300,000, or 10,000 to 200,000.

These organic polymer compounds may be used alone or in combination of two or more species.

When the silicon-containing resist underlayer film-forming composition of the present invention contains an organic polymer compound, the amount of the organic polymer compound cannot be univocally determined, since the amount should be appropriately determined in consideration of, for example, the function of the organic polymer compound. The amount of the organic polymer compound is generally 1 to 200% by mass relative to the mass of the aforementioned polysiloxane [A]. From the viewpoint of, for example, preventing the precipitation of the polymer compound in the composition, the amount is, for example, 100% by mass or less, preferably 50% by mass or less, more preferably 30% by mass or less. From the viewpoint of, for example, sufficiently achieving the effect of the polymer compound, the amount is, for example, 5% by mass or more, preferably 10% by mass or more, more preferably 30% by mass or more.

<Acid Generator>

Examples of the acid generator include a thermal acid generator and a photoacid generator, and a photoacid generator is preferably used.

Examples of the photoacid generator include, but are not limited to, an onium salt compound, a sulfonimide compound, and a disulfonyldiazomethane compound. The photoacid generator may also serve as a curing catalyst depending on the type thereof, for example, a nitrate salt, a carboxylate salt (e.g., maleate), or a hydrochloride salt of an onium salt compound described below.

Examples of the thermal acid generator include, but are not limited to, tetramethylammonium nitrate.

Specific examples of the onium salt compound include, but are not limited to, iodonium salt compounds, such as diphenyliodonium hexafluorophosphate, diphenyliodonium trifluoromethanesulfonate, diphenyliodonium nonafluoro normal butanesulfonate, diphenyliodonium perfluoro normal octanesulfonate, diphenyliodonium camphorsulfonate, bis(4-t-butylphenyl)iodonium camphorsulfonate, and bis(4-t-butylphenyl)iodonium trifluoromethanesulfonate; and sulfonium salt compounds, such as triphenylsulfonium hexafluoroantimonate, triphenylsulfonium nonafluoro normal butanesulfonate, triphenylsulfonium camphorsulfonate, triphenylsulfonium trifluoromethanesulfonate, triphenylsulfonium nitrate, triphenylsulfonium trifluoroacetate, triphenylsulfonium maleate, and triphenylsulfonium chloride.

Specific examples of the sulfonimide compound include, but are not limited to, N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

When the silicon-containing resist underlayer film-forming composition of the present invention contains an acid generator, the amount of the acid generator cannot be univocally determined, since the amount should be appropriately determined in consideration of, for example, the type of the acid generator. The amount of the acid generator is generally 0.01 to 5% by mass relative to the mass of the polysiloxane [A]. From the viewpoint of, for example, preventing the precipitation of the acid generator in the composition, the amount is preferably 3% by mass or less, more preferably 1% by mass or less. From the viewpoint of, for example, sufficiently achieving the effect of the acid generator, the amount is preferably 0.1% by mass or more, more preferably 0.5% by mass or more.

These acid generators may be used alone or in combination of two or more species. A photoacid generator and a thermal acid generator may be used in combination.

<Surfactant>

When the resist underlayer film-forming composition is applied onto a substrate, a surfactant effectively prevents formation of, for example, pinholes and striations. Examples of the surfactant include a nonionic surfactant, an anionic surfactant, a cationic surfactant, a silicon-containing surfactant, a fluorine-containing surfactant, and a UV-curable surfactant. Specific examples of the surfactant include, but are not limited to, nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether, polyoxyethylene alkylallyl ethers, such as polyoxyethylene octylphenol ether and polyoxyethylene nonylphenol ether, polyoxyethylene-polyoxypropylene block copolymers, sorbitan fatty acid esters, such as sorbitan monolaurate, sorbitan monopalmitate, sorbitan monostearate, sorbitan monooleate, sorbitan trioleate, and sorbitan tristearate, polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-containing surfactants, such as trade names EFTOP (registered trademark) EF301, EF303, and EF352 (available from Mitsubishi Materials Electronic Chemicals Co., Ltd. (former Tohkem Products Corporation)), trade names MEGAFAC (registered trademark) F171, F173, R-08, R-30, R-30N, and R-40LM (available from DIC Corporation), Fluorad FC430 and FC431 (available from 3M Japan Limited), trade name Asahi Guard (registered trademark) AG710 (available from AGC Inc.), and trade names SURFLON (registered trademark) S-382, SC101, SC102, SC103, SC104, SC105, and SC106 (available fromAGC Seimi Chemical Co., Ltd.); and Organosiloxane Polymer KP341 (available from Shin-Etsu Chemical Co., Ltd.).

These surfactants may be used alone or in combination of two or more species.

When the silicon-containing resist underlayer film-forming composition of the present invention contains a surfactant, the amount of the surfactant is generally 0.0001 to 5% by mass, preferably 0.001 to 4% by mass, more preferably 0.01 to 3% by mass, relative to the mass of the polysiloxane [A].

<Rheology Controlling Agent>

The rheology controlling agent is added for the purpose of mainly improving the fluidity of the resist underlayer film-forming composition, in particular, improving the uniformity of the thickness of a film to be formed or improving the fillability of the composition into holes during a baking process. Specific examples of the rheology controlling agent include phthalic acid derivatives, such as dimethyl phthalate, diethyl phthalate, di-i-butyl phthalate, dihexyl phthalate, and butyl i-decyl phthalate; adipic acid derivatives, such as di-normal butyl adipate, di-i-butyl adipate, di-i-octyl adipate, and octyl decyl adipate; maleic acid derivatives, such as di-normal butyl maleate, diethyl maleate, and dinonyl maleate; oleic acid derivatives, such as methyl oleate, butyl oleate, and tetrahydrofurfuryl oleate; and stearic acid derivatives, such as normal butyl stearate and glyceryl stearate.

When such a rheology controlling agent is used, the amount of the rheology controlling agent added to the resist underlayer film-forming composition is generally less than 30% by mass relative to the total solid content of the composition.

<Adhesion Aid>

The adhesion aid is added for the purpose of mainly improving the adhesion between a substrate or a resist and a film (resist underlayer film) formed from the resist underlayer film-forming composition, in particular, suppressing or preventing the peeling of the resist during development. Specific examples of the adhesion aid include chlorosilanes, such as trimethylchlorosilane, dimethylvinylchlorosilane, methyldiphenylchlorosilane, and chloromethyldimethylchlorosilane; alkoxysilanes, such as trimethylmethoxysilane, dimethyldiethoxysilane, methyldimethoxysilane, and dimethylvinylethoxysilane; silazanes, such as hexamethyldisilazane, N,N'-bis(trimethylsilyl)urea, dimethyltrimethylsilylamine, and trimethylsilylimidazole; additional silanes, such as γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea.

When such an adhesion aid is used, the amount of the adhesion aid added to the resist underlayer film-forming composition is generally less than 5% by mass, preferably less than 2% by mass, relative to the total solid content of the composition.

<pH Adjuster>

The pH adjuster may be, for example, an acid having one or two or more carboxylate groups, such as an organic acid described above in <Stabilizer>. When a pH adjuster is used, the amount of the pH adjuster added may be 0.01 to 20 parts by mass, or 0.01 to 10 parts by mass, or 0.01 to 5 parts by mass, relative to 100 parts by mass of the polysiloxane [A].

<Metal Oxide>

Examples of the metal oxide that may be added to the silicon-containing resist underlayer film-forming composition of the present invention include, but are not limited to, oxides of a combination of one or more selected from among metals, such as tin (Sn), titanium (Ti), aluminum (Al), zirconium (Zr), zinc (Zn), niobium (Nb), tantalum (Ta), and W (tungsten), and semimetals, such as boron (B), silicon (Si), germanium (Ge), arsenic (As), antimony (Sb), and tellurium (Te).

[Pattern Formation Method and Semiconductor Device Production Method]

Next will be described, as one embodiment of the present invention, a pattern formation method using the silicon-containing resist underlayer film-forming composition of the present invention, and a semiconductor device production method.

Firstly, the silicon-containing resist underlayer film-forming composition of the present invention is applied onto a substrate used for the production of a precise integrated circuit device [e.g., a semiconductor substrate such as a silicon wafer coated with a silicon oxide film, a silicon nitride film, or a silicon oxynitride film, a silicon nitride substrate, a quartz substrate, a glass substrate (including alkali-free glass, low alkali glass, or crystallized glass), a glass substrate coated with an ITO (indium tin oxide) film or an IZO (indium zinc oxide) film, a plastic (e.g., polyimide or PET) substrate, a substrate coated with a low dielectric constant material (low-k material), or a flexible substrate] by an appropriate application method with, for example, a spinner or a coater. Thereafter, the composition is cured through baking by heating means (e.g., a hot plate), to thereby form a resist underlayer film. Hereinafter, the term "resist underlayer film" refers to a film formed from the silicon-containing resist underlayer film-forming composition of the present invention.

The baking is performed under appropriately determined conditions; i.e., a baking temperature of 40° C. to 400° C. or 80° C. to 250° C. and a baking time of 0.3 minutes to 60 minutes. Preferably, the baking temperature is 150° C. to 250° C., and the baking time is 0.5 minutes to 2 minutes.

The thus-formed resist underlayer film has a thickness of, for example, 10 nm to 1,000 nm, or 20 nm to 500 nm, or 50 nm to 300 nm, or 100 nm to 200 nm, or 10 to 150 nm.

The resist underlayer film-forming composition used for formation of the aforementioned resist underlayer film may be the resist underlayer film-forming composition subjected to filtration with a nylon filter. The expression "resist underlayer film-forming composition subjected to filtration with a nylon filter" as used herein refers to a composition which has been subjected to filtration with a nylon filter during production of the resist underlayer film-forming composition or after mixing of all the components.

In this embodiment of the present invention, an organic underlayer film is formed on the aforementioned substrate, and then the resist underlayer film is formed on the organic underlayer film. However, in some embodiments, an organic underlayer film may be omitted.

No particular limitation is imposed on the organic underlayer film used herein, and the organic underlayer film may be arbitrarily selected from among those conventionally used in a lithographic process.

In the present embodiment, the organic underlayer film is formed on the substrate, and the resist underlayer film is formed on the organic underlayer film, followed by formation of a resist film on the resist underlayer film as described below. This constitution can narrow the pattern width of a photoresist film. Thus, even when the photoresist film is formed thinly for preventing pattern collapse, the substrate can be processed through selection of an appropriate etching gas described below. For example, the silicon-containing resist underlayer film of the present invention can be processed by using, as an etching gas, a fluorine-containing gas that achieves a significantly high etching rate for the photoresist film. The organic underlayer film can be processed by using, as an etching gas, an oxygen-containing gas that achieves a significantly high etching rate for the silicon-containing resist underlayer film of the present invention. The substrate can be processed by using, as an etching gas, a fluorine-containing gas that achieves a significantly high etching rate for the organic underlayer film.

The substrate and application method usable in this process are the same as those above-described.

Subsequently, a layer of, for example, a photoresist material (resist film) is formed on the aforementioned resist underlayer film. The resist film can be formed by a well-known method. Specifically, the resist film can be formed by application of a coating-type resist material (e.g., a photoresist film-forming composition) onto the resist underlayer film, and subsequent baking of the resist material.

The resist film has a thickness of, for example, 10 nm to 10,000 nm, or 100 nm to 2,000 nm, or 200 nm to 1,000 nm, or 30 nm to 200 nm.

No particular limitation is imposed on the photoresist material used for the resist film formed on the resist underlayer film, so long as the material is sensitive to light used for exposure (e.g., KrF excimer laser or ArF excimer laser). The material may be either of negative photoresist and positive photoresist materials. Examples of the material include, but are not limited to, a positive photoresist material formed of a novolac resin and a 1,2-naphthoquinone diazide sulfonic acid ester; a chemically amplified photoresist material formed of a binder having a group that decomposes with an acid to thereby increase an alkali dissolution rate and a photoacid generator; a chemically amplified photoresist material formed of a low-molecular-weight compound that decomposes with an acid to thereby increase the alkali dissolution rate of the photoresist material, an alkali-soluble binder, and a photoacid generator; and a chemically amplified photoresist material formed of a binder having a group that decomposes with an acid to thereby increase an alkali dissolution rate, a low-molecular-weight compound that decomposes with an acid to thereby increase the alkali dissolution rate of the photoresist material, and a photoacid generator.

Specific examples of commercially available products include, but are not limited to, trade name APEX-E (available from Shipley), trade name PAR710 (available from Sumitomo Chemical Company, Limited), trade name AR2772JN (available from JSR Corporation), and trade name SEPR430 (available from Shin-Etsu Chemical Co., Ltd.). Other examples include fluorine atom-containing polymer-based photoresist materials described in, for example, Proc. SPIE, Vol. 3999, 330-334 (2000), Proc. SPIE, Vol. 3999, 357-364 (2000), and Proc. SPIE, Vol. 3999, 365-374 (2000).

The resist film formed on the aforementioned resist underlayer film may be, in place of the photoresist film, a resist film for electron beam lithography (may also be referred to as "electron beam resist film") or a resist film for EUV lithography (may also be referred to as "EUV resist film"). Thus, the silicon-containing resist underlayer film-forming composition of the present invention can be used for formation of a resist underlayer film for electron beam lithography or a resist underlayer film for EUV lithography. In particular, the composition of the present invention is suitable as a composition for formation of a resist underlayer film for EUV lithography.

The electron beam resist material may be either of negative and positive materials. Specific examples of the resist material include, but are not limited to, a chemically amplified resist material formed of an acid generator and a binder having a group that decomposes with an acid to thereby change an alkali dissolution rate; a chemically amplified resist material formed of an alkali-soluble binder, an acid generator, and a low-molecular-weight compound that decomposes with an acid to thereby change the alkali dissolution rate of the resist material; a chemically amplified resist material formed of an acid generator, a binder having a group that decomposes with an acid to thereby change an alkali dissolution rate, and a low-molecular-weight compound that decomposes with an acid to thereby change the alkali dissolution rate of the resist material; a non-chemically amplified resist material formed of a binder having a group that decomposes with electron beams to thereby change an alkali dissolution rate; and a non-chemically amplified resist material formed of a binder having a moiety that is cut with electron beams to thereby change an alkali dissolution rate. Also in the case of use of such an electron beam resist material, a resist film pattern can be formed by using electron beams as an irradiation source in the same manner as in the case of using the photoresist material.

The EUV resist material may be a methacrylate resin-based resist material.

Subsequently, light exposure is performed on the resist film formed above the resist underlayer film through a predetermined mask (reticle). The light exposure may involve the use of, for example, a KrF excimer laser (wavelength: 248 nm), an ArF excimer laser (wavelength: 193 nm), an F2 excimer laser (wavelength: 157 nm), EUV (wavelength: 13.5 nm), or electron beams.

After the light exposure, post exposure bake may be performed if necessary. The post exposure bake is performed under appropriately determined conditions; i.e., a heating temperature of 70° C. to 150° C. and a heating time of 0.3 minutes to 10 minutes.

Subsequently, development is performed with a developer (e.g., an alkaline developer). When, for example, a positive photoresist film is used, an exposed portion of the photoresist film is removed to thereby form a pattern of the photoresist film.

Examples of the developer (alkaline developer) include alkaline aqueous solutions (alkaline developers), for example, aqueous solutions of alkali metal hydroxides, such as potassium hydroxide and sodium hydroxide; aqueous solutions of quaternary ammonium hydroxides, such as tetramethylammonium hydroxide, tetraethylammonium hydroxide, and choline; and aqueous solutions of amines, such as ethanolamine, propylamine, and ethylenediamine. Such a developer may further contain a surfactant, etc. The development is performed under appropriately determined conditions; i.e., a temperature of 5 to 50° C. and a time of 10 seconds to 600 seconds.

The present invention may involve the use of an organic solvent as a developer. Thus, development is performed with a developer (solvent) after light exposure. When, for example, a negative photoresist film is used, an unexposed portion of the photoresist film is removed to thereby form a pattern of the photoresist film.

Examples of the developer (organic solvent) include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Such a developer may further contain a surfactant, etc. The development is performed under appropriately determined conditions; i.e., a temperature of 5° C. to 50° C. and a time of 10 seconds to 600 seconds.

The resultant patterned photoresist film (upper layer) is used as a protective film to thereby remove the resist underlayer film (intermediate layer). Subsequently, the patterned photoresist film and the patterned resist underlayer film (intermediate layer) are used as protective films to thereby remove the organic underlayer film (lower layer) (if present). Finally, the patterned photoresist film (upper layer) (if remains), the patterned resist underlayer film (intermediate layer), and the patterned organic underlayer film (lower layer) (if present) are used as protective films to thereby process the substrate.

The resist underlayer film (intermediate layer) is removed (patterned) through dry etching by using the patterned resist film (upper layer) as a protective film. The dry etching can be performed with any of gases, such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, and dichloroborane.

The dry etching of the resist underlayer film is preferably performed with a halogen-containing gas. In general, a resist film (photoresist film) formed of an organic substance is hard to remove by dry etching with a halogen-containing gas. In contrast, the silicon-containing resist underlayer film, which contains numerous silicon atoms, is quickly removed by dry etching with a halogen-containing gas. Therefore, a reduction in the thickness of the photoresist film in association with the dry etching of the resist underlayer film can be suppressed. Consequently, the photoresist film can be used in the form of thin film. Thus, the dry etching of the resist underlayer film is preferably performed with a fluorine-containing gas. Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

Subsequently, when the organic underlayer film is present between the substrate and the resist underlayer film, the patterned resist film (upper layer) (if remains) and the patterned resist underlayer film (intermediate layer) are used as protective films to thereby remove (pattern) the organic underlayer film (lower layer). The organic underlayer film (lower layer) is preferably removed (patterned) by dry etching with an oxygen-containing gas (e.g., oxygen gas or oxygen/carbonyl sulfide (COS) mixed gas), since the silicon-containing resist underlayer film of the present invention, which contains numerous silicon atoms, is less likely to be removed by dry etching with an oxygen-containing gas.

Thereafter, the patterned resist film (upper layer) (if remains), the patterned resist underlayer film (intermediate layer) and, if desired, the patterned organic underlayer film (lower layer) are used as protective films to thereby process (pattern) the (semiconductor) substrate. The (semiconductor) substrate is preferably processed (patterned) by dry etching with a fluorine-containing gas.

Examples of the fluorine-containing gas include tetrafluoromethane ($CF_4$), perfluorocyclobutane ($C_4F_8$), perfluoropropane ($C_3F_8$), trifluoromethane, and difluoromethane ($CH_2F_2$).

The resist underlayer film may be removed after removal (patterning) of the aforementioned organic underlayer film or after processing (patterning) of the substrate. The resist underlayer film may be removed by dry etching or wet etching.

The dry etching of the resist underlayer film is preferably performed with a fluorine-containing gas as described in the aforementioned patterning. Examples of the fluorine-containing gas include, but are not limited to, tetrafluoromethane ($CF_4$), perfluorocyclobutane ($C_4F_8$), perfluoropropane ($C_3F_8$), trifluoromethane, and difluoromethane ($CH_2F_2$).

In the present invention, since the resist underlayer film-forming composition contains nitric acid [B] and the bisphenol compound [C], the wet removability of a film formed from the composition can be improved.

Examples of the chemical used for wet etching of the resist underlayer film include dilute hydrofluoric acid (hydrofluoric acid), buffered hydrofluoric acid (mixture of HF and $NH_4F$), an aqueous solution containing hydrochloric acid and hydrogen peroxide (SC-2 chemical), an aqueous solution containing sulfuric acid and hydrogen peroxide (SPM chemical), an aqueous solution containing hydrofluoric acid and hydrogen peroxide (FPM chemical), and an alkaline solution such as an aqueous solution containing ammonia and hydrogen peroxide (SC-1 chemical). Examples of the above-described alkaline solution include, besides the aforementioned ammonia-hydrogen peroxide mixture (SC-1 chemical) prepared by mixing of ammonia, hydrogen peroxide, and water, an aqueous solution containing 1 to 99% by mass ammonia, tetramethylammonium hydroxide (TMAH), tetraethylammonium hydroxide, tetrapropylammonium hydroxide, tetrabutylammonium hydroxide, choline hydroxide, benzyltrimethylammonium hydroxide, benzyltriethylammonium hydroxide, DBU (diazabicycloundecene), DBN (diazabicyclononene), hydroxylamine, 1-butyl-1-methylpyrrolidinium hydroxide, 1-propyl-1-methylpyrrolidinium hydroxide, 1-butyl-1-methylpiperidinium hydroxide, 1-propyl-1-methylpiperidinium hydroxide, mepiquat hydroxide, trimethylsulfonium hydroxide, a hydrazine compound, an ethylenediamine compound, or guanidine. These chemicals may be used in combination.

An organic anti-reflective coating may be formed on the resist underlayer film before formation of the resist film. No particular limitation is imposed on the composition used for formation of the anti-reflective coating, and, for example, the composition may be appropriately selected from anti-reflective coating compositions that have been conventionally used in a lithographic process. The anti-reflective coating can be formed by a commonly used method, for example, application of the composition with a spinner or a coater, and subsequent baking of the composition.

The substrate to which the silicon-containing resist underlayer film-forming composition of the present invention is applied may have an organic or inorganic anti-reflective coating formed thereon by, for example, a CVD process. The resist underlayer film may be formed on the anti-reflective coating. Even in the case where the resist underlayer film of the present invention is formed on the organic underlayer film formed on the substrate, the substrate used may have an organic or inorganic anti-reflective coating formed thereon by, for example, a CVD process.

The resist underlayer film formed from the silicon-containing resist underlayer film-forming composition of the present invention may absorb light used in a lithographic process depending on the wavelength of the light. In such a case, the resist underlayer film can function as an anti-reflective coating having the effect of preventing reflection of light from the substrate.

Furthermore, the resist underlayer film can be used as, for example, a layer for preventing the interaction between the substrate and the resist film (e.g., photoresist film); a layer having the function of preventing the adverse effect, on the substrate, of a material used for the resist film or a substance generated during the exposure of the resist film to light; a layer having the function of preventing diffusion of a substance generated from the substrate during heating and baking to the upper resist film; and a barrier layer for reducing a poisoning effect of a dielectric layer of the semiconductor substrate on the resist film.

The resist underlayer film can be applied to a substrate having via holes for use in a dual damascene process, and can be used as an embedding material to fill up the holes. The resist underlayer film can also be used as a planarization material for planarizing the surface of a semiconductor substrate having irregularities.

The resist underlayer film functions as an underlayer film of EUV resist film or a hard mask. In addition, the resist underlayer film can be used as, for example, an anti-reflective underlayer coating of EUV resist film capable of, without intermixing with the EUV resist film, preventing the reflection, from a substrate or an interface, of exposure light undesirable for EUV exposure (wavelength: 13.5 nm), such as UV (ultraviolet) light or DUV (deep ultraviolet) light (ArF light, KrF light). Thus, the resist underlayer film can efficiently prevent the light reflection as the underlayer film of the EUV resist film. When the resist underlayer film is used as an EUV resist underlayer film, the film can be processed in the same manner as in the photoresist underlayer film.

A semiconductor substrate can be suitably processed by using a semiconductor processing substrate including the above-described resist underlayer film of the present invention and a semiconductor substrate.

A semiconductor substrate can be precisely processed at high reproducibility by the above-described semiconductor device production method including a step of forming an organic underlayer film; a step of forming a silicon-containing resist underlayer film on the organic underlayer film from the silicon-containing resist underlayer film-forming composition of the present invention; and a step of forming a resist film on the silicon-containing resist underlayer film. Thus, it is expected that the method can stably produce a semiconductor device.

EXAMPLES

The present invention will next be described in more detail with reference to Synthesis Examples and Examples, but the present invention should not be construed as being limited only to the following Examples.

In the Examples, the apparatuses and conditions used for analysis of the physical properties of samples are as follows.

(1) Measurement of Molecular Weight

The molecular weight of the polysiloxane used in the present invention is determined by GPC analysis in terms of polystyrene.

The GPC analysis can be performed under, for example, the following conditions: GPC apparatus (trade name: HLC-8220GPC, available from Tosoh Corporation), GPC columns (trade name: Shodex (registered trademark) KF803L, KF802, and KF801, available from Showa Denko K.K.), column temperature of 40° C., tetrahydrofuran serving as an eluent (elution solvent), flow amount (flow rate) of 1.0 m/min, and polystyrene (available from Showa Denko K.K.) as a standard sample.

(2) $^1$H-NMR

The evaluation was performed with a nuclear magnetic resonance apparatus $^1$H-NMR (400 MHz) available from JEOL Ltd. using d6-Acetone as a solvent.

(3) Amount of Residual Nitric Acid

The amount of nitric acid remaining in the system was measured by ion chromatography.

[1] Synthesis of Polymer (Hydrolysis Condensate)

Synthesis Example 1

A 300-mL flask was charged with 23.3 g of tetraethoxysilane, 7.1 g of methyltriethoxysilane, 1.6 g of phenyltrimethoxysilane, and 47.9 g of propylene glycol monoethyl ether. While the resultant mixture was stirred with a magnetic stirrer, 20.2 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight of 3,000 as determined by GPC in terms of polystyrene. The amount of capping with propylene glycol monoethyl ether was 3 mol % relative to Si atoms as determined by $^1$H-NMR. The amount of residual nitric acid in the polymer solution was 1,200 ppm.

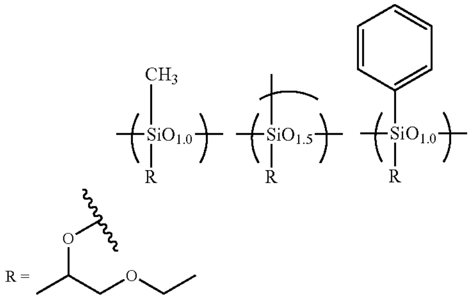

Synthesis Example 2

A 300-mL flask was charged with 23.0 g of tetraethoxysilane, 7.0 g of methyltriethoxysilane, 2.02 g of bicyclo [2.2.1]hept-5-en-2-yltriethoxysilane, and 48.1 g of propylene glycol monoethyl ether. While the resultant mixture was stirred with a magnetic stirrer, 19.9 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 2,800 as determined by GPC in terms of polystyrene. The amount of capping with propylene glycol monoethyl ether was 3 mol % relative to Si atoms as determined by $^1$H-NMR. The amount of residual nitric acid in the polymer solution was 1,200 ppm.

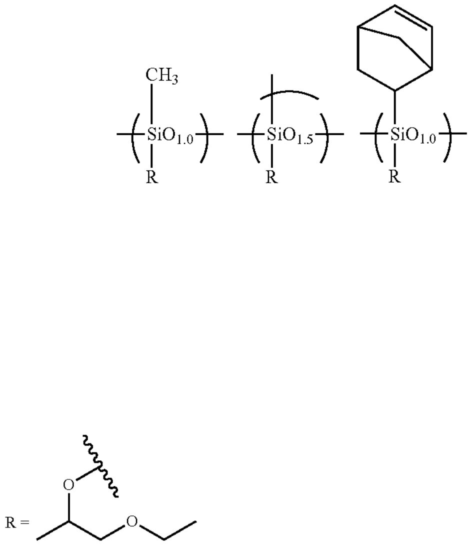

Synthesis Example 3

A 300-mL flask was charged with 22.3 g of tetraethoxysilane, 6.82 g of methyltriethoxysilane, 3.16 g of diallyl isocyanurate propyltriethoxysilane, and 48.4 g of propylene glycol monoethyl ether. While the resultant mixture was stirred with a magnetic stirrer, 19.3 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 2,300 as determined by GPC in terms of polystyrene. The amount of capping with propylene glycol monoethyl ether was 2 mol % relative to Si atoms as determined by $^1$H-NMR. The amount of residual nitric acid in the polymer solution was 1,200 ppm.

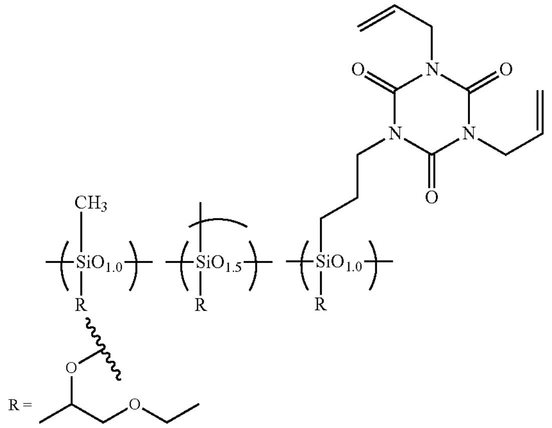

Synthesis Example 4

A 300-mL flask was charged with 23.0 g of tetraethoxysilane, 7.02 g of methyltriethoxysilane, 2.07 g of thiocyanate propyltriethoxysilane, and 48.0 g of propylene glycol monoethyl ether. While the resultant mixture was stirred with a magnetic stirrer, 19.9 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 2,600 as determined by GPC in terms of polystyrene. The amount of capping with propylene glycol monoethyl ether was 3 mol % relative to Si atoms as determined by $^{1}$H-NMR. The amount of residual nitric acid in the polymer solution was 1,200 ppm.

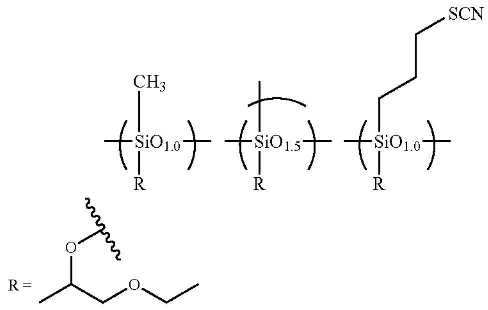

Synthesis Example 5

A 300-mL flask was charged with 22.6 g of tetraethoxysilane, 6.62 g of methyltriethoxysilane, 2.66 g of triethoxy((2-methoxy-4-(methoxymethyl)phenoxy)methyl)silane, and 48.3 g of propylene glycol monoethyl ether. While the resultant mixture was stirred with a magnetic stirrer, 19.5 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 3,200 as determined by GPC in terms of polystyrene. The amount of capping with propylene glycol monoethyl ether was 4 mol % relative to Si atoms as determined by $^{1}$H-NMR. The amount of residual nitric acid in the polymer solution was 1,200 ppm.

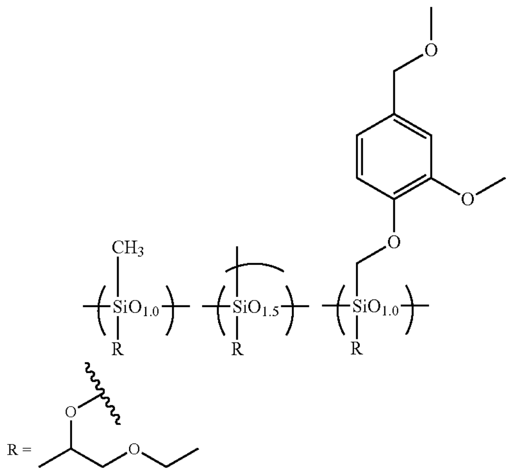

Synthesis Example 6

A 300-mL flask was charged with 23.0 g of tetraethoxysilane, 7.04 g of methyltriethoxysilane, 1.95 g of epoxycyclohexylethyltrimethoxysilane, and 48.0 g of propylene glycol monoethyl ether. While the resultant mixture was stirred with a magnetic stirrer, 19.9 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 3,100 as determined by GPC in terms of polystyrene. The amount of capping with propylene glycol monoethyl ether was 3 mol % relative to Si atoms as determined by $^1$H-NMR. The amount of residual nitric acid in the polymer solution was 1,200 ppm.

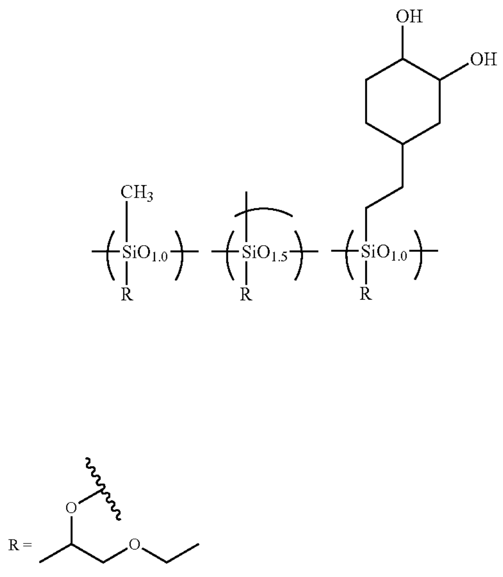

Synthesis Example 7

A 300-mL flask was charged with 23.1 g of tetraethoxysilane, 7.06 g of methyltriethoxysilane, 1.87 g of glycidoxypropyltrimethoxysilane, and 48.0 g of propylene glycol monoethyl ether. While the resultant mixture was stirred with a magnetic stirrer, 20.0 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 3,000 as determined by GPC in terms of polystyrene. The amount of capping with propylene glycol monoethyl ether was 3 mol % relative to Si atoms as determined by $^1$H-NMR. The amount of residual nitric acid in the polymer solution was 1,200 ppm.

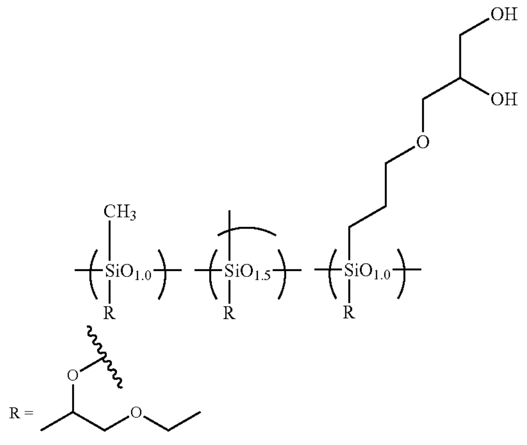

Synthesis Example 8

A 300-mL flask was charged with 23.3 g of tetraethoxysilane, 6.9 g of methyltriethoxysilane, 1.6 g of phenyltrimethoxysilane, and 47.9 g of propylene glycol monomethyl ether. While the resultant mixture was stirred with a magnetic stirrer, 0.29 g of dimethylaminopropyltrimethoxysilane and 20.2 g of an aqueous nitric acid solution (0.2 mol/L) were added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monomethyl ether was added to the solution so as to achieve a solvent proportion of propylene glycol monomethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 3,000 as determined by GPC in terms of polystyrene. The amount of capping with propylene glycol monomethyl ether was 4 mol % relative to Si atoms as determined by $^1$H-NMR. The amount of residual nitric acid in the polymer solution was 1,200 ppm.

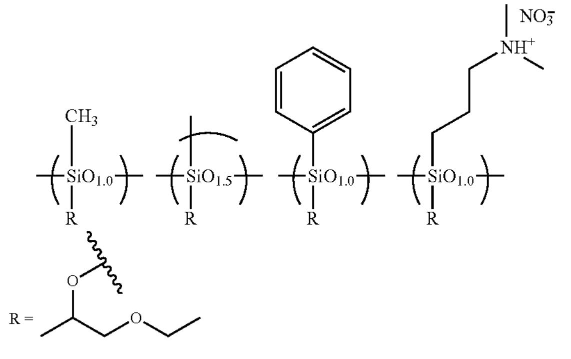

Synthesis Example 9

A 300-mL flask was charged with 22.2 g of tetraethoxysilane, 6.77 g of methyltriethoxysilane, 1.51 g of phenyltrimethoxysilane, 1.90 g of bisphenol sulfone, and 48.5 g of propylene glycol monoethyl ether. While the resultant mixture was stirred with a magnetic stirrer, 19.2 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 3,000 as determined by GPC in terms of polystyrene. The amount of capping with propylene glycol monoethyl ether was 3 mol % relative to Si atoms as determined by $^{1}H$-NMR. The amount of residual nitric acid in the polymer solution was 1,200 ppm, and the amount of residual BPS in the polymer solution was 2%.

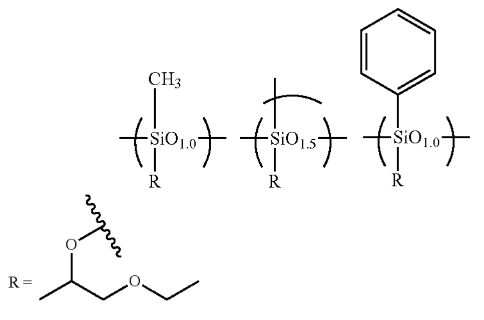

Referential Synthesis Example 1

A 300-mL flask was charged with 20.3 g of tetraethoxysilane, 11.6 g of methyltriethoxysilane, and 47.7 g of acetone. While the resultant mixture was stirred with a magnetic stirrer, 20.4 g of 0.1 M aqueous nitric acid solution was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight Mw of 2,400 as determined by GPC in terms of polystyrene. The amount of residual nitric acid in the polymer solution was 1,200 ppm.

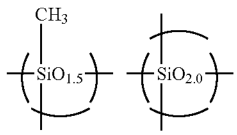

Referential Synthesis Example 2

A 300-mL flask was charged with 20.3 g of tetraethoxysilane, 11.6 g of methyltriethoxysilane, and 47.7 g of propylene glycol monoethyl ether. While the resultant mixture was stirred with a magnetic stirrer, 20.4 g of 0.01 M aqueous hydrochloric acid solution was added dropwise to the mixture.

After completion of the dropwise addition, the flask was transferred to an oil bath set at 60° C., and the mixture was refluxed for 20 hours. Thereafter, ethanol and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C.

The resultant polymer was found to contain a polysiloxane having a structure of the following Formula and to have a weight average molecular weight Mw of 2,400 as determined by GPC in terms of polystyrene. The amount of capping with propylene glycol monoethyl ether was 1 mol % or less relative to Si atoms as determined by $^{1}H$-NMR. The amount of residual hydrochloric acid in the polymer solution was 0 ppm.

The resultant polymer solution was subjected to filtration with a nylon-made filter (pore size: 0.1 μm). As a result, the weight average molecular weight Mw was increased to 6,300 as determined by GPC in terms of polystyrene. The molecular weight Mw of the polymer was found to be changed.

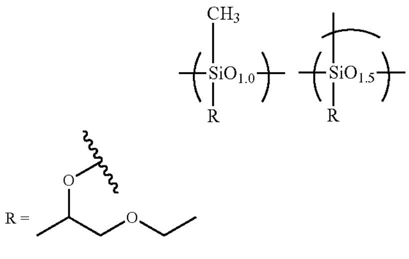

Referential Synthesis Example 3

A 300-mL flask was charged with 23.3 g of tetraethoxysilane, 7.1 g of methyltriethoxysilane, 1.6 g of phenyltrimethoxysilane, and 47.9 g of acetone. While the resultant mixture was stirred with a magnetic stirrer, 20.2 g of an aqueous nitric acid solution (0.1 mol/L) was added dropwise to the mixture.

After completion of the dropwise addition, the flask was transferred to an oil bath set at 60° C., and the mixture was refluxed for 20 hours. Thereafter, 47.9 g of propylene glycol monoethyl ether was added to the mixture, and then acetone and ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight of 2,200 as determined by GPC in terms of polystyrene. The amount of residual nitric acid in the polymer solution was 1,200 ppm.

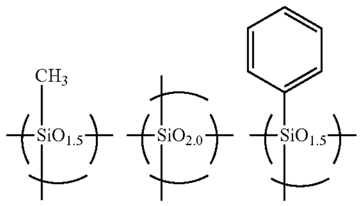

Referential Synthesis Example 4

A 300-mL flask was charged with 23.3 g of tetraethoxysilane, 7.1 g of methyltriethoxysilane, 1.6 g of phenyltrimethoxysilane, and 47.9 g of propylene glycol monoethyl ether. While the resultant mixture was stirred with a magnetic stirrer, 20.2 g of an aqueous methanesulfonic acid solution (0.1 mol/L) was added dropwise to the mixture.

After completion of the dropwise addition, the flask was transferred to an oil bath set at 60° C., and the mixture was refluxed for 20 hours. Thereafter, ethanol, methanol, and water (i.e., reaction by-products) were distilled off under reduced pressure for concentration, to thereby produce a hydrolysis condensate (polymer) solution.

Subsequently, propylene glycol monoethyl ether was added to the solution so as to achieve a solvent proportion of propylene glycol monoethyl ether of 100% and a concentration of 20% by mass in terms of solid residue content at 140° C. The resultant solution was subjected to filtration with a nylon-made filter (pore size: 0.1 μm).

The resultant polymer was found to contain a polysiloxane having a structure of the following Formula and to have a weight average molecular weight of 3,200 as determined by GPC in terms of polystyrene. The amount of capping with propylene glycol monoethyl ether was 3 mol % relative to Si atoms as determined by $^{1}$H-NMR. The amount of residual methanesulfonic acid in the polymer solution was 1,600 ppm.

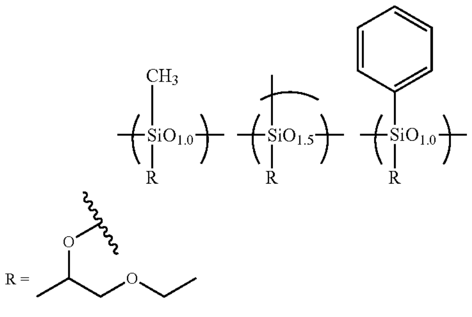

[2] Preparation of Resist Underlayer Film-Forming Composition

Each of the hydrolysis condensate (polymer) solutions produced in the aforementioned Synthesis Examples, an acid (additive 1), a curing catalyst (additive 2), a bisphenol compound (additive 3), and a solvent were mixed in proportions shown in Table 1, and the resultant mixture was filtered with a fluororesin-made filter (0.1 μm), to thereby prepare a resist underlayer film-forming composition. In Table 1, the amount of each component added is shown by part(s) by mass.

Although the composition was prepared from the solution containing the hydrolysis condensate (polymer) produced in each Synthesis Example, the amount of each polymer shown in Table 1 corresponds not to the amount of the polymer solution, but to the amount of the polymer itself.

In Table 1, DIW denotes ultrapure water; PGEE, propylene glycol monoethyl ether; and PGME, propylene glycol monomethyl ether.

Furthermore, MA denotes maleic acid; TPSNO3, triphenylsulfonium nitrate; TPSML, triphenylsulfonium maleate; TPSAc, triphenylsulfonium acetate; TPSTfAc, triphenylsulfonium trifluoroacetate; BTEAC, benzyltriethylammonium chloride; IMTEOS, triethoxysilylpropyl-4.5-dihydroimidazole; and BPS, bisphenol sulfone.

TABLE 1

| | Polymer | Additive 1 | Additive 2 | Additive 3 | Solvent | | |
|---|---|---|---|---|---|---|---|
| Example 1 | Synthesis Example 1 | MA | IMTEOS | BPS | PGEE | PGME | DIW |
| (part(s) by mass) | 1 | 0.01 | 0.003 | 0.05 | 80 | 8 | 12 |
| Example 2 | Synthesis Example 2 | MA | TPSML | BPS | PGEE | PGME | DIW |
| (part(s) by mass) | 1 | 0.01 | 0.003 | 0.05 | 80 | 8 | 12 |
| Example 3 | Synthesis Example 3 | MA | TPSNO3 | BPS | PGEE | PGME | DIW |
| (part(s) by mass) | 1 | 0.01 | 0.003 | 0.05 | 80 | 8 | 12 |
| Example 4 | Synthesis Example 4 | MA | TPSAc | BPS | PGEE | PGME | DIW |
| (part(s) by mass) | 1 | 0.01 | 0.003 | 0.05 | 80 | 8 | 12 |
| Example 5 | Synthesis Example 5 | MA | TPSTfAc | BPS | PGEE | PGME | DIW |

TABLE 1-continued

| | Polymer | Additive 1 | Additive 2 | Additive 3 | Solvent | | |
|---|---|---|---|---|---|---|---|
| (part(s) by mass) | 1 | 0.01 | 0.003 | 0.05 | 80 | 8 | 12 |
| Example 6 | Synthesis Example 6 | MA | BTEAC | BPS | PGEE | PGME | DIW |
| (part(s) by mass) | 1 | 0.01 | 0.003 | 0.05 | 80 | 8 | 12 |
| Example 7 | Synthesis Example 7 | MA | IMTEOS | BPS | PGEE | PGME | DIW |
| (part(s) by mass) | 1 | 0.01 | 0.003 | 0.05 | 80 | 8 | 12 |
| Example 8 | Synthesis Example 8 | MA | | BPS | PGEE | PGME | DIW |
| (part(s) by mass) | 1 | 0.01 | | 0.05 | 80 | 8 | 12 |
| Example 9 | Synthesis Example 9 | MA | TPSNO3 | *1 | PGEE | PGME | DIW |
| (part(s) by mass) | 1 | 0.01 | 0.003 | | 80 | 8 | 12 |
| Comparative Example 1 | Referential Synthesis Example 1 | MA | | | PGEE | PGME | DIW |
| (part(s) by mass) | 1 | 0.01 | | | 80 | 8 | 12 |
| Comparative Example 2 | Referential Synthesis Example 1 | MA | TPSNO3 | | PGEE | PGME | DIW |
| (part(s) by mass) | 1 | 0.01 | 0.01 | | 80 | 8 | 12 |
| Comparative Example 3 | Referential Synthesis Example 2 | MA | TPSNO3 | | PGEE | PGME | DIW |
| (part(s) by mass) | 1 | 0.01 | 0.01 | | 80 | 8 | 12 |
| Comparative Example 4 | Referential Synthesis Example 4 | MA | TPSNO3 | BPS | PGEE | PGME | DIW |
| (part(s) by mass) | 1 | 0.01 | 0.01 | 0.01 | 80 | 8 | 12 |
| Referential Example 1 | Referential Synthesis Example 3 | MA | TPSNO3 | BPS | PGEE | PGME | DIW |
| (part(s) by mass) | 1 | 0.01 | 0.01 | 0.01 | 80 | 8 | 12 |

* The compositions of Examples 1 to 9, Comparative Examples 1 and 2, and Referential Example 1 further contain nitric acid contained in the polymer solutions prepared in Synthesis Examples 1 to 9 and Referential Synthesis Examples 1 and 3, and the composition of Comparative Example 4 further contains methanesulfonic acid contained in the polymer solution prepared in Referential Synthesis Example 4.
*1: The polymer solution prepared in Synthesis Example 9 contains bisphenol sulfone.

[3] Preparation of Organic Resist Underlayer Film-Forming Composition

In a nitrogen atmosphere, a 100-mL four-necked flask was charged with 6.69 g (0.040 mol) of carbazole (available from Tokyo Chemical Industry Co., Ltd.), 7.28 g (0.040 mol) of 9-fluorenone (available from Tokyo Chemical Industry Co., Ltd.), and 0.76 g (0.0040 mol) of p-toluenesulfonic acid monohydrate (available from Tokyo Chemical Industry Co., Ltd.), and then 6.69 g of 1,4-dioxane (available from KANTO CHEMICAL CO., INC.) was added to the flask. The resultant mixture was stirred and then heated to 100° C. for solid dissolution, to thereby initiate polymerization. After the elapse of 24 hours, the reaction mixture was left to cool to 60° C.

The cooled reaction mixture was diluted with 34 g of chloroform (available from KANTO CHEMICAL CO., INC.), and the diluted mixture was added to 168 g of methanol (available from KANTO CHEMICAL CO., INC.) for precipitation.

The resultant precipitate was subjected to filtration, and the recovered solid was dried with a reduced-pressure dryer at 80° C. for 24 hours, to thereby yield 9.37 g of a target polymer of Formula (X) (hereinafter abbreviated as "PCzFL").

The results of $^1$H-NMR analysis of PCzFL were as follows:

$^1$H-NMR (400 MHz, DMSO-d6): δ7.03-7.55 (br, 12H), δ7.61-8.10 (br, 4H), δ11.18 (br, 1H).

PCzFL was found to have a weight average molecular weight Mw of 2,800 as determined by GPC in terms of polystyrene and a polydispersity Mw/Mn of 1.77.

(X)

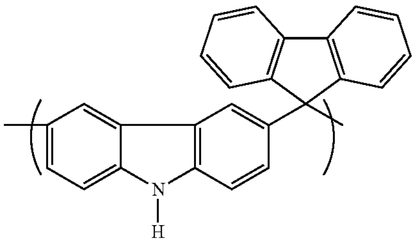

Subsequently, 20 g of PCzFL was mixed with 3.0 g of tetramethoxymethyl glycoluril (trade name: Powderlink 1174, available from Cytec Industries Japan (former Mitsui Cytec Ltd.)) serving as a crosslinking agent, 0.30 g of pyridinium p-toluenesulfonate serving as a catalyst, and 0.06 g of MEGAFAC R-30 (trade name, available from DIC Corporation) serving as a surfactant, and the mixture was dissolved in 88 g of propylene glycol monomethyl ether acetate, to thereby prepare a solution. Thereafter, the solution was filtered with a polyethylene-made microfilter (pore size: 0.10 μm), and then filtered with a polyethylene-made microfilter (pore size: 0.05 μm), to thereby prepare an organic resist underlayer film-forming composition used for a lithographic process using a multilayer film.

[4] Tests for Solvent Resistance and Resistance to Dissolution in Developer

Each of the compositions prepared in Examples 1 to 9, Comparative Examples 1 to 4, and Referential Example 1 was applied onto a silicon wafer with a spinner, and then heated on a hot plate at 215° C. for one minute, to thereby form an Si-containing resist underlayer film. The thickness of the resultant underlayer film was measured.

Subsequently, a mixed solvent of propylene glycol monomethyl ether/propylene glycol monomethyl ether acetate (7/3 (V/V)) was applied onto the Si-containing resist underlayer film, and then spin-dried. The thickness of the underlayer film was measured after application of the solvent, to thereby calculate a rate of change (%) in thickness of the underlayer film after application of the mixed solvent on the basis of the thickness of the film before application of the mixed solvent (100%). The results are shown in Table 2. Solvent resistance can be evaluated as “Good” or “Not cured” when a change in film thickness between before and after application of the mixed solvent is less than 1% or 1% or more, respectively.

Separately, an alkaline developer (2.38% aqueous solution of tetramethylammonium hydroxide (TMAH)) was applied onto an Si-containing resist underlayer film formed on a silicon wafer in the same manner as described above, and then spin-dried. The thickness of the underlayer film was measured after application of the developer, to thereby calculate a rate of change (%) in thickness of the underlayer film after application of the developer on the basis of the thickness of the film before application of the developer (100%). The results are shown in Table 2. Developer resistance can be evaluated as “Good” or “Not cured” when a change in film thickness between before and after application of the developer is less than 1% or 1% or more, respectively.

In the following description, the example number of a used composition is also used as the example number of evaluation performed with the composition.

TABLE 2

| | Solvent resistance | Developer resistance |
|---|---|---|
| Example 1 | 100% | 100% |
| Example 2 | 100% | 100% |
| Example 3 | 100% | 100% |
| Example 4 | 100% | 100% |
| Example 5 | 100% | 100% |
| Example 6 | 100% | 100% |
| Example 7 | 100% | 100% |
| Example 8 | 100% | 100% |
| Example 9 | 100% | 100% |
| Comparative Example 1 | 95% | 80% |
| Comparative Example 2 | 100% | 100% |
| Comparative Example 3 | 100% | 100% |
| Comparative Example 4 | 100% | 100% |
| Referential Example 1 | 100% | 100% |

[5] Measurement of Wet Etching Rate

Each of the compositions prepared in Examples 1 to 9, Comparative Examples 2 to 4, and Referential Example 1 was applied onto a silicon wafer with a spinner, and then heated on a hot plate at 215° C. for one minute, to thereby form an Si-containing resist underlayer film (thickness: 0.02 μm).

The resultant silicon wafer provided with the Si-containing resist underlayer film was used for measurement of wet etching rate with an aqueous TMAH/HF mixed solution as a wet etching agent. The results are shown in Table 3. When the wet etching rate is 10 nm/min or more, evaluation “Good” can be given, whereas when the wet etching rate is less than 10 nm/min, evaluation “Poor” can be given.

TABLE 3

| | Aqueous TMAH/HF solution Wet etching rate (nm/min) |
|---|---|
| Example 1 | 10.1 |
| Example 2 | 10.7 |
| Example 3 | 12.1 |
| Example 4 | 10.8 |
| Example 5 | 10.5 |
| Example 6 | 11.3 |
| Example 7 | 13.2 |
| Example 8 | 12.9 |
| Example 9 | 11.4 |
| Comparative Example 2 | 7.4 |
| Comparative Example 3 | 8.2 |
| Comparative Example 4 | 12.3 |
| Referential Example 1 | 8.5 |

[6] Formation of Resist Pattern by EUV Exposure: Negative Solvent Development

The aforementioned organic resist underlayer film-forming composition was applied onto a silicon wafer with a spinner, and then baked on a hot plate at 215° C. for 60 seconds, to thereby form an organic underlayer film (layer A) having a thickness of 90 nm.

The composition prepared in Example 1 was applied onto the organic underlayer film by spin coating, and then heated at 215° C. for one minute, to thereby form a silicon-containing resist underlayer film (layer B) (20 nm).

An EUV resist solution (methacrylate resin-based resist) was applied onto the resist underlayer film by spin coating, and then heated at 130° C. for one minute, to thereby form an EUV resist film (layer C). Thereafter, by using an EUV exposure apparatus (NXE3300B, available from ASML) under the following conditions: NA: 0.33, σ: 0.67/0.90, Dipole, the resist film was exposed to light through a mask designed to achieve a line width of 22 nm and an interline width of 22 nm (i.e., a 22 nm line and space (L/S)=1/1 dense line) in the EUV resist after development as described below.

After the light exposure, post exposure bake (PEB, at 110° C. for one minute) was performed, and then the resist film was cooled on a cooling plate to room temperature, followed by development with an organic solvent developer (butyl acetate) for 60 seconds and rinsing treatment, to thereby form a resist pattern.

Each of the compositions prepared in Examples 2 to 9 and Comparative Example 4 was used, and a resist pattern was formed through the same procedure as described above.

Each of the thus-formed resist patterns was evaluated for formation of a 44 nm pitch and a 22 nm line-and-space by determining the pattern shape through observation of a cross section of the pattern.

In the observation of the pattern shape, evaluation “Good” was given to a shape between footing and undercut and a state of no significant residue in a space portion; evaluation “Collapse” was given to an unfavorable state of peeling and collapse of the resist pattern; and evaluation “Bridge” was given to an unfavorable state of contact between upper portions or lower portions of the resist pattern. The results are shown in Table 4.

TABLE 4

| | Pattern shape |
|---|---|
| Example 1 | Good |
| Example 2 | Good |

TABLE 4-continued

| | Pattern shape |
|---|---|
| Example 3 | Good |
| Example 4 | Good |
| Example 5 | Good |
| Example 6 | Good |
| Example 7 | Good |
| Example 8 | Good |
| Example 9 | Good |
| Comparative Example 4 | Poor |

As shown in Tables 2 to 4, the compositions of Examples 1 to 9 were found to enable formation of a resist underlayer film that has solvent resistance and developer resistance, exhibits excellent photoresist pattern formability, and can be wet-removed at high etching rate, regardless of the type of a polysiloxane (i.e., even in the case of the use of a polysiloxane having various organic groups on side chains) with or without additive 2 (curing catalyst).

In contrast, the composition of Comparative Example 1 containing neither additive 2 (curing catalyst) nor additive 3 (bisphenol compound) was found to lack solvent resistance and developer resistance. Meanwhile, the compositions of Comparative Examples 2 and 3 not containing the bisphenol compound [C] according to the present invention exhibited etching rate inferior to that in the cases of the Examples. The composition of Comparative Example 4 not containing nitric acid [B] exhibited poor pattern formability.

As shown in Table 3, the composition of Referential Example 1 containing, as the polysiloxane [A], a polymer having no alcohol-capped silanol groups exhibited etching rate inferior to that in the cases of the Examples. Thus, a modified polysiloxane wherein, for example, at least some of silanol groups are modified with an alcohol can be suitably used as the polysiloxane [A], from the viewpoint of achieving higher etching rate.

The invention claimed is:

1. A silicon-containing resist underlayer film-forming composition comprising:

[A] a polysiloxane, wherein the polysiloxane [A] contains a modified polysiloxane in which at least some of silanol groups are modified with an alcohol or protected with an acetal;

[B] nitric acid, wherein the nitric acid [B] comprises from 100 ppm to 5,000 ppm of a total mass of the composition;

[C] a bisphenol compound, wherein the bisphenol compound [C] contains a bisphenol sulfone compound; and

[D] a solvent.

2. The silicon-containing resist underlayer film-forming composition according to claim 1, wherein the polysiloxane [A] contains at least one selected from the silanol group consisting of a hydrolysis condensate of a hydrolyzable silane $$R^1{}_aSi(R^2)_{4-a} \quad (1)$$

wherein $R^1$ is a group bonded to the silicon atom, and is each independently a substitutable alkyl group, a substitutable aryl group, a substitutable aralkyl group, a substitutable halogenated alkyl group, a substitutable halogenated aryl group, a substitutable halogenated aralkyl group, a substitutable alkoxyalkyl group, a substitutable alkoxyaryl group, a substitutable alkoxyaralkyl group, or a substitutable alkenyl group, or an organic group containing an epoxy group, an acryloyl group, a methacryloyl group, a mercapto group, an amino group, an amide group, an alkoxy group, a sulfonyl group, or a cyano group, or any combination of these; $R^2$ is a group or atom bonded to the silicon atom, and is each independently an alkoxy group, an aralkyloxy group, an acyloxy group, or a halogen atom; and a is an integer of 0 to 3, a modified hydrolysis condensate prepared by modification of at least some of silanol groups of the condensate of the hydrolyzable silane with an alcohol, a modified hydrolysis condensate prepared by protection of at least some of silanol groups of the condensate of the hydrolyzable silane with an acetal, and a product prepared by dehydration reaction between the condensate of the hydrolyzable silane and an alcohol.

3. The silicon-containing resist underlayer film-forming composition according to claim 2, wherein the polysiloxane [A] contains a product prepared by dehydration reaction between the condensate of the hydrolyzable silane and an alcohol.

4. The silicon-containing resist underlayer film-forming composition according to claim 1, wherein the composition comprises no curing catalyst.

5. The silicon-containing resist underlayer film-forming composition according to claim 1, wherein the solvent [D] contains water.

6. The silicon-containing resist underlayer film-forming composition according to claim 1, wherein the composition further comprises a pH adjuster.

7. The silicon-containing resist underlayer film-forming composition according to claim 1, wherein the composition further comprises a surfactant.

8. The silicon-containing resist underlayer film-forming composition according to claim 1, wherein the composition further comprises a metal oxide.

9. The silicon-containing resist underlayer film-forming composition according to claim 1, wherein the composition is used for formation of a resist underlayer film for EUV lithography.

10. A resist underlayer film, which is a cured product of the silicon-containing resist underlayer film-forming composition according to claim 1.

11. A semiconductor processing substrate comprising a semiconductor substrate and the resist underlayer film according to claim 10.

12. A semiconductor device production method comprising:

a step of forming an organic underlayer film on a substrate;

a step of forming, on the organic underlayer film, a silicon-containing resist underlayer film from the silicon-containing resist underlayer film-forming composition according to claim 1; and a step of forming a resist film on the silicon-containing resist underlayer film.

13. The production method according to claim 12, wherein the step of forming a silicon-containing resist underlayer film involves the use of the silicon-containing resist underlayer film-forming composition subjected to filtration with a nylon filter.

14. A pattern formation method comprising:

a step of forming an organic underlayer film on a semiconductor substrate;

a step of applying, onto the organic underlayer film, the silicon-containing resist underlayer film-forming composition according to claim 1, and baking the composition, to thereby form a silicon-containing resist underlayer film;

a step of applying a resist film-forming composition onto the silicon-containing resist underlayer film, to thereby form a resist film;

a step of exposing the resist film to light, and developing the resist film, to thereby form a resist pattern;

a step of etching the silicon-containing resist underlayer film with the resist pattern as a mask; and a step of etching the organic underlayer film with the patterned silicon-containing resist underlayer film as a mask.

15. The pattern formation method according to claim 14, wherein the method further comprises a step of removing the silicon-containing resist underlayer film by a wet process using a chemical after the step of etching the organic underlayer film.

* * * * *